(12) United States Patent
Umeda et al.

(10) Patent No.: US 9,185,785 B2
(45) Date of Patent: Nov. 10, 2015

(54) ELECTROSTATIC PROTECTION COMPONENT

(71) Applicant: TDK CORPORATION, Tokyo (JP)

(72) Inventors: Hidenobu Umeda, Tokyo (JP); Makoto Yoshino, Tokyo (JP); Takahiro Sato, Tokyo (JP); Takuo Hattori, Tokyo (JP); Shinichi Sato, Tokyo (JP); Takeshi Shibayama, Tokyo (JP)

(73) Assignee: TDK CORPORATION, Tokyo (JP)

( * ) Notice: Subject to any disclaimer, the term of this patent is extended or adjusted under 35 U.S.C. 154(b) by 24 days.

(21) Appl. No.: 14/223,385

(22) Filed: Mar. 24, 2014

(65) Prior Publication Data

US 2014/0204499 A1    Jul. 24, 2014

Related U.S. Application Data

(63) Continuation of application No. 13/475,376, filed on May 18, 2012, now Pat. No. 8,724,284.

(30) Foreign Application Priority Data

May 25, 2011   (JP) .................................. 2011-117239
Feb. 14, 2012   (JP) .................................. 2012-029304
Feb. 14, 2012   (JP) .................................. 2012-029306

(51) Int. Cl.
*H02H 1/00* (2006.01)
*H05F 3/04* (2006.01)
*H01T 4/12* (2006.01)
*H05K 9/00* (2006.01)
(Continued)

(52) U.S. Cl.
CPC .. *H05F 3/04* (2013.01); *H01T 4/12* (2013.01); *H05K 9/0067* (2013.01); *H01G 4/40* (2013.01); *H01T 2/00* (2013.01); *H05K 9/0079* (2013.01)

(58) Field of Classification Search
USPC ............................................ 361/56, 212, 220
See application file for complete search history.

(56) References Cited

U.S. PATENT DOCUMENTS 7,633,735 B2   12/2009   Urakawa
8,238,069 B2   8/2012    Adachi et al.
8,426,889 B2   4/2013    Adachi et al.
(Continued)

FOREIGN PATENT DOCUMENTS

CN    101933204 A    12/2010
CN    102057546 A    5/2011
(Continued)

OTHER PUBLICATIONS

U.S. Appl. No. 13/475,376 filed May 18, 2012, Yoshino et al.

*Primary Examiner* — Danny Nguyen
(74) *Attorney, Agent, or Firm* — Oliff PLC

(57) ABSTRACT

An electrostatic protection component includes: a body in which a plurality of ceramic substrates is laminated; and a pair of discharge electrodes which are formed within the body and which are spaced to face each other. The discharge electrodes include main body portions extending along a longitudinal direction, and the main body portions include tips in the longitudinal direction and side edges extending along the longitudinal direction. The pair of discharge electrodes are arranged such that both the main body portions are adjacent to each other in a short direction. The discharge electrodes face each other in the short direction between the side edges, and discharge occurs only between the side edges, between the discharge electrodes.

6 Claims, 46 Drawing Sheets

(51) Int. Cl.
  *H01T 2/00* (2006.01)
  *H01G 4/40* (2006.01)

(56) References Cited

U.S. PATENT DOCUMENTS

| | | | |
|---|---|---|---|
| 8,503,147 B2 * | 8/2013 | Tsukizawa et al. | 361/112 |
| 8,760,830 B2 | 6/2014 | Ikeda | |
| 2009/0067113 A1 | 3/2009 | Urakawa | |
| 2010/0254052 A1 * | 10/2010 | Katsumura et al. | 361/56 |
| 2010/0254061 A1 | 10/2010 | Ryu et al. | |
| 2010/0309595 A1 | 12/2010 | Adachi et al. | |
| 2011/0026186 A1 | 2/2011 | Katsumura et al. | |
| 2012/0300355 A1 | 11/2012 | Umeda | |

FOREIGN PATENT DOCUMENTS

| | | |
|---|---|---|
| JP | B2-4247581 | 1/2009 |
| JP | B2-4434314 | 1/2010 |
| JP | 2011-119172 A | 6/2011 |
| KR | 10-2009-0034305 | 4/2009 |
| WO | WO 2009/098944 A1 | 8/2009 |
| WO | WO 2011/145598 A1 | 11/2011 |

* cited by examiner

Fig.23
(a)
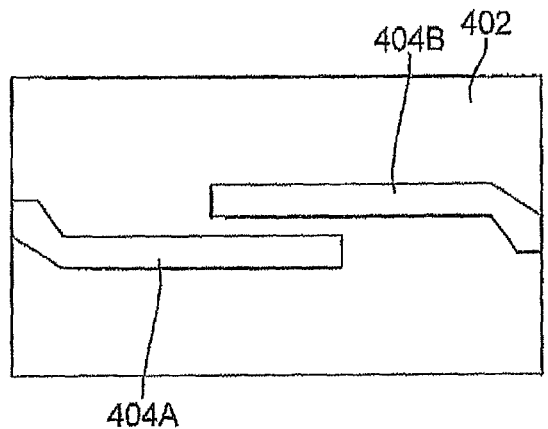
(b)
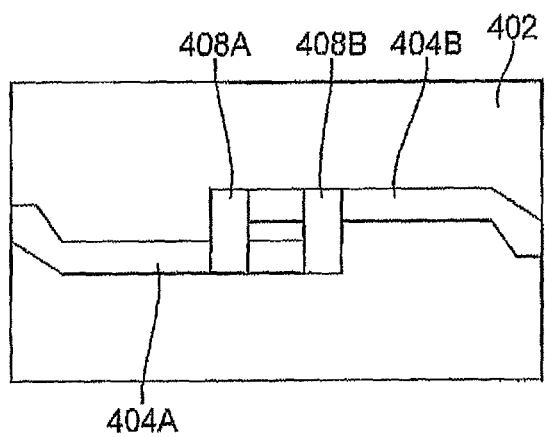
(c)
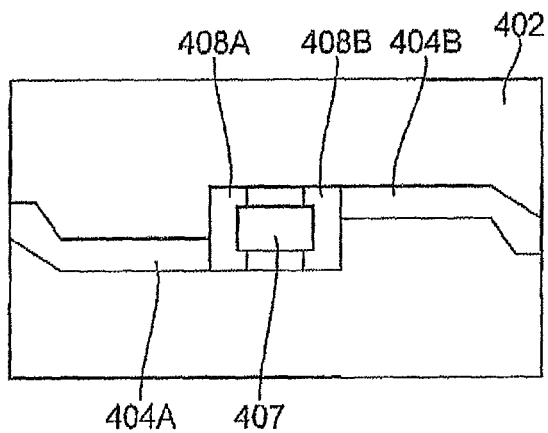

*Fig.39*
(a)
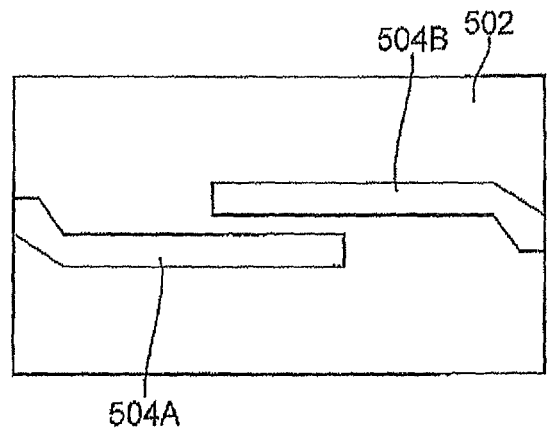
(b)
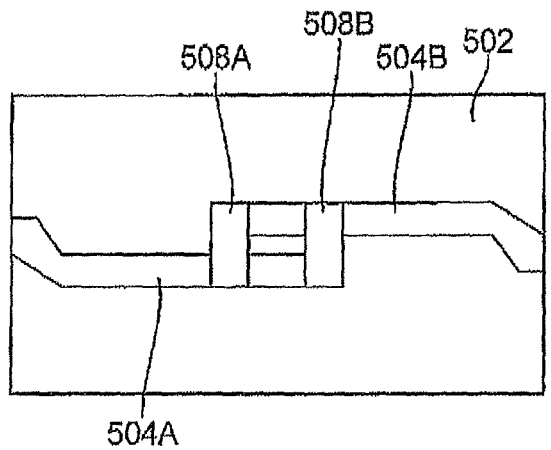
(c)
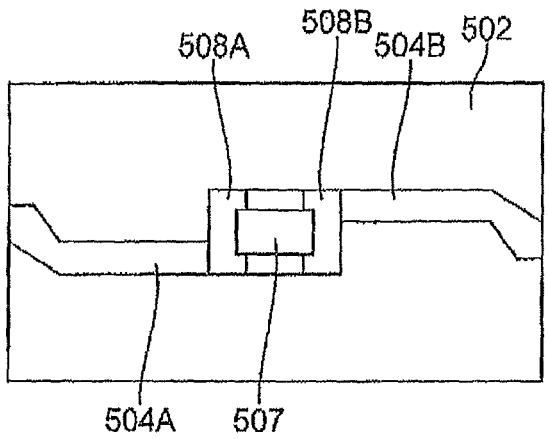

Fig.40
(a)
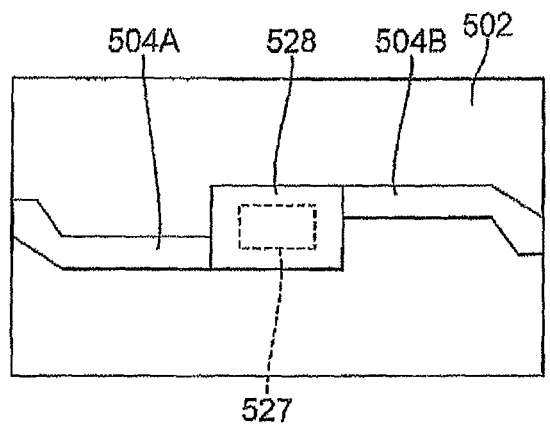
(b)
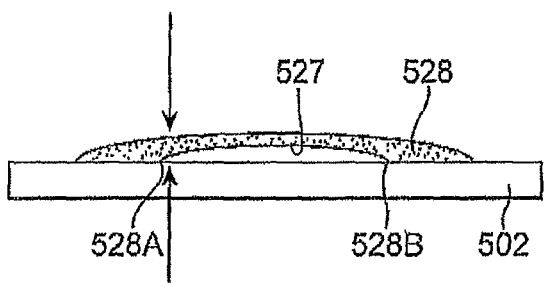
(c)
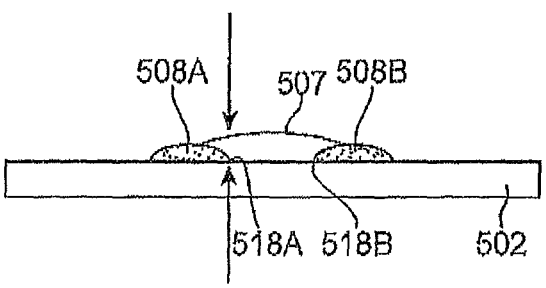

Fig.41

|  | CLAMP VOLTAGE (V) |
|---|---|
| STRUCTURE 1 | 81 |
| STRUCTURE 2 | 35 |

Fig.45
(a)
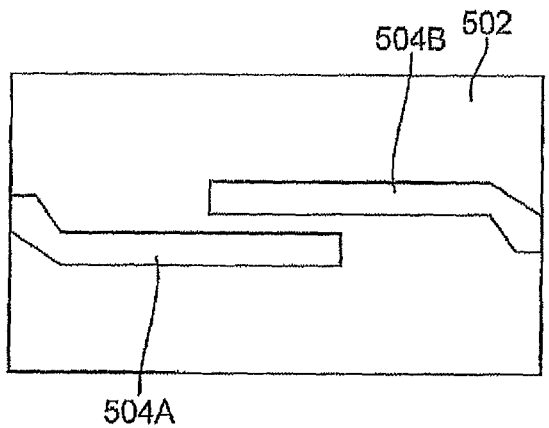
(b)
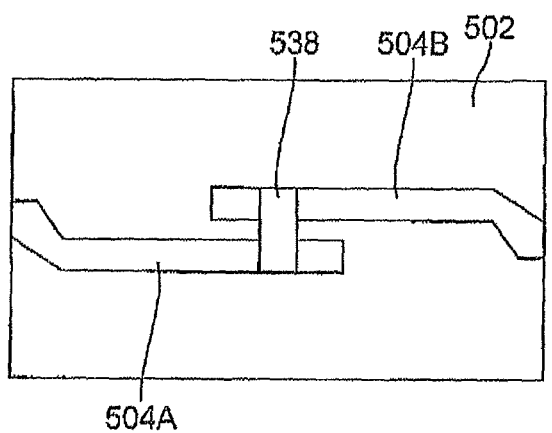
(c)
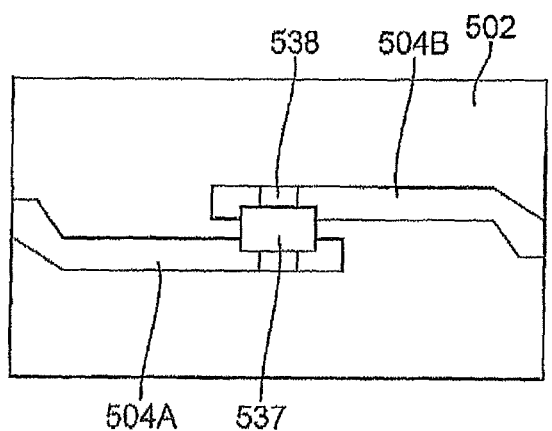

ELECTROSTATIC PROTECTION COMPONENT

This application is a continuation of application Ser. No. 13/475,376, filed May 18, 2012, which claims priority to Japan Patent Application No. 2012-029306, filed Feb. 14, 2012, Japan Patent Application No. 2012-029304, filed Feb. 14, 2012, and Japan Patent Application No. 2011-117239, filed May 25, 2011, the contents of which are incorporated herein by reference in their entirety.

BACKGROUND OF THE INVENTION

1. Field of the Invention

The present invention relates to an electrostatic protection component that protects an electronic device from ESD.

2. Related Background of the Invention

ESD (electro-static discharge) is a phenomenon in which, when a charged conductor (such as a human body) contacts another conductor (such as an electronic device) or sufficiently approaches it, an intense discharge is generated. The ESD causes problems such as damages and malfunctions of electronic devices. In order to solve these problems, it is necessary to prevent an excessively high voltage generated at the time of discharge from being applied to a circuit of electronic devices. An electronic component used for this type of application is an electrostatic protection component, and is also referred to as a surge absorbing element or a surge absorber.

In an electrostatic protection component disclosed in Japanese Patent No. 4247581 or Japanese Patent No. 4434314, a pair of discharge electrodes facing each other are formed within a laminated ceramic sintered body. In the electrostatic protection component, discharge-inducing portion composed of a metallic material and a ceramic material is formed in a position adjacent to the discharge electrodes.

SUMMARY OF THE INVENTION

For example, in an electrostatic protection component shown in FIG. 7, discharge electrodes are extended such that the side edges thereof face each other and that the ends thereof face each other. In this way, the discharge portion is lengthened. However, since an electric field is concentrated in the tips shorter than the side edges, in the configuration described above, the discharge is generated preferentially and mainly in the tips. Therefore, even if the portions of the discharge electrodes facing each other are lengthened, since the discharge portion is approximately limited to the regions of the tips, there has been a problem in which the durability of an electrostatic protection component cannot be increased (a first problem).

In the electrostatic protection component disclosed in Japanese Patent No. 4247581, a hollow portion is formed in the opposing portion of the discharge electrode, and all the upper surface of the opposing portion of the discharge electrode is exposed to the hollow portion. Therefore, in the electrostatic protection component described above, when the hollow portion is formed by the dissipation of a hollow portion-forming lacquer at the time of firing, the tip of the discharge electrode becomes free within the hollow portion, and thus there is a possibility that the difference in contraction between the discharge electrode and a body causes the discharge electrode to be separated from a ceramic layer forming the body (a second problem).

In the electrostatic protection component disclosed in Japanese Patent No. 4247581, the discharge-inducing portion is arranged in a lower portion of the opposing portion of the discharge electrode. In general, by discharge generated by the discharge-inducing portion, a part where the discharge occurs is destroyed. Therefore, in the electrostatic protection component described above, the destruction caused by the discharge in the discharge-inducing portion proceeds mainly in a direction of the lamination of the ceramic layers, that is, in a thickness direction of the discharge-inducing portion. When, as described above, the discharge-inducing portion is destroyed along the thickness direction thereof, the discharge is unlikely to be generated along the discharge-inducing portion.

Therefore, there has been a problem in which, in the electrostatic protection component disclosed in Japanese Patent No. 4247581, the number of times of discharge is limited, and discharge start voltage is changed (the discharge start voltage is increased), and thus the durability of the electrostatic protection component is reduced. It is possible to enhance the durability of the electrostatic protection component by increasing the thickness of the discharge-inducing portion. However, in this case, as the thickness of the discharge-inducing portion is increased, the height of the electrostatic protection component is increased, with the result that new problems such as prevention of the decrease in the height of the electrostatic protection component and the cost increase are caused (a third problem). When the destruction allowable region of the discharge-inducing portion is small, there has been a problem in which a clamp voltage after the generation of a peak voltage is increased (the third problem).

A first aspect of the present invention is made to solve the first problem, and a first object is to provide an electrostatic protection component that can enhance the durability. Moreover, a second aspect of the present invention is made to solve the second problem, and a second object is to provide an electrostatic protection component in which a discharge electrode is unlikely to be separated from a body. Furthermore, a third aspect of the present invention is made to solve the third problem, and a third object is to provide an electrostatic protection component that can enhance the durability and reduce a clamp voltage.

An electrostatic protection component according to a first aspect of the present invention includes: a body in which a plurality of ceramic substrates is laminated; and a first discharge electrode and a second discharge electrode which are formed within the body and which are spaced to face each other. The first discharge electrode includes a first main body portion extending along a first direction. The first main body portion includes a first tip in the first direction and a first side edge extending along the first direction. The second discharge electrode includes a second main body portion extending along the first direction. The second main body portion includes a second tip in the first direction and a second side edge extending along the first direction. The first discharge electrode and the second discharge electrode are arranged such that the first main body portion and the second main body portion are adjacent to each other in a second direction perpendicular to the first direction. The first discharge electrode and the second discharge electrode face each other in the second direction between the first side edge and the second side edge, and discharge occurs only between the first side edge and the second side edge, between the first discharge electrode and the second discharge electrode.

In the electrostatic protection component according to the first aspect of the present invention, the first discharge electrode includes the first side edge extending along the first direction, and the second discharge electrode includes the second side edge extending along the first direction. As described above, the first side edge and the second side edge extending along the first direction face each other, and between the first discharge electrode and the second discharge electrode, discharge occurs only between the first side edge and the second side edge. That is, discharge is prevented from being concentrated at each of the tips, and discharge can occur between the side edges extending long. Therefore, it is possible to increase the length of the discharge portion between the first discharge electrode and the second discharge electrode and to enhance the durability of the electrostatic protection component.

In the electrostatic protection component according to the first aspect of the present invention, the body may include a discharge-inducing portion which is in contact with the first discharge electrode and the second discharge electrode and which connects the discharge electrodes. The discharge-inducing portion is formed in only a portion where the first side edge and the second side edge face each other. Thus, it is possible to more reliably cause discharge only between the first side edge and the second side edge.

In the electrostatic protection component according to the first aspect of the present invention, at least one of the first discharge electrode and the second discharge electrode may not have a portion facing the tip of the other discharge electrode in the first direction. As described above, by not providing the opposing portion on the side of the tip, it is possible to more reliably cause discharge only between the first side edge and the second side edge.

In the electrostatic protection component according to the first aspect of the present invention, at least one of the first discharge electrode and the second discharge electrode may have a portion facing the tip of the other discharge electrode in the first direction and a distance between the first side edge and the second side edge may be shorter than a distance between the opposing portion and the tip. Even if the opposing portion is provided on the side of the tip, by making the distance between the first side edge and the second side edge shorter than the distance of the present portion, it is possible to more reliably cause discharge only between the first side edge and the second side edge.

An electrostatic protection component according to a second aspect of the present invention includes: a body in which a plurality of ceramic substrates is laminated; and a first discharge electrode and a second discharge electrode which are arranged in the same ceramic layer of the body so as to face each other via a predetermined gap within the body; and discharge-inducing portion which is in contact with the first discharge electrode and the second discharge electrode and which connects the first and second discharge electrodes, within the body. In the electrostatic protection component described above, the body includes a hollow portion adjacent to and in contact with the discharge-inducing portion in the gap, and the first and second discharge electrodes are sandwiched in a direction of the lamination between the ceramic layer where the discharge electrodes are arranged and the discharge-inducing portion.

In the electrostatic protection component according to the second aspect of the present invention, the first and second discharge electrodes are sandwiched in the direction of the lamination between the ceramic layer where the discharge electrodes are arranged and the discharge-inducing portion. In this case, both the discharge electrodes are fixed in the lamination direction by the actual ceramic layer and the discharge-inducing portion, and thus it is possible to suppress the possibility that the discharge electrodes go into a free state when a lacquer for forming the hollow portion is dissipated and the hollow portion is formed. In this way, the discharge electrodes are fixed in the lamination direction, and thus it is possible to suppress the possibility that the discharge electrodes are separated from the body.

In the electrostatic protection component according to the second aspect of the present invention, the hollow portion is adjacent to and in contact with the discharge-inducing portion in the gap. In this case, breakdown by discharge can be induced in the horizontal direction, and thus it is possible to suppress breakdown by discharge in the thickness direction (the lamination direction of the ceramic layer) of the discharge-inducing portion. Since the breakdown in the thickness direction of the discharge-inducing portion can be suppressed in this way, with the electrostatic protection component according to the second aspect of the present invention, the limitation of the number of times of discharge and variations in the discharge start voltage are also suppressed, with the result that it is possible to enhance the durability of the electrostatic protection component.

In the electrostatic protection component according to the second aspect of the present invention, in a region where the first and second discharge electrodes face each other, the first and second discharge electrodes may be sandwiched in the direction of the lamination between the ceramic layer where the discharge electrodes are arranged and the discharge-inducing portion. In this case, the opposing portions of the discharge electrodes on which a separating force is likely to be exerted when discharge occurs can be fixed in the lamination direction, and thus it is possible to suppress the separation of the discharge electrodes resulting from discharge.

In the electrostatic protection component according to the second aspect of the present invention, the first discharge electrode may include a first side edge which extends in a first direction intersecting with the direction of the lamination and which extends along the first direction, the second discharge electrode may include a second side edge which extends in the first direction and which extends along the first direction, and the first and second discharge electrodes may be arranged such that the first and second side edges face each other in a second direction intersecting with the first direction and the direction of the lamination. In this case, it is possible to increase the length over which breakdown by discharge in the horizontal direction proceeds, and thus it is possible to further enhance the durability of the electrostatic protection component.

In the electrostatic protection component according to the second aspect of the present invention, the discharge-inducing portion is formed with first and second discharge-inducing portions, and the hollow portion may be overlapped on both the first and second discharge-inducing portions. In this case, the hollow portion is formed inside, and thus it is possible to suppress the infiltration of a plating solution and water from the outside. Therefore, it is possible to enhance the durability and the reliability of the electrostatic protection component.

In the electrostatic protection component according to the second aspect of the present invention, the hollow portion may cover the entire first and second discharge-inducing portions. In this case, since a larger air gap portion can be formed, it is possible to further suppress the breakdown by discharge.

In the electrostatic protection component according to the second aspect of the present invention, the hollow portion may cover, in the gap, both edges of the discharge-inducing portion in the first direction. In this case, since it is not necessary to provide, in the central portion of the gap, a hollow portion that is not overlapped on the discharge-inducing portion, it is possible to make the hollow portion compact. In this configuration, it is possible to reduce the opposing length of the discharge electrodes, and thus it is possible to reduce the capacitance generated between the discharge electrodes.

In the electrostatic protection component according to the second aspect of the present invention, the discharge-inducing portion may cover at least one of tip portions of the first and second discharge electrodes. In this case, since the tips of the discharge electrodes that are likely to become a starting point in the separation from the body can be restricted in the lamination direction, it is possible to reliably suppress the separation of the discharge electrodes from the body.

Furthermore, an electrostatic protection component according to a third aspect of the present invention includes: a body in which a plurality of ceramic substrates is laminated; and a first discharge electrode and a second discharge electrode which are arranged in the same ceramic layer of the body so as to face each other via a predetermined gap within the body, and a discharge-inducing portion which is in contact with the first discharge electrode and the second discharge electrode and which connects the first and second discharge electrodes, within the body. In the electrostatic protection component, the body includes a hollow portion adjacent to and in contact with the discharge-inducing portion in the gap, and the hollow portion is overlapped on the discharge-inducing portion.

In the electrostatic protection component according to the third aspect of the present invention, the hollow portion is adjacent to and in contact with the discharge-inducing portion in the gap. In this case, breakdown by discharge can be induced in the horizontal direction, and thus it is possible to suppress breakdown by discharge in the thickness direction (the lamination direction of the ceramic layer) of the discharge-inducing portion. Since the breakdown in the thickness direction of the discharge-inducing portion can be suppressed in this way, with the electrostatic protection component according to the third aspect of the present invention, the limitation of the number of times of discharge and variations in the discharge start voltage are also suppressed, with the result that it is possible to enhance the durability of the electrostatic protection component.

In the electrostatic protection component according to the third aspect of the present invention, the hollow portion is formed so as to be overlapped on the discharge-inducing portion. In this case, there can be increased the size of a space region (the thickness in the lamination direction) in the vicinity of the discharge portions in which discharge is more likely to occur in the discharge-inducing portions. By the fact that the size of the space region in the vicinity of the discharge portions can be increased, with the electrostatic protection component according to the third aspect of the present invention, it becomes possible to reduce the clamp voltage.

In the electrostatic protection component according to the third aspect of the present invention, the first discharge electrode may include a first side edge which extends in a first direction and which extends along the first direction, the second discharge electrode may include a second side edge which extends in the first direction and which extends along the first direction, and the first and second discharge electrodes may be arranged such that the first and second side edge face each other in a second direction intersecting with the first direction. In this case, it is possible to increase the length over which breakdown by discharge in the horizontal direction proceeds, and thus it is possible to further enhance the durability of the electrostatic protection component.

In the electrostatic protection component according to the third aspect of the present invention, the discharge-inducing portion is formed with first and second discharge-inducing portions, and the hollow portion may be overlapped on both the first and second discharge-inducing portions. In this case, the hollow portion is formed inside, and thus it is possible to suppress the infiltration of a plating solution and water from the outside. Therefore, it is possible to enhance the durability and the reliability of the electrostatic protection component.

In the electrostatic protection component according to the third aspect of the present invention, the hollow portion may cover the entire first and second discharge-inducing portions. In this case, since a larger air gap portion can be formed, it is possible to further suppress the breakdown by discharge.

In the electrostatic protection component according to the third aspect of the present invention, the hollow portion may cover, in the gap, both edges of the discharge-inducing portion in the first direction. In this case, since it is not necessary to provide, in the central portion of the gap, a hollow portion that is not overlapped on the discharge-inducing portion, it is possible to make the hollow portion compact. In this configuration, it is possible to reduce the opposing length of the discharge electrodes, and thus it is possible to reduce the capacitance generated between the discharge electrodes.

The present invention will become more fully understood from the detailed description given hereinbelow and the accompanying drawings which are given by way of illustration only, and thus are not to be considered as limiting the present invention. Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 23 (a), (b), and "c" are a plan view illustrating the printing formation of the discharge portion of the electrostatic protection shown in FIG. 16;

FIGS. 39 (a), (b), and "c" are a plan view illustrating the printing formation of the discharge portion of the electrostatic protection shown in FIG. 32;

FIG. 40(a) is a plan view of the discharge portion of the electrostatic protection component of the comparative example when viewed in the direction of the lamination; FIG. 40(b) is a transverse cross-sectional view schematically showing the cross-sectional configuration of the electrostatic protection component shown in FIG. 40(a); FIG. 40(c) is a transverse cross-sectional view schematically showing the cross-sectional configuration of the discharge portion of the electrostatic protection component shown in FIG. 32;

FIG. 41 is a diagram comparing the clamp voltages of the electrostatic protection component (configuration 1) of the comparative example and the electrostatic protection component (configuration 2) shown in FIG. 32;

FIGS. 45 (a), (b), and "c" are a plan view illustrating the printing formation of the discharge portion of the electrostatic protection shown in FIG. 43.

DESCRIPTION OF THE PREFERRED EMBODIMENTS

Preferred embodiments of an electrostatic protection component according to the present invention will be described in detail below with reference to accompanying drawings. In the following description, the same elements or elements having the same functions are identified with the same symbols, and their description will not be repeated.

(First Embodiment)

Figure 1:
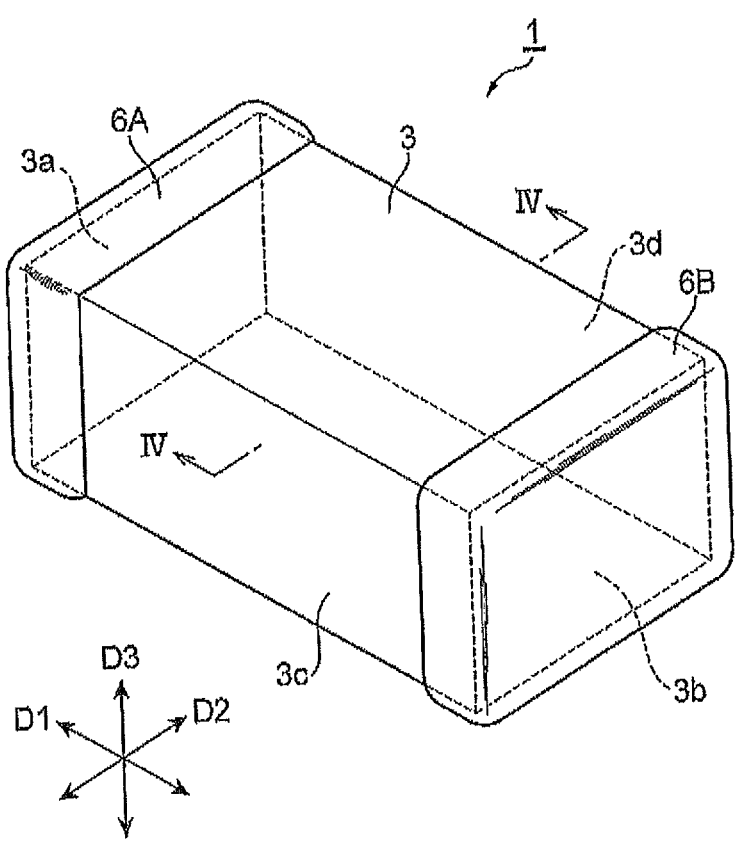
FIG. 1 is a perspective view of an electrostatic protection component according to a first embodiment.
Figure 2:
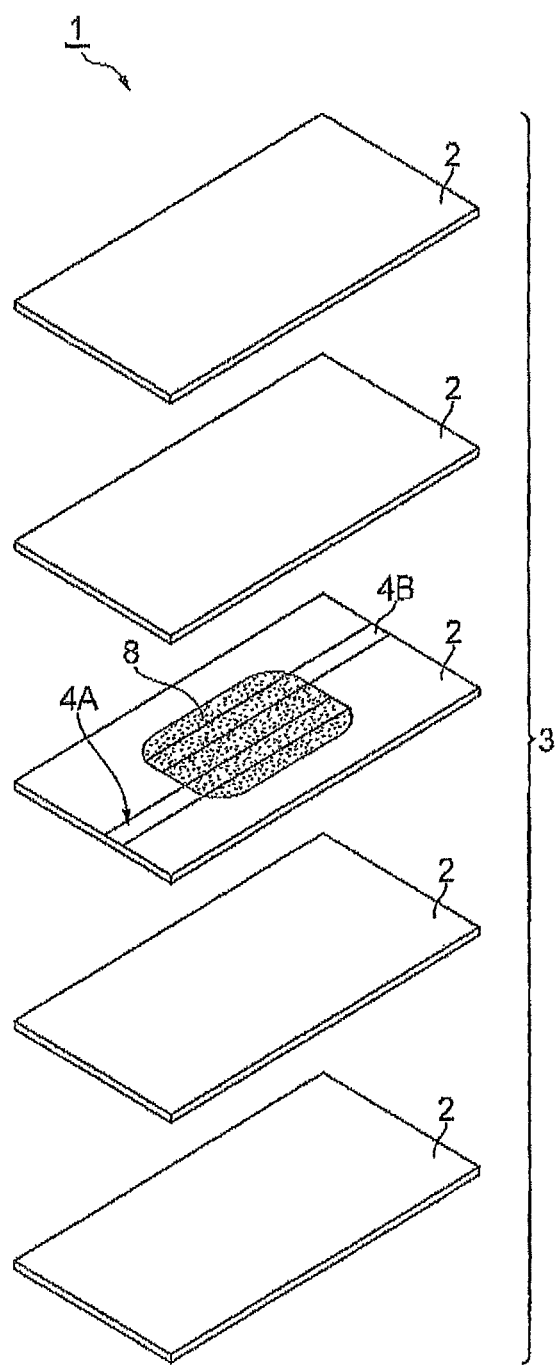
FIG. 2 is a developed perspective view of a body of the electrostatic protection component according to the first embodiment.
Figure 3:
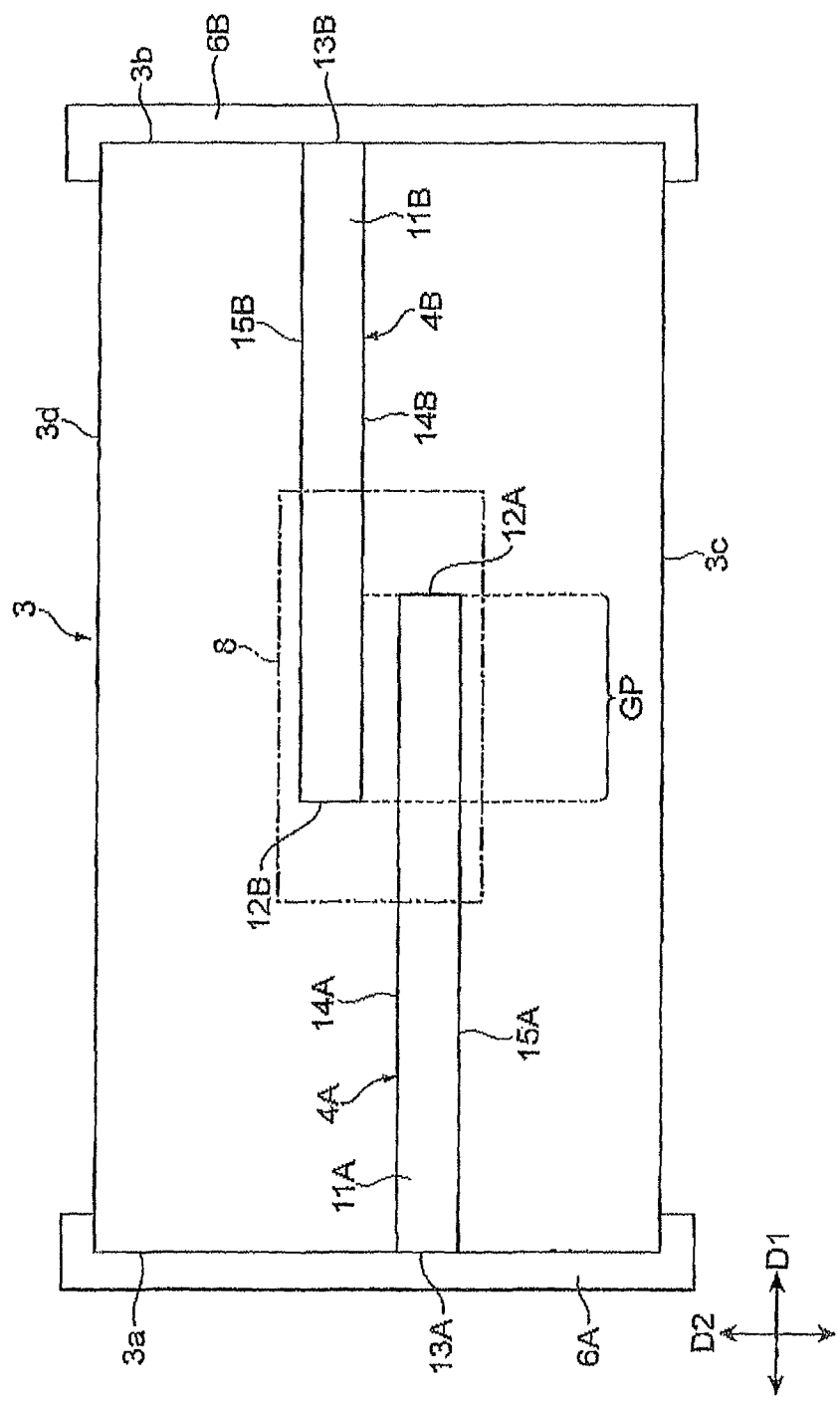
FIG. 3 is a diagram of a discharge portion of the electrostatic protection component shown in FIG. 1 when viewed in a direction of lamination.
Figure 4:
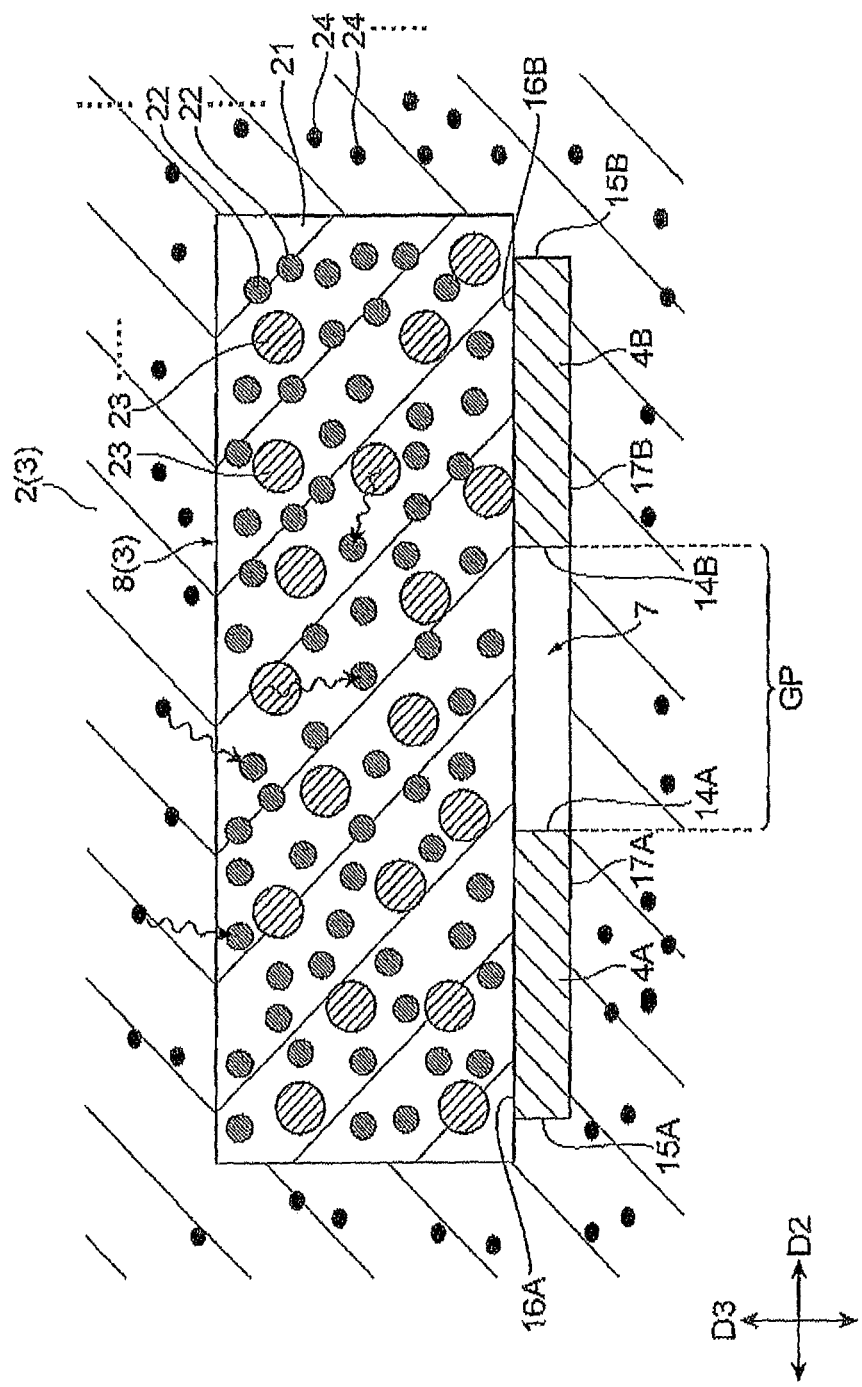
FIG. 4 is an enlarged cross-sectional view of the discharge portion taken along line IV-IV shown in FIG. 1.

FIG. 1 is a perspective view of an electrostatic protection component according to a first embodiment. FIG. 2 is a developed perspective view of a body of the electrostatic protection component according to the first embodiment. FIG. 3 is a diagram of a discharge portion of the electrostatic protection component when viewed in a direction of lamination. In FIG. 3, ceramic substrates 2 that are placed by one sheet on discharge electrodes 4A and 4B are shown being omitted. FIG. 4 is an enlarged cross-sectional view of the discharge portion taken along line IV-IV shown in FIG. 1. In the following description, a direction in which the body 3 extends is referred to as a longitudinal direction D1, a direction perpendicular to the longitudinal direction D1 in a direction of a flat surface of the ceramic substrates 2 is referred to as a short direction D2 and a direction in which the ceramic substrates 2 are laminated is referred to as a lamination direction D3.

The electrostatic protection component 1 according to the first embodiment is mounted on a circuit substrate of an electronic device, and is an electronic component that protects the electronic device from ESD (electro-static discharge). As shown in FIGS. 1 to 4, the electrostatic protection component 1 includes the body 3 constituted by laminating a plurality of ceramic substrates 2; the discharge electrodes 4A and 4B which are formed within the body 3 and which face each other; and external electrodes 6A and 6B formed on both end surfaces 3a and 3b of the body 3, facing each other. The discharge electrode 4A is electrically connected to the external electrode 6A; the discharge electrode 4B is electrically connected to the external electrode 6B. The discharge electrode 4A and the discharge electrode 4B are spaced to face each other around the center position within the body 3. In a gap portion GP between the discharge electrode 4A and the discharge electrode 4B, an internal space 7 within the body 3 is formed. The body 3 has a discharge-inducing portion 8 which is in contact with the discharge electrode 4A and the discharge electrode 4B and which connects the discharge electrodes 4A and 4B to each other, in a position where the discharge-inducing portion 8 is adjacent to the discharge electrodes 4A and 4B in the lamination direction D3.

The discharge electrode 4A has a main body portion 11A which extends from the end surface 3a of the body 3 toward the end surface 3b on the opposite side along the longitudinal direction D1 (refer to FIG. 3 in particular). The main body portion 11A has a tip 12A and a base end 13A in the longitudinal direction D1 and a side edge 14A and a side edge 15A extending along the longitudinal direction D1. The main body portion 11A forms a long rectangle; the tip 12A and the base end 13A form short sides, and the side edges 14A and 15A form long sides. That is, the side edges 14A and 15A are longer than the tip 12A and the base end 13A. The main body portion 11A is arranged slightly away from the center position in the short direction D2 toward the side surface 3c of the body 3. The base end 13A is exposed from the end surface 3a of the body 3 and is connected to the external electrode 6A. The tip 12A extends to a position separate from the end surface 3b, and is arranged in a position away from the center position in the longitudinal direction D1 toward the end surface 3b. The side edge 14A is an edge portion of the body 3 on the side of the side surface 3d, and is arranged slightly away from the central portion in the short direction D2 toward the side surface 3c. The side edge 15A is an edge portion of the body 3 on the side of the side surface 3c, and is arranged in a position away from the side surface 3c. The length of the main body portion 11A may be longer or shorter than that shown in FIG. 3.

The discharge electrode 4B is symmetric with the discharge electrode 4A with respect to a point around the center of the body 3 when viewed in the lamination direction D3. That is, the discharge electrode 4B has a main body portion 11B which extends from the end surface 3b of the body 3 toward the end surface 3a on the opposite side along the longitudinal direction D1 (refer to FIG. 3 in particular). The main body portion 11B has a tip 12B and a base end 13B in the longitudinal direction D1 and a side edge 14B and a side edge 15B extending along the longitudinal direction D1. The main body portion 11B forms a long rectangle; the tip 12B and the base end 13B form short sides, and the side edges 14B and 15B form long sides. That is, the side edges 14B and 15B are longer than the tip 12B and the base end 13B. The main body portion 11B is arranged slightly away from the center position in the short direction D2 toward the side surface 3d of the body 3. The base end 13B is exposed from the end surface 3b of the body 3 and is connected to the external electrode 6B. The tip 12B extends to a position separate from the end surface 3a, and is arranged in a position away from the center position in the longitudinal direction D1 toward the end surface 3a. The side edge 14B is an edge portion of the body 3 on the side of the side surface 3c, and is arranged slightly away from the central portion in the short direction D2 toward the side surface 3d. The side edge 15B is an edge portion of the body 3 on the side of the side surface 3d, and is arranged in a position away from the side surface 3d. The length of the main body portion 11B may be longer or shorter than that shown in FIG. 3.

The main body portion 11A of the discharge electrode 4A and the main body portion 11B of the discharge electrode 4B are arranged such that they are adjacent to each other in a region around the center of the body 3 in the short direction D2. A region of the side edge 14A of the discharge electrode 4A on the side of the tip 12A and a region of the side edge 14B of the discharge electrode 4B on the side of the tip 12B are separate from each other such that they face each other, and thus a gap portion GP is formed between the discharge electrode 4A and the discharge electrode 4B. The gap width (the distance between the side edge 14A and the side edge 14B) of the gap portion GP is 10 to 100 μm. The gap portion GP is formed only in the region where the side edge 14A and the side edge 14B face each other (refer to FIG. 3). In the present embodiment, the discharge electrode 4A is formed with only the main body portion 11A having the shape of a long rectangle, and does not have a portion facing the tip 12B of the discharge electrode 4B in the longitudinal direction D1. The discharge electrode 4B is formed with only the main body portion 11B having the shape of a long rectangle, and does not have a portion facing the tip 12A of the discharge electrode 4A in the longitudinal direction D1. In this configuration, when a predetermined voltage or more is applied to the external electrodes 6A and 6B, between the discharge electrode 4A and the discharge electrode 4B, discharge occurs only between the side edge 14A and the side edge 14B in the gap portion GP.

The discharge-inducing portion 8 has the function of facilitating the discharge between the discharge electrode 4A and the discharge electrode 4B. The discharge-inducing portion 8 is in contact with both the discharge electrodes 4A and 4B, and connects the discharge electrode 4A and the discharge electrode 4B together. In the present embodiment, the discharge-inducing portion 8 is formed such that, as viewed in the lamination direction D3, at least the gap portion GP is included and that the region of the main body portion 11A on the side of the tip 12A and the region of the main body portion 11B on the side of the tip 12B are surrounded (refer to FIG. 3). The discharge-inducing portion 8 is formed so as to contact the upper surface 16A of the discharge electrode 4A and the upper surface 16B of the discharge electrode 4B.

The internal space 7 is formed in the gap portion GP between the discharge electrode 4A and the discharge electrode 4B. That is, a portion of the side edge 14A of the discharge electrode 4A in the gap portion GP is exposed to the internal space 7. A portion of the side edge 14B of the discharge electrode 4B in the gap portion GP is exposed to the internal space 7. The internal space 7 has the function of absorbing the thermal expansion of the discharge electrodes 4A and 4B, the ceramic substrate 2 and the discharge-inducing portion 8 at the time of discharge. As long as the size and the position are set such that the thermal expansion can be absorbed, the size and the shape of the internal space 7 are not particularly limited; the internal space 7 may be formed in a wider range (for example, such that the lower surfaces 17A and 17B are also exposed to the internal space 7) than that shown in FIG. 4.

Next, the materials of the constituent elements will be described in detail.

The discharge electrodes 4A and 4B are constituted by a conductor material containing at least any one of Ag, Pd, Au, Pt, Cu, Ni, Al, Mo and W. For example, as the discharge electrodes 4A and 4B, an alloy such as an Ag/Pd alloy, an Ag/Cu alloy, an Ag/Au alloy or an Ag/Pt alloy can be used. The external electrodes 6A and 6B are constituted by a conductor material containing at least any one of Ag, Pd, Au, Pt, Cu, Ni, Al, Mo and W. For example, as the external electrodes 6A and 6B, an alloy such as an Ag/Pd alloy, an Ag/Cu alloy, an Ag/Au alloy or an Ag/Pt alloy can be used.

The ceramic substrate 2 is constituted by a single material such as $Fe_2O_3$, NiO, CuO, ZnO, MgO, $SiO_2$, $TiO_2$, $MnCO_3$, $SrCO_3$, $CaCO_3$, $BaCO_3$, $Al_2O_3$, $ZrO_2$ or $B_2O_3$, or is constituted by a material obtained by mixing two or more of the materials mentioned above. The ceramic substrate 2 may contain glass. The ceramic substrate 2 may preferably contain a copper oxide (CuO, $Cu_2O$) in order to allow low-temperature sintering.

The discharge-inducing portion 8 is constituted by a single material such as $Fe_2O_3$, NiO, CuO, ZnO, MgO, $SiO_2$, $TiO_2$, $MnCO_3$, $SrCO_3$, $CaCO_3$, $BaCO_3$, $Al_2O_3$, $ZrO_2$ or $B_2O_3$, or is constituted by a material obtained by mixing two or more of the materials mentioned above. The discharge-inducing portion 8 preferably contains metallic particles such as Ag, Pd, Au, Pt, an Ag/Pd alloy, an Ag/Cu alloy, an Ag/Au alloy and an Ag/Pt alloy; or semiconductor particles such as $RuO_2$. The discharge-inducing portion 8 may contain glass. The discharge-inducing portion 8 preferably contains a tin oxide (SnO, $SnO_2$).

The configuration when a preferred material is used will be described with reference to FIG. 4. FIG. 4 is a schematic diagram for illustrating the configuration, and the sizes and the numbers of particles are deformed in the figure.

The discharge-inducing portion 8 has an oxide of Mg, Cu, Zn, Si or Sr or the like as the main component, and in a ceramic insulator 21 containing glass, particles 22 of a tin oxide ($SnO_2$) and metallic particles 23 of an Ag/Pd alloy are present in a mixed state. The mixed state refers to a state where the metallic particles 23 of the Ag/Pd alloy are not solidified in one place and the particles 22 of the tin oxide are incorporated between the metallic particles 23. The particles 22 of the tin oxide are present in a state where they are not sintered (some of them are present as agglomerated powder). The tin oxide functions as a semiconductor material, and with the arrangement of the tin oxide between the metallic particles 23, it is possible to cause discharge even if the size of the gap in the gap portion GP is increased as compared with the case where the metallic particles 23 are only present. An alloy ratio of the Ag/Pd alloy in the metallic particles 23 is 95/5 to 30/70. The amount of particles 22 of the tin oxide contained is preferably 5/95 to 80/20 wt % in terms of a ratio of the tin oxide/the ceramic insulator. The amount of metallic particles 23 contained is preferably 10 to 35 vol % with respect to the discharge-inducing portion.

The ceramic substrate 2 has an oxide of Mg, Cu, Zn, Si or Sr or the like as the main component, and in a ceramic containing glass, particles 24 of a copper oxide (CuO) are contained. The amount of particles 24 of the copper oxide contained is preferably 0.01 to 5 wt %.

The discharge electrodes 4A and 4B are constituted by a conductor material having an Ag/Pd alloy as the main component. An alloy ratio of the Ag/Pd alloy in the discharge electrodes 4A and 4B is 95/5 to 30/70. The alloy ratio of the Ag/Pd alloy in the discharge electrodes 4A and 4B is preferably the same as an alloy ratio of the Ag/Pd alloy in the metallic particles 23.

Figure 5:
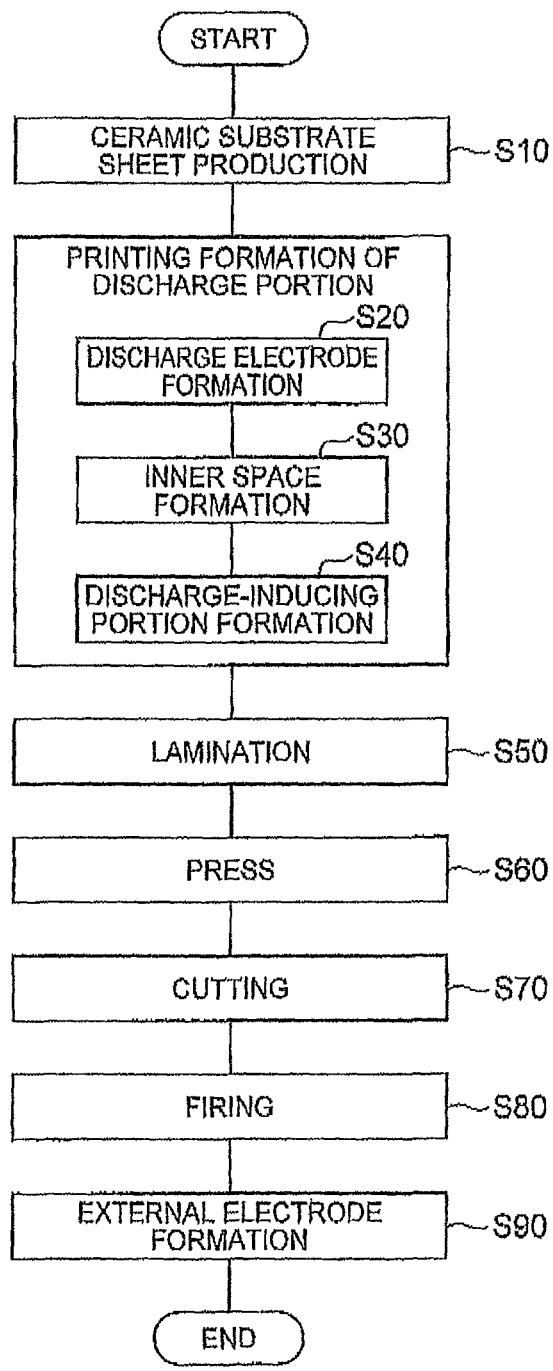
FIG. 5 is a flow diagram showing an example of the method of manufacturing the electrostatic protection component shown in FIG. 1.

Next, an example of the method of manufacturing the electrostatic protection component 1 will be described with reference to FIG. 5. However, the manufacturing method is not particularly limited, the order of individual steps may be changed, specific methods within the steps may be changed, and the electrostatic protection component 1 may be manufactured with other steps.

First, a slurry that is the material composed of the ceramic substrate 2 is prepared, and a ceramic substrate sheet is produced (step S10). Specifically, by mixing of a predetermined amount of dielectric powder containing the copper oxide (CuO) and an organic vehicle containing an organic solvent and an organic binder, a ceramic substrate slurry is prepared. As the dielectric powder, a dielectric material containing, as the main component, the oxide (which may be another dielectric material) of Mg, Cu, Zn, Si or Sr can be used. Thereafter, by a doctor blade method or the like, the slurry is applied onto a PET film, and thus a green sheet having a thickness of about 20 μm is formed.

Then, the discharge portion is formed by printing in a predetermined position of the ceramic substrate sheet. First, a conductive pattern of the discharge electrode before firing is formed by application of a conductive past onto the ceramic substrate sheet by screen printing or the like (step S20). An air gap material lacquer for forming the inner space in the opposing portion of the discharge electrodes is applied. An organic lacquer containing an organic solvent and an organic binder can be used. In this way, a portion serving as the inner space after firing is formed (step S30).

Then, a discharge-inducing material slurry is prepared, and the slurry is applied from above the air gap lacquer and the discharge-inducing portion before firing is formed (step S40). Specifically, the discharge-inducing material slurry is prepared by mixing the powders of the tin oxide, the insulator and the conductor weighed to predetermined amounts, and the organic vehicle containing the organic solvent and the organic binder. For example, as the tin oxide, $SnO_2$ which is an industrial material can be used. As the insulator, the dielectric powder can be used. As the dielectric powder, a dielectric material containing an oxide of Mg, Cu, Zn, Si or Sr (another dielectric material may be used) as the main component can be used. As the conductor powder, Ag/Pd powder can be used (Ag, Pd, Au, Pt, a mixture or a compound thereof or the like can also be used). The individual powders are fully mixed such that the particles of the tin oxide and the metallic particles of the Ag/Pd alloy go into a mixed state.

The ceramic substrate sheet on which the discharge portion is printed and the ceramic substrate sheets of the other layers are sequentially laminated (step S50) and are pressed (step S60), and the laminated member is cut into pieces so as to have the size of the respective electrostatic protection components (step S70). Then, each body is subjected to firing under predetermined conditions (for example, for two hours at a temperature of 850 to 950° C. in the atmosphere) (step S80). At this time, by the fact that the air gap material lacquer is dissipated within the body 3, the internal space 7 is formed in the discharge portion. Thereafter, conductive paste for the external electrode is applied to the body 3 and is subjected to thermal processing under predetermined conditions (for example, for two hours at a temperature of 600 to 800° C. in the atmosphere), and thus the external electrode is baked (step S90). Thereafter, the surface of the external electrode is plated. As the plating, electrolytic plating is preferable, and for example, Ni/Sn, Cu/Ni/Sn, Ni/Pd/Au, Ni/Pd/Ag, Ni/Ag or the like can be used. In this way, the electrostatic protection component 1 is completed.

The actions and effects of the electrostatic protection component 1 according to the present embodiment will now be described.

The tin oxide has features of having significantly high sintering temperature (specifically, about 1300° C.), and having low reactivity with other elements. Therefore, the tin oxide at the temperature at the time of firing of the body 3 is left in the form of particles, and even if the metallic particles 23 are present therearound, the tin oxide does not react with the metallic particles 23. In the discharge-inducing portion 8, by the fact that the particles 22 of the tin oxide and the metallic particles 23 are in a mixed state, the following effect is obtained. That is, at the time of firing of the body 3, the particles 22 of the tin oxide do not react with the metallic particles 23 therearound and are left in the form of particles. By the fact that the particles 22 of the tin oxide do not react and are left as described above, the movement of the metallic particles 23 in the discharge-inducing portion 8 is restricted. Since the metallic particles 23 with restricted movement do not react with each other, it is possible to prevent short-circuiting between the discharge electrodes 4A and 4B (or to prevent the decrease in the insulation resistance) as a result of the connection of the metallic particles 23.

Moreover, by the fact that the discharge-inducing portion 8 contains an insulating material such as the ceramic insulator 21, it is possible to secure insulation between the discharge electrodes 4A and 4B.

In the electrostatic protection component 1, the ceramic substrate 2 contains the particles 24 of the copper oxide having high reactivity whereas the discharge-inducing portion 8 contains the particles 22 of the tin oxide having high sintering temperature and having low reactivity, with the result that the following effect is obtained. That is, even if the ceramic substrate 2 contains the particles 24 of the copper oxide, the diffusion of the particles 24 of the copper oxide to the discharge-inducing portion 8 is suppressed by the particles 22 of the tin oxide. Since the diffusion of the particles 24 of the copper oxide is suppressed as described above, in the discharge-inducing portion 8, it is possible to freely select the constituent materials of the portions other than the tin oxide (that is, the discharge-inducing portion 8 is composed of the tin oxide and the other materials, and the other materials can be freely selected). In this way, it is possible to cause the body 3 to contain the copper oxide while securing flexibility in selecting the constituent materials of the discharge-inducing portion 8.

Moreover, the discharge-inducing portion 8 contains the metallic particles 23, and thus it is possible to reduce the discharge start voltage.

The Ag/Pd alloy has features of having high melting point (specifically, about 1000° C.) and having low reactivity with the copper oxide. The ceramic substrate 2 contains the particles 24 of the copper oxide having high reactivity with the ceramic substrate 2 whereas the discharge-inducing portion 8 contains, as the metallic particles 23, the Ag/Pd alloy having low reactivity with the copper oxide, with the result that the following effect is obtained. That is, even if the ceramic substrate 2 contains the particles 24 of the copper oxide, the reaction of the metallic particles 23 with each other caused by influences of the diffusion of the particles 24 of the copper oxide is suppressed. Namely, it is possible to prevent short-circuiting between the discharge electrodes 4A and 4B (or to prevent the decrease in the insulation resistance) as a result of the connection of the metallic particles 23. In this way, it is possible to make the body 3 contain the copper oxide while preventing short-circuiting between the discharge electrodes 4A and 4B. Pb itself has a high melting point, and the reactivity with the copper oxide is high as compared with the Ag/Pb alloy. Therefore, through the use of a compound obtained by alloying Pd with Ag, the effects become further significant.

When a metal other than Ag/Pd is used as the discharge electrodes 4A and 4B with the copper oxide contained in the body 3, the metal reacts with the copper oxide, and the following problem may occur. For example, there is a possibility that Ag/Pb is vaporized from the portion (such as the connection portion to the external electrodes 6A and 6B) exposed from the body 3 of the discharge electrodes 4A and 4B and is dissipated. When the opposing portion (around the side edges 14A and 14B) of the discharge electrodes 4A and 4B are lost, there is a possibility that variations occur in the gap length and thus the characteristics become unstable. Therefore, the discharge electrodes 4A and 4B contain the Ag/Pd alloy, and thus it is possible to prevent the occurrence of such a problem. The discharge electrodes 4A and 4B may contain a metal other than the Ag/Pd.

When the discharge-inducing portion 8 contains the Ag/Pd alloy, and the discharge electrodes 4A and 4B contain the Ag/Pd alloy, the alloy ratios of the individual Ag/Pd alloys are made equal to each other, and thus it is possible to prevent the reaction of the Ag/Pd alloys between the discharge-inducing portion 8 and the discharge electrodes 4A and 4B.

Figure 6:
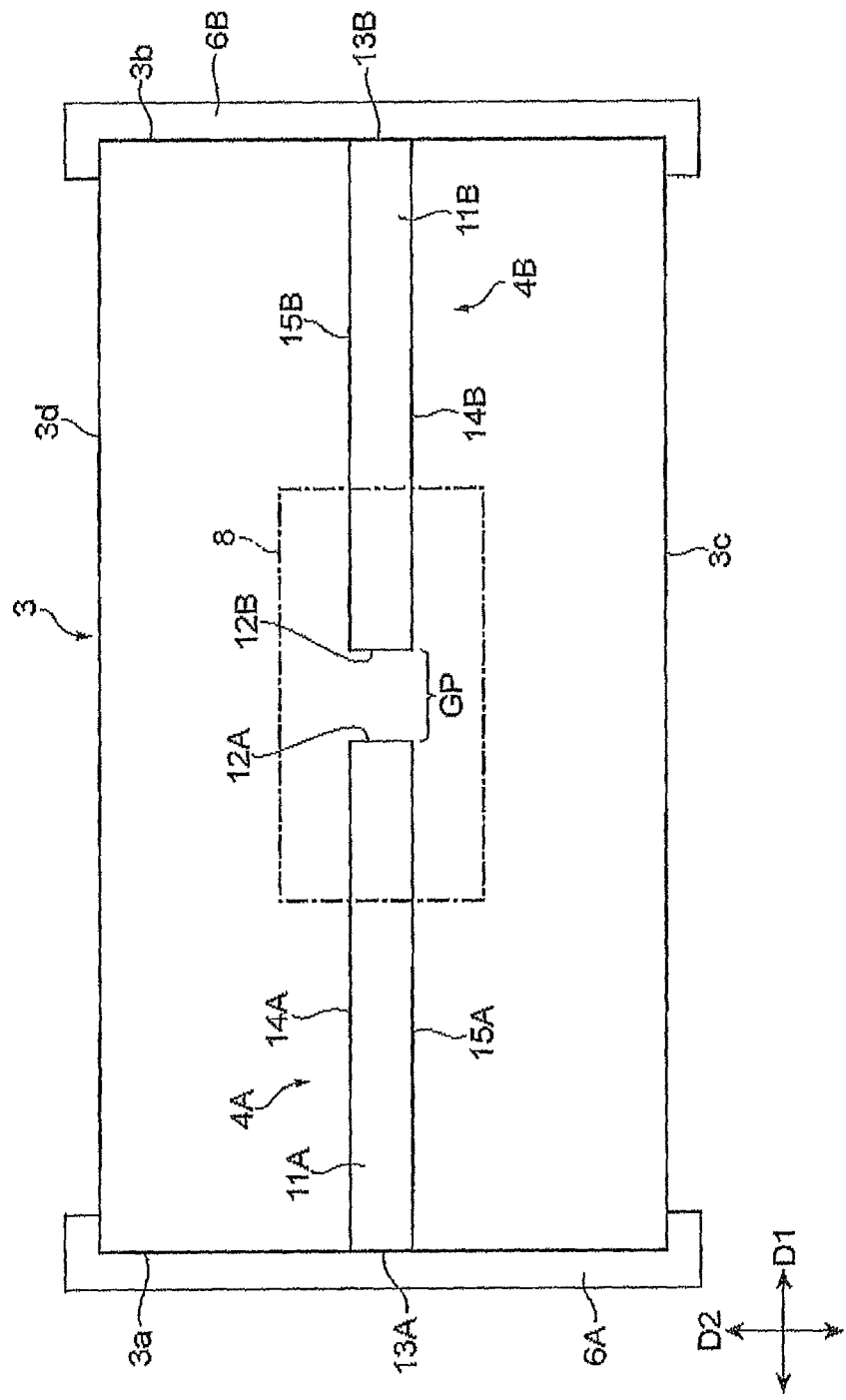
FIG. 6 is a diagram of a discharge portion of an electrostatic protection component according to a comparative example when viewed in the direction of the lamination.

The effects of the configuration of the discharge electrodes 4A and 4B according to the present embodiment will now be described with reference to FIGS. 3, 6 and 7. The discharge electrode 4A of FIG. 6 extends from the end surface 3a of the body 3 in the longitudinal direction D1; the discharge electrode 4B extends from the end surface 3b of the body 3 in the longitudinal direction D1. The tip 12A of the discharge electrode 4A and the tip 12B of the discharge electrode 4B face each other to form the gap portion GP. That is, the length of the discharge portion is restricted within a short range of the tips 12A and 12B.

Figure 7:
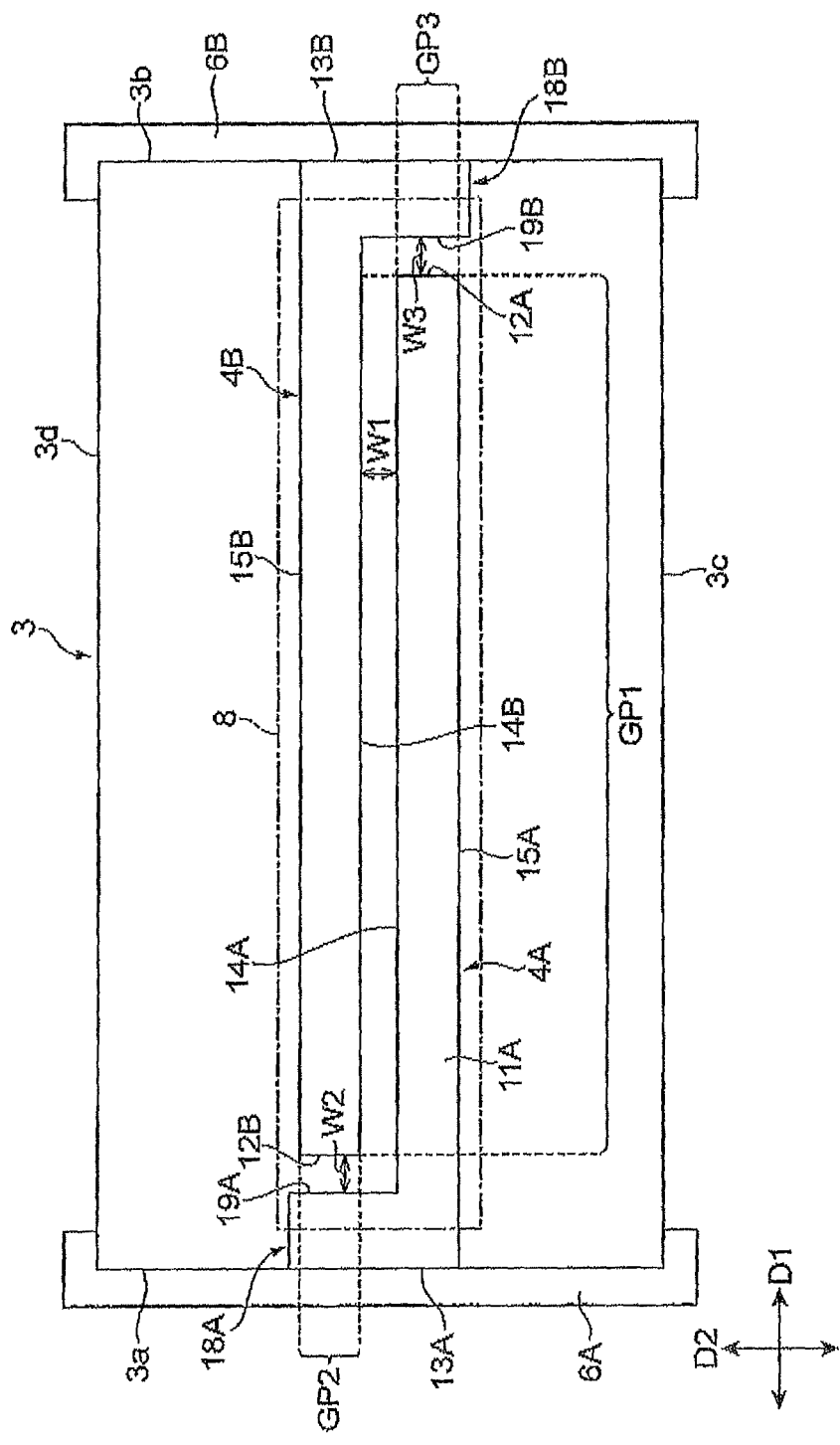
FIG. 7 is a diagram of the discharge portion of the electrostatic protection component according to the comparative example when viewed in the direction of the lamination.

In the discharge electrodes 4A and 4B of FIG. 7, on the side of the tips 12A and 12B, the opposing portions are formed. Specifically, the discharge electrode 4A has, on the side of the end surface 3a, an enlargement portion 18A which extends from the main body portion 11A toward the side surface 3d in the short direction D2. In the enlargement portion 18A, one side edge is exposed from the body 3 and is connected to the external electrode 6A, and the other side edge 19A faces the tip 12B of the discharge electrode 4B in the longitudinal direction D1 to form a gap portion GP2. When the size of the gap of a gap portion GP1 where the side edge 14A and the side edge 14B face each other is assumed to be W1, the size W2 of the gap of the gap portion GP2 is set equal to W1.

The discharge electrode 4B has, on the side of the end surface 3b an enlargement portion 18B which extends from the main body portion 11B toward the side surface 3c in the short direction D2. In the enlargement portion 18B, one side edge is exposed from the body 3 and is connected to the external electrode 6B, and the other side edge 19B faces the tip 12A of the discharge electrode 4A in the longitudinal direction D1 to form a gap portion GP3. The size W3 of the gap of the gap portion GP3 is set equal to W1. The discharge-inducing portion 8 is formed not only in the gap portion GP1 but also in the gap portions GP2 and GP3. By the configuration shown in FIG. 7, the length of the discharge portion is increased. However, since the electric field is concentrated in the tips 12A and 12B that are longer than the side edges 14A and 14B, in the configuration of FIG. 7, discharge is likely to preferentially occur only in the tips 12A and 12B. Therefore, even if the length of the portions of the discharge electrodes 4A and 4B facing each other are increased, the practical discharge portions are limited to the gap portions GP2 and GP3 at the tips 12A and 12B, and thus there has been a possibility that it is impossible to increase the durability of the electrostatic protection component.

By contrast, in the configuration shown in FIG. 3, the discharge electrode 4A has the side edge 14A extending along the longitudinal direction D1, and the discharge electrode 4B has the side edge 14B extending along the longitudinal direction D1. In the discharge electrodes 4A and 4B, only the side edges 14A and 14B face each other, and no portions face each other on the side of the tips 12A and 12B. As described above, the side edge 14A and the side edge 14B extending along the longitudinal direction D1 face each other, and, between the discharge electrode 4A and the discharge electrode 4B, discharge occurs only between the side edge 14A and the side edge 14B. The side edges 14A and 14B longer than the tips 12A and 12B face each other, and thus it is possible to increase the length of the gap portion GP as compared with the configuration of FIG. 6. Discharge is prevented from being concentrated in the tips 12A and 12B, and discharge can occur in the side edges 14A and 14B extending long. That is, it is possible to increase the practical length of the discharge portion as compared with the configuration of FIG. 7. In this way, it is possible to increase the length of the gap portion GP between the discharge electrode 4A and the discharge electrode 4B and enhance the durability of the electrostatic protection component 1.

By providing no portion, on the side of the tips 12A and 12B, facing other discharge electrode, it is possible to more reliably cause discharge only between the side edge 14A and the side edge 14B.

The first embodiment described above is used to describe one embodiment of the electrostatic protection component according to the present invention; the electrostatic protection component according to the present invention is not limited to the first embodiment. The electrostatic protection component according to the present invention may be an electrostatic protection component that is obtained by varying the electrostatic protection component according to the embodiment or applying it to another one without departing from the spirit of each of the claims.

For example, the configuration of the discharge electrodes 4A and 4B is not limited to the configuration shown in FIG. 3; the length, the width and the size of the gap may be modified as necessary. For example, the configuration shown in FIG. 8 may be adopted.

Figure 8:
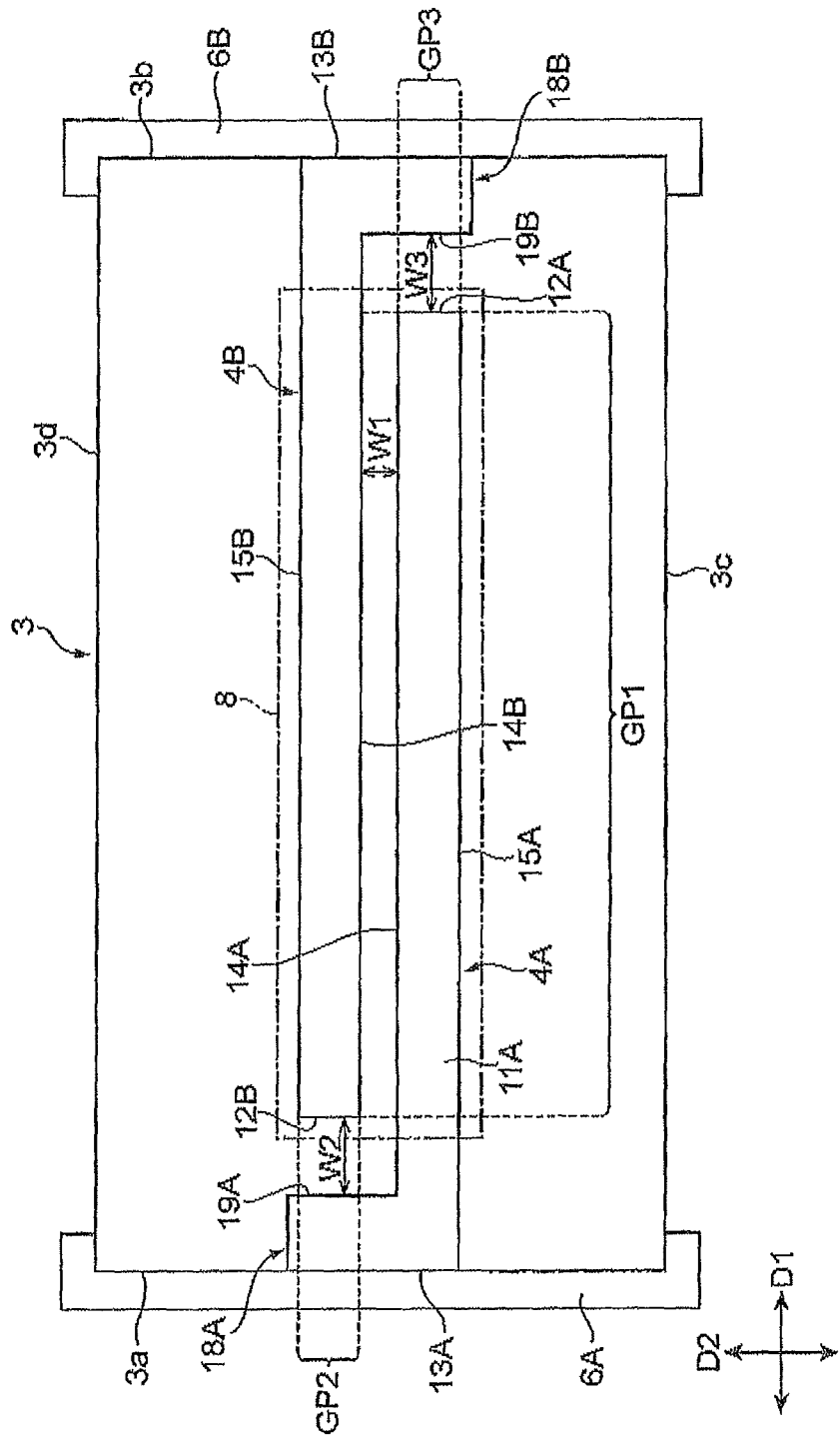
FIG. 8 is a diagram of a discharge portion of an electrostatic protection component according to a variation of the first embodiment when viewed in the direction of the lamination.

Although, in a variation shown in FIG. 8, as in the configuration of FIG. 7, the enlargement portions 18A and 18B and the gap portions GP2 and GP3 are provided, the size W1 of the gap of the gap portion GP1 is smaller than the sizes W2 and W3 of the gaps of the gap portions GP2 and GP3. The discharge-inducing portion 8 is formed only in the gap portion GP1 (that is, between the side edge 14A and the side edge 14B) among the gap portions, and is not formed in the gap portions GP2 and GP3. Therefore, it is possible to more reliably cause discharge only between the side edge 14A and the side edge 14B. Even when the enlargement portions 18A and 18B facing the tips 12A and 12B are provided, by making the distance W1 between the side edge 14A and the side edge 14B smaller than the distance W2 between the tip 12B and the side edge 19A and the distance W3 between the tip 12A and the side edge 19B, it is possible to more reliably cause discharge only between the side edge 14A and the side edge 14B. In consideration of the materials and the like of the constituent elements, the distances W2 and W3 are preferably set at such a distance that no discharge occurs. Here, the enlargement portions 18A and 18B has the function of enhancing the connectivity between the discharge electrodes 4A and 4B and the external electrodes 6A and 6B.

Figure 9:
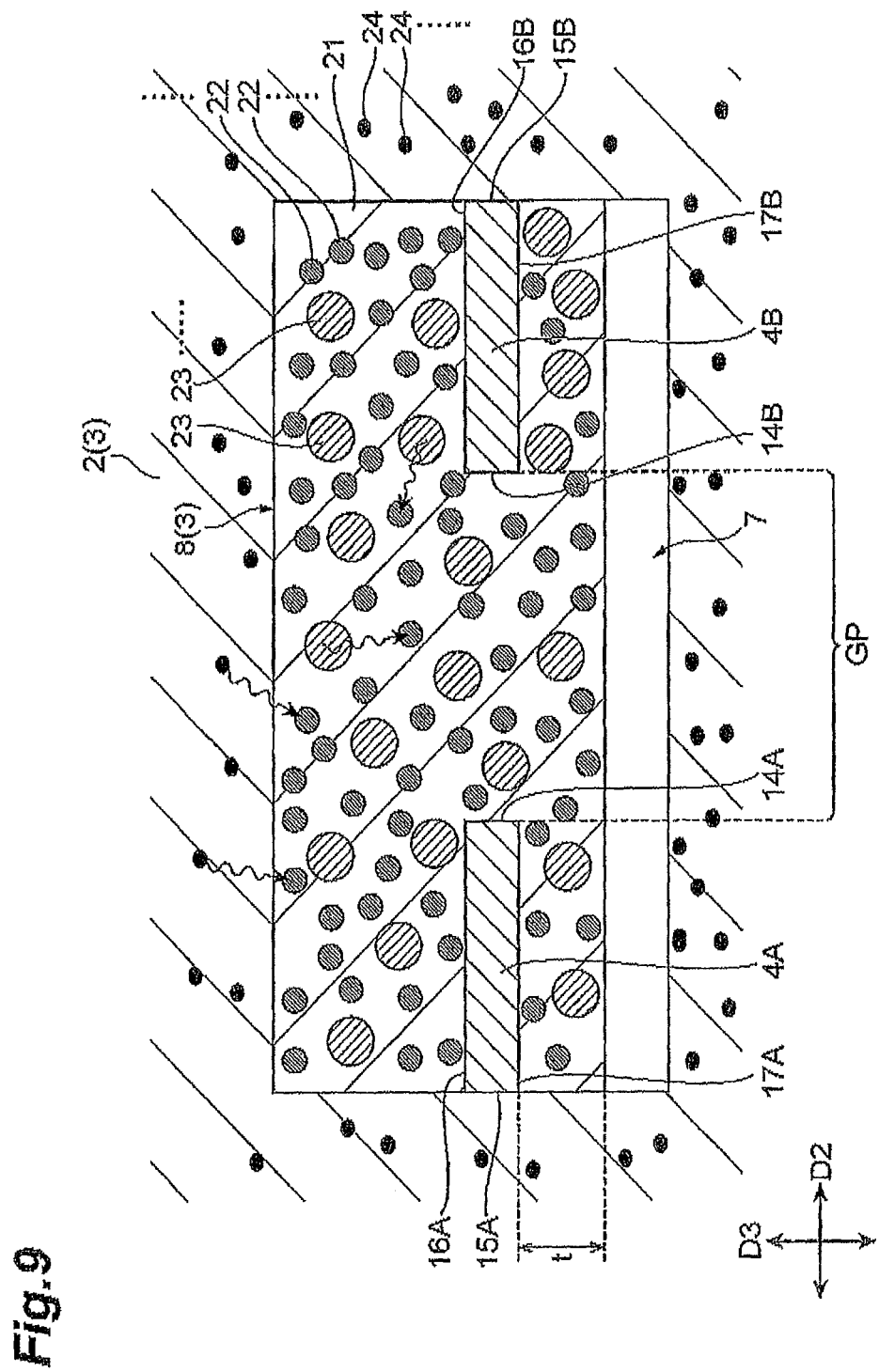
FIG. 9 is a cross-sectional view of the discharge portion of the electrostatic protection component according to the variation of the first embodiment.

A configuration shown in FIG. 9 may be adopted. The configuration of FIG. 9 differs from the embodiment described above in that, on the side of the gap portion GP, the discharge electrodes 4A and 4B are embedded in the body 3.

The configuration of FIG. 9 will be described in detail. The discharge-inducing portion 8 has the function of facilitating the occurrence of discharge between the discharge electrode 4A and the discharge electrode 4B. The discharge-inducing portion 8 is in contact with both the discharge electrodes 4A and 4B around the position of the center of the body 3 so as to include the discharge electrodes 4A and 4B, and makes the discharge electrode 4A the discharge electrode 4B connect to each other. The discharge-inducing portion 8 is formed so as to contain, as see in the lamination direction D1, at least the gap portion GP and to surround the region of the main body portion 11A on the side of the tip 12A and the region of the main body portion 11B on the side of the tip 12B.

The discharge-inducing portion 8 is formed so as to contact the side edge 14A (may contact the side edge 15A), the upper surface 16A and the lower surface 17A of the discharge electrode 4A and to contact the side edge 14B (may contact the side edge 15B), the upper surface 16B and the lower surface 17B of the discharge electrode 4B. The side edge 15A of the discharge electrode 4A is in contact with the ceramic substrate 2; the side edge 15B of the discharge electrode 4B is in contact with the ceramic substrate 2. The tip 12A of the discharge electrode 4A and the tip 12B of the discharge electrode 4B are also in contact with the ceramic substrate 2.

The internal space 7 is formed in a position adjacent to the discharge-inducing portion 8 in the lamination direction D3. Between the internal space 7 and the discharge electrodes 4A and 4B, a portion of the discharge-inducing portion 8 is arranged. That is, the discharge electrode 4A and the discharge electrode 4B are completely embedded in the body 3, and no portion is exposed to the internal space 7. The internal space 7 is configured to prevent the discharge electrode 4A and the discharge electrode 4B from communicating with each other. The internal space 7 functions as a thermal expansion absorption portion for absorbing the thermal expansion of the discharge electrodes 4A and 4B, the ceramic substrate 2 and the discharge-inducing portion 8 at the time of the discharge. Since the internal space 7 is adjacent to the discharge electrodes 4A and 4B and the discharge-inducing portion 8 in the lamination direction D3, the internal space 7 easily absorbs the thermal expansion at the time of the discharge.

Since the internal space 7 functions as the thermal expansion absorption portion described above, the distance between the discharge electrodes 4A and 4B and the internal space 7 in the lamination direction D3, that is, the size of a portion indicated by t in the figure is preferably set at 1 to 20 µm. The size of the internal space 7 in the lamination direction D3 is preferably set at 1 to 20 µm. Although FIG. 9 shows that the size of the internal space 7 in the breadth direction (the short direction D2) is equal to that of the discharge-inducing portion 8, the present invention is not limited to this configuration; the size may be increased or decreased. The size of the internal space 7 in the breadth direction is preferably set at 10 to 100 μm.

In the configuration described above, all portions of the discharge electrode 4A except a portion exposed from the end surface 3a for connection to the external electrode 6A are embedded in the body 3 (that is, the ceramic substrate 2 and the discharge-inducing portion 8); the discharge electrode 4A has no portion exposed to the outside or the internal space 7. All portions of the discharge electrode 4B except the portion exposed from the end surface 3b for connection to the external electrode 6B are embedded in the body 3 (that is, the ceramic substrate 2 and the discharge-inducing portion 8); the discharge electrode 4B has no portion exposed to the outside or the internal space 7.

Figure 10:
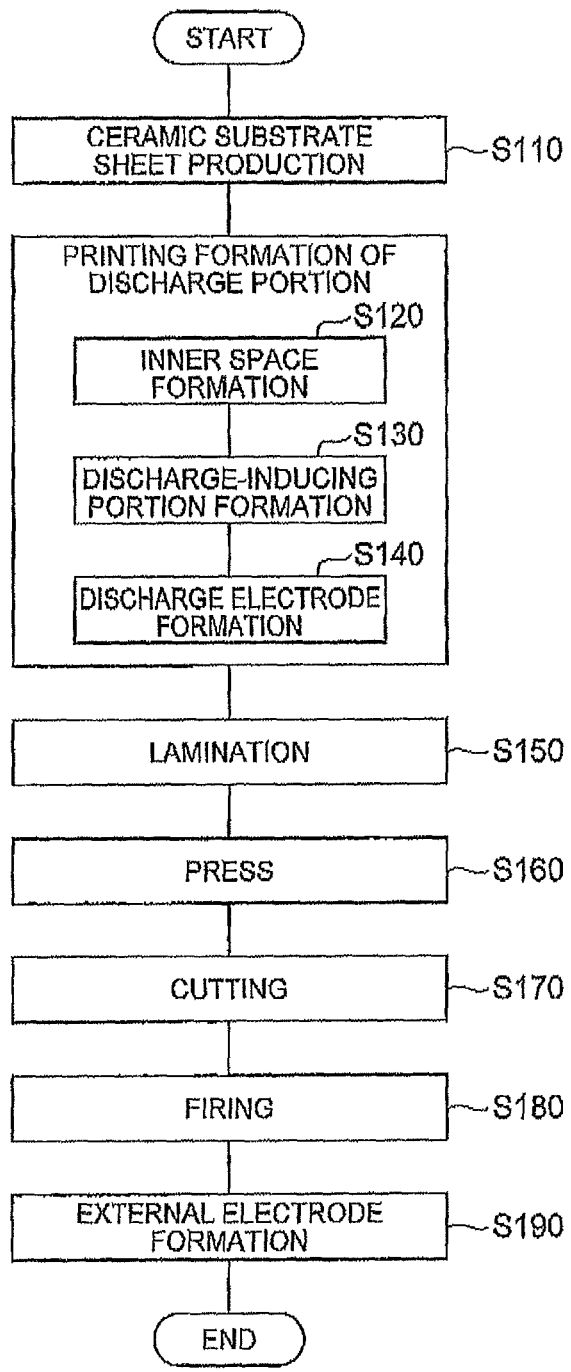
FIG. 10 is a flow diagram showing an example of the method of manufacturing the electrostatic protection component according to the variation of the first embodiment.

An example of the method of manufacturing the electrostatic protection component 1 according to the variation shown in FIG. 9 will now be described with reference to FIG. 10. The manufacturing method is not particularly limited; the order of individual steps may be changed, specific methods within the steps may be changed and the electrostatic protection component 1 may be manufactured with other steps.

First, a slurry that is the material composed of the ceramic substrate 2 is prepared, and a ceramic substrate sheet is produced (step S110). Specifically, a predetermined amount of dielectric powder, containing the copper oxide (CuO) and an organic vehicle containing an organic solvent and an organic binder are mixed, and thus a ceramic substrate slurry is prepared. As the dielectric powder, a dielectric material containing, as the main component, the oxide (which may be another dielectric material) of Mg, Cu, Zn, Si or Sr can be used. Thereafter, by a doctor blade method or the like, the slurry is applied onto a PET film, and thus a green sheet having a thickness of about 20 μm is formed.

Then, the discharge portion is formed by printing in a predetermined position of the ceramic substrate sheet. An air gap material lacquer for forming the inner space in the opposing portion of the discharge electrode is applied. An organic lacquer containing an organic solvent and an organic binder can be used. In this way, a portion serving as the inner space after firing is formed (step S120).

Then, a discharge-inducing material slurry is prepared, and the slurry is applied from above the air gap lacquer to form the discharge-inducing portion before firing (step S130). Specifically, the discharge-inducing material slurry is prepared by mixing the powders of the tin oxide, the insulator and the conductor weighed to predetermined amounts and the organic vehicle containing the organic solvent and the organic binder. For example, as the tin oxide, $SnO_2$ which is an industrial material can be used. As the insulator, the dielectric powder can be used. As the dielectric powder, a dielectric material containing an oxide of Mg, Cu, Zn, Si or Sr (another dielectric material may be used) as the main component can be used. As the conductor powder, Ag/Pd powder can be used (Ag, Pd, Au, Pt, a mixture or a compound thereof or the like can also be used).

Conductive paste is applied by screen printing or the like to the ceramic substrate sheet to form a conductive pattern for the discharge electrode before firing is formed (step S140). The discharge-inducing material slurry may be further applied from above the conductive pattern. As described above, the air gap lacquer is first applied, and then the discharge-inducing material slurry is applied from above the air gap lacquer, that is, they are applied in this order, and thus it is possible to, for example, reliably prevent the air gap lacquer from dripping off to the conductive paste for the discharge electrode, and reliably prevent the discharge electrode from being exposed to the inner space after firing.

The ceramic substrate sheet on which the discharge portion is printed and the ceramic substrate sheets of the other layers are sequentially laminated (step S150) and are pressed (step S160), and the laminated member is cut into pieces, each having the size of the electrostatic protection component (step S170). Then, each body is subjected to firing under predetermined conditions (for example, for two hours at a temperature of 850 to 950° C. in the atmosphere) (step S180). At this time, by the fact that the air gap material lacquer is dissipated within the body 3, the internal space 7 is formed in the discharge portion. Thereafter, the conductive paste for the external electrode is applied to the body 3 and is subjected to thermal processing under predetermined conditions (for example, for two hours at a temperature of 600 to 800° C. in the atmosphere), and thus the external electrode is baked (step S190). Thereafter, the surface of the external electrode is plated. As the plating, electrolytic plating is preferable, and for example, Ni/Sn, Cu/Ni/Sn, Ni/Pd/Au, Ni/Pd/Ag, Ni/Ag or the like can be used. In this way, the electrostatic protection component 1 is completed.

In this way, in the configuration of FIG. 9, the regions of a pair of discharge electrodes 4A and 4B on the side of the gap portion GP are embedded within the body 3. That is, the discharge electrodes 4A and 4B do not have, except the portions connected to the external electrodes 6A and 6B, portions exposed to the outside, the internal space 7 within the body 3 and the like, and are embedded within the body 3. In the configuration described above, even when the body 3 is immersed in water in a manufacturing step (for example, plating), water is unlikely to enter the body 3 from the outside, and thus it is possible to prevent ion-migration. Even when the discharge electrodes 4A and 4B are embedded within the body 3, since the body 3 has the internal space 7 functioning as the thermal expansion absorption portion for absorbing the thermal expansion resulting from the discharge, it is possible to prevent cracks in the body 3. In this way, it is possible to have both the capability of protection from the external environment and the capability of preventing cracks in the body 3.

Moreover, since the internal space 7 does not cause the pair of discharge electrodes 4A and 4B to communicate with each other, it is possible to prevent ion-migration resulting from the infiltration of water.

Figure 11:
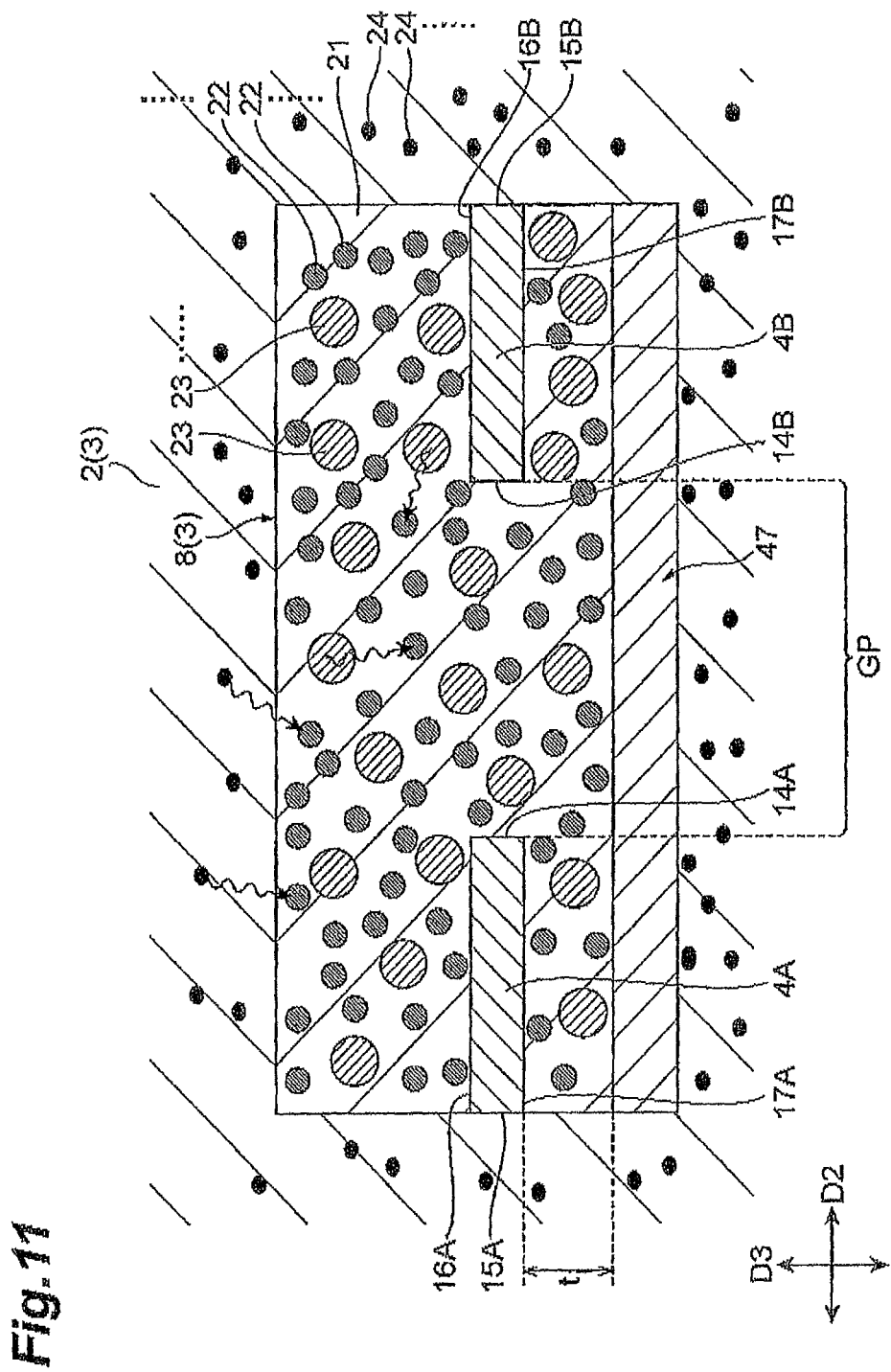
FIG. 11 is a cross-sectional view of the discharge portion of the electrostatic protection component according to the variation of the first embodiment.

The configuration of the thermal expansion and absorption portion is not limited to only the internal space, any configuration may be adopted as long as it can absorb thermal expansion resulting from discharge. For example, as shown in FIG. 11, a ceramic 47 having a low Young's modulus may be arranged instead of the internal space. The Young's modulus of the ceramic 47 is lower than that of the ceramic substrate 2 therearound, and specifically, the Young's modulus is 50 to 200 GPa. Even if the ceramic 47 having such a low Young's modulus is deformed by thermal expansion, since the other portions of the body 3 are not affected, the ceramic 47 can absorb the thermal expansion resulting from the discharge.

Although, in the embodiment described above, the electrostatic protection component including only the discharge portion having the electrostatic protection function has been illustrated, the present invention may be applied to an electrostatic protection component to which other functions such as a coil portion and a capacitor portion are added. At this time, the material of the ceramic substrate 2 may be changed to the optimum material for each layer of the discharge portion, the coil portion and the capacitor portion.

Figure 12:
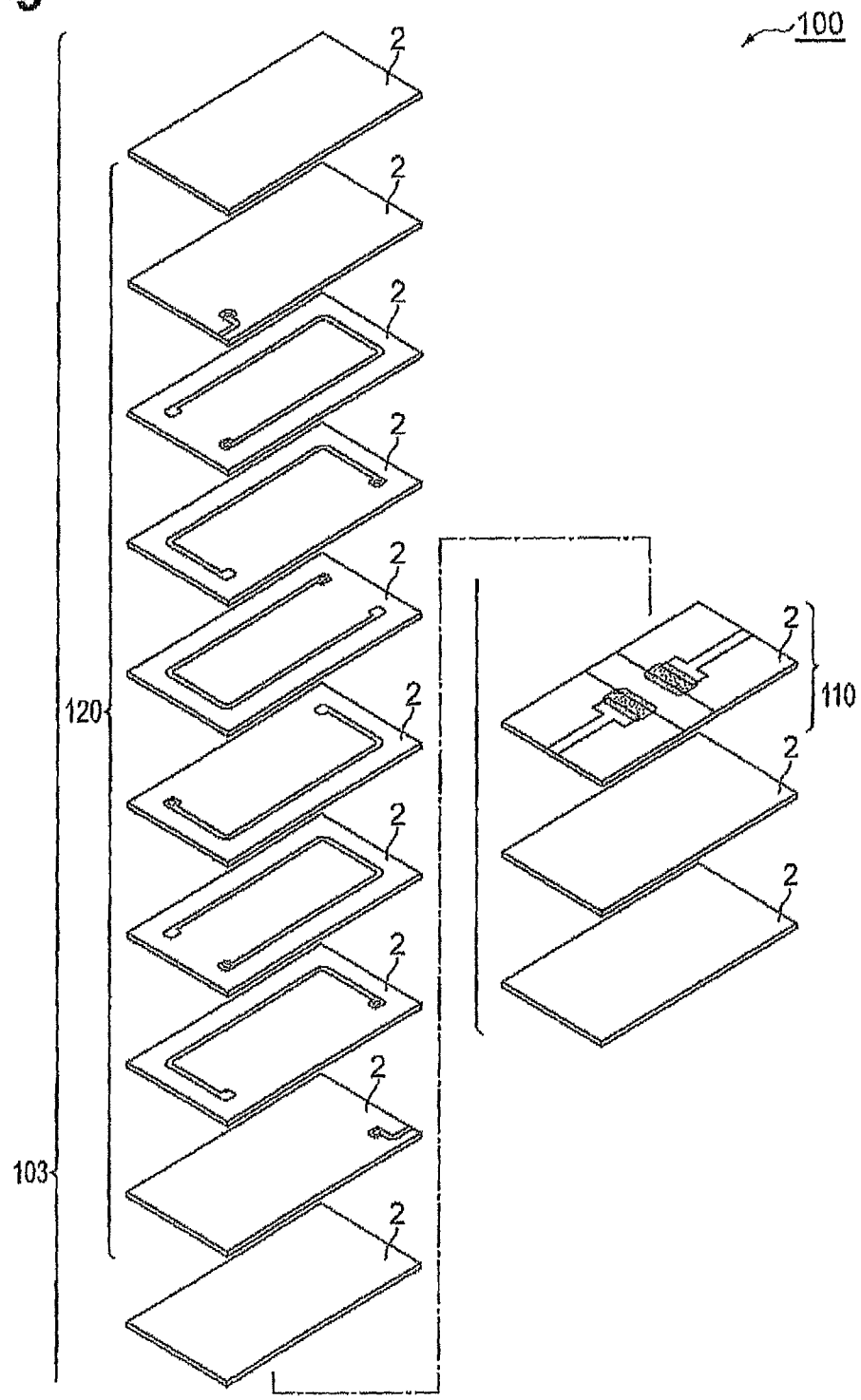
FIG. 12 is a developed perspective view of a body of the electrostatic protection component according to the variation of the first embodiment.
Figure 13:
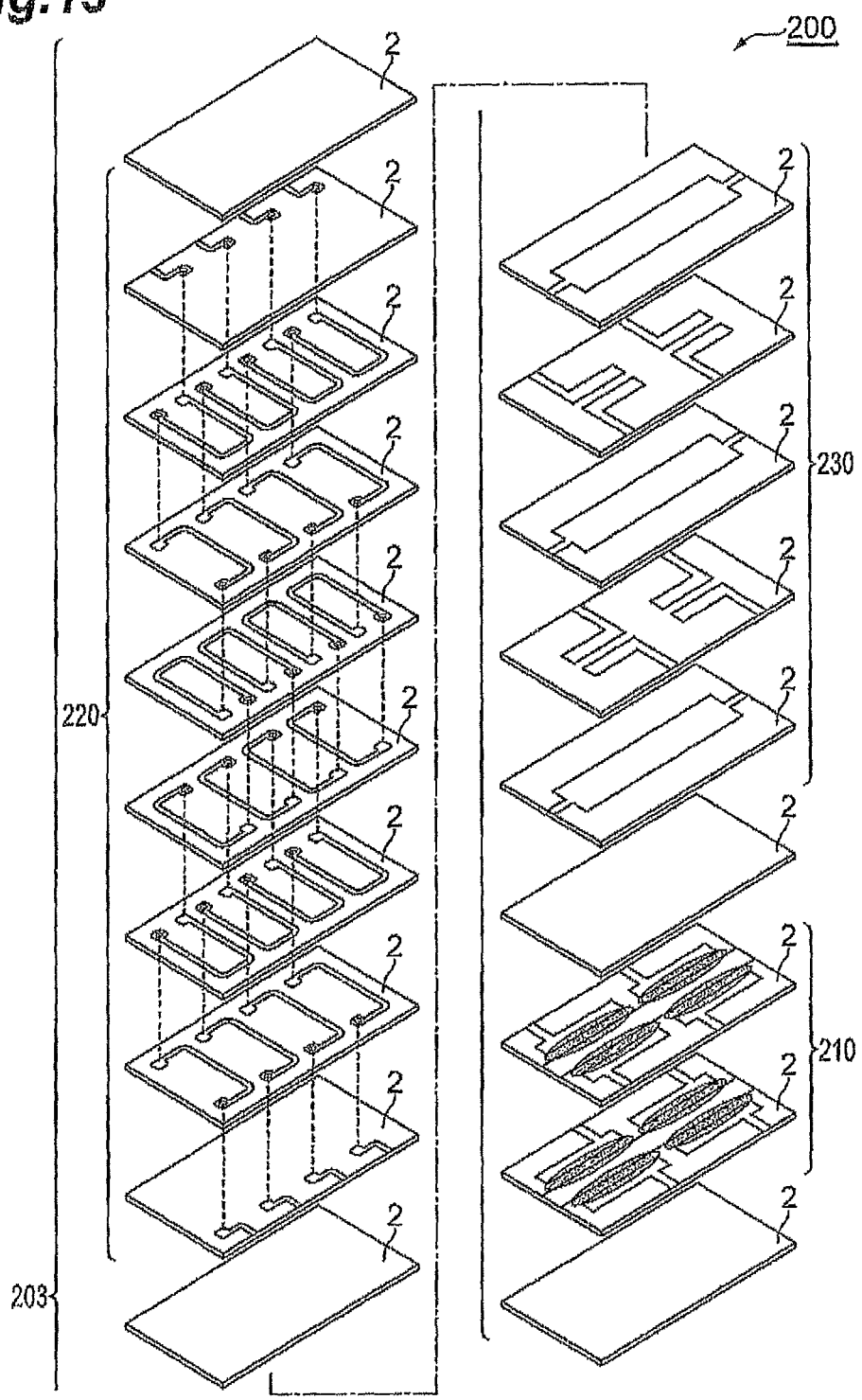
FIG. 13 is a developed perspective view of the body of the electrostatic protection component according to the variation of the first embodiment.
Figure 15:
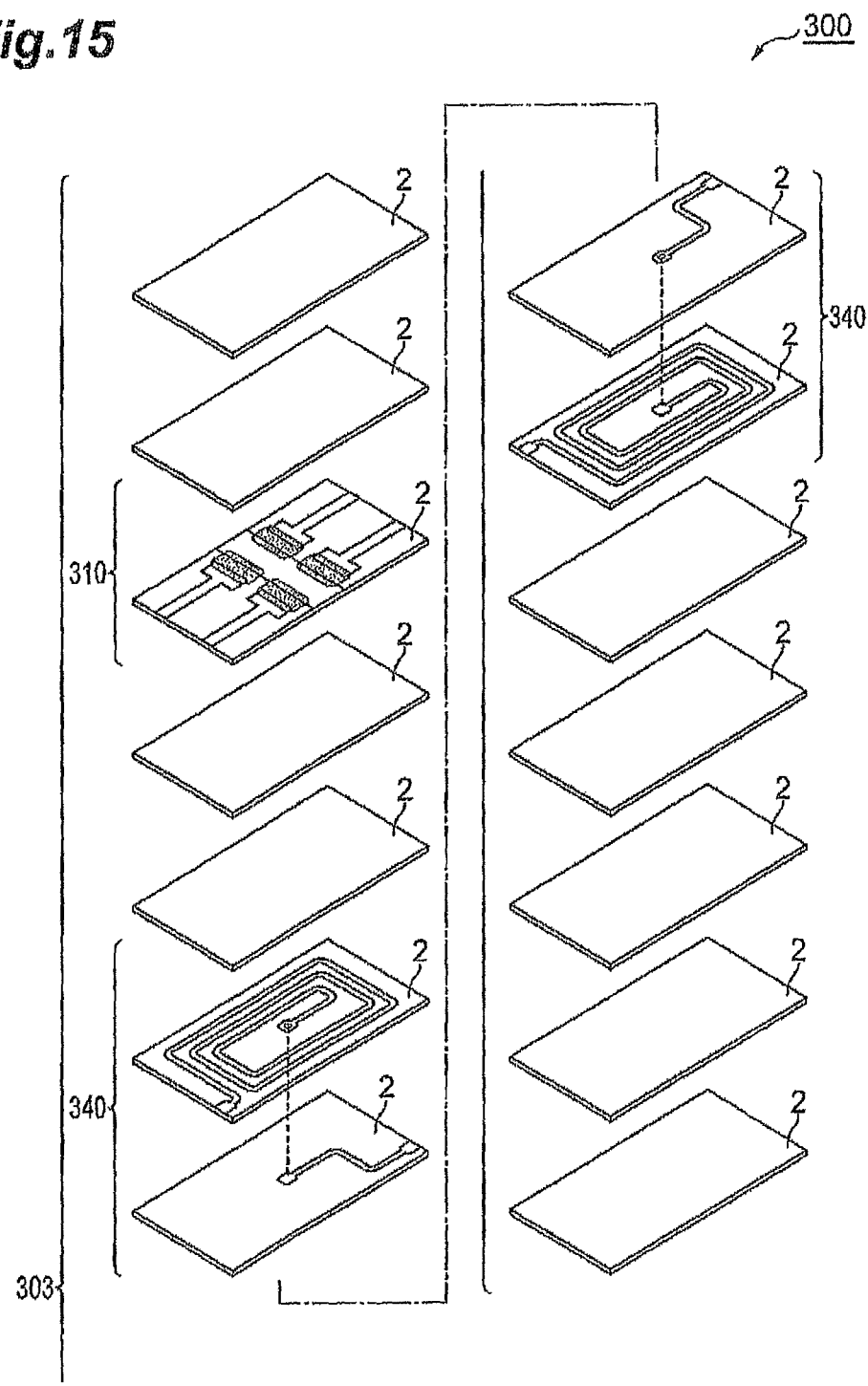
FIG. 15 is a developed perspective view of the body of the electrostatic protection component according to the first embodiment.

For example, an electrostatic protection component 100 shown in FIG. 12 has a coil portion 120 and a discharge portion 110 in one body 103. An electrostatic protection component 200 shown in FIG. 13 has a coil portion 220, a capacitor portion 230 and a discharge portion 210 in one body 203. Furthermore, the coil, the capacitor and the discharge electrode are formed in an array. The array-shaped configuration mentioned above may be applied to an electrostatic protection component according to other embodiments. An electrostatic protection component 300 shown in FIG. 15 has a discharge portion 310 and a common mode choke coil portion 340 in one body 303.

Figure 14:
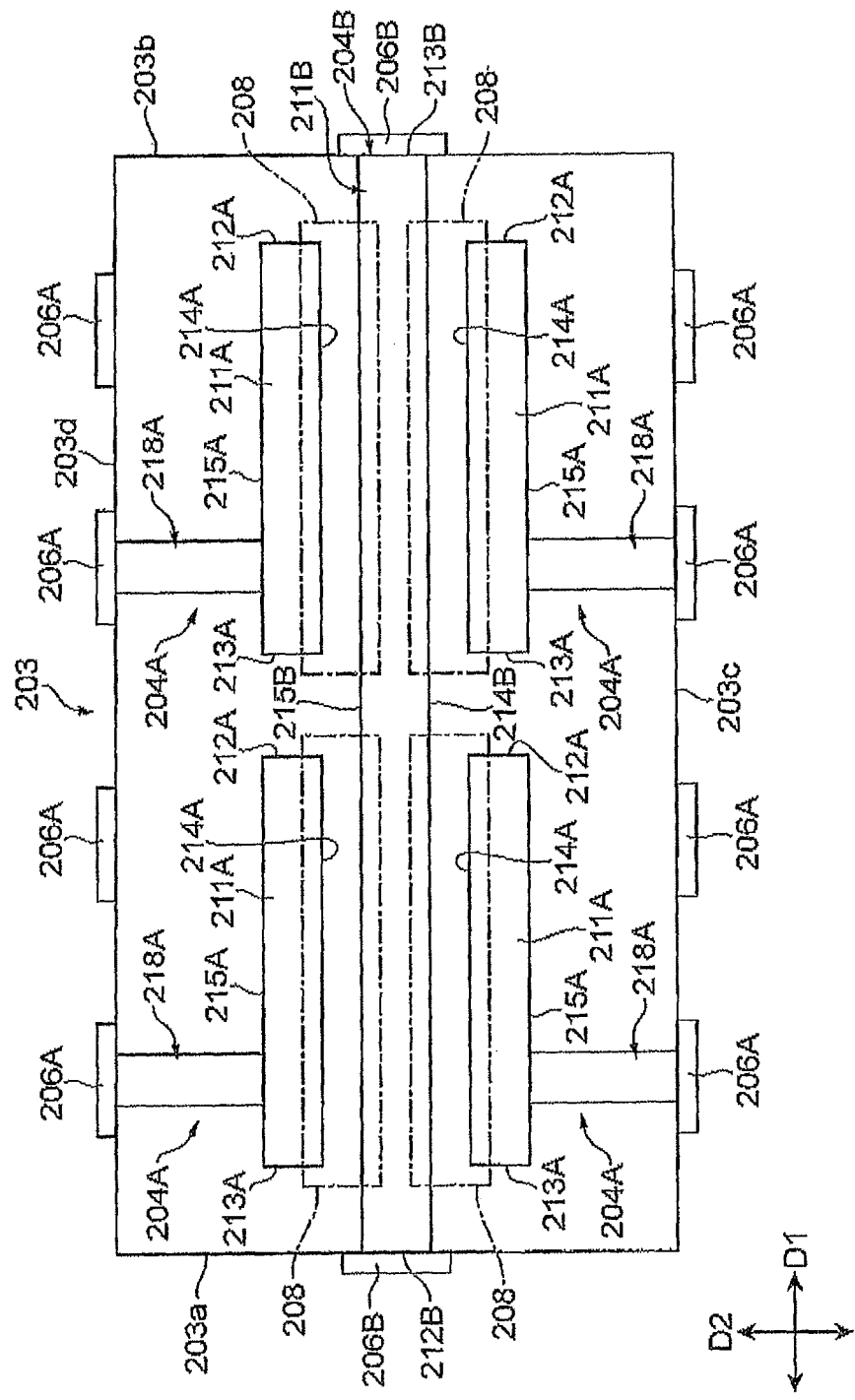
FIG. 14 is a diagram of a discharge portion of the electrostatic protection component shown in FIG. 13 when viewed in the direction of the lamination.

The configuration of a discharge portion of the electrostatic protection component combined with the coil portion, the capacitor portion and the like will be described with reference to FIG. 14 showing the configuration of the electrode of the electrostatic protection component 200.

A discharge electrode 204A includes a main body portion 211A extending along the longitudinal direction D1 and a drawn portion 218A extending from the main body portion 211A in the short direction D2. The main body portion 211A includes a tip 212A and a tip 213A in the longitudinal direction D1, and a side edge 214A and a side edge 215A extending along the longitudinal direction D1. The main body portion 211A forms a long rectangle, the tips 212A and 213A constitute short sides, and the side edges 214A and 215A constitute long sides. That is, the side edges 214A and 215A are longer than the tips 212A and 213A. The main body portion 211A is arranged toward the side surface 203c or the side surface 203d of the body 3 slightly away from the center position in the short direction D2. The side edge 214A is an edge portion on the side of the central portion. The drawn portion 218A extends from the side edge 215A of the main body portion 211A along the short direction D2, and is electrically connected to an external electrode 206A formed on the side surface 203c or the side surface 203d of the body 303.

A discharge electrode 204B includes a main body portion 211B extending along the longitudinal direction D1. The main body portion 211B includes a tip 212B and a tip 213B in the longitudinal direction D1, and a side edge 214B and a side edge 215B extending along the longitudinal direction D1. The main body portion 211B forms a long rectangle, the tips 212B and 213B constitute short sides, and the side edges 214B and 215B constitute long sides. That is, the side edges 214B and 215E are longer than the tips 212B and 213B. The main body portion 211B extends along the longitudinal direction D1, in the center position of the short direction D2 of the body 303. The tips 212B and 213B are respectively connected to external electrodes 206B formed on end surfaces 203a and 203b.

The main body portion 211A of the discharge electrode 204A and the main body portion 211B of the discharge electrode 204B are arranged adjacent to each other in the short direction D2. The side edge 214A of the discharge electrode 204A, and the side edge 214B or the side edge 215B of the discharge electrode 204B are spaced to face each other, and thus a gap portion is individually formed between the discharge electrode 204A and the discharge electrode 204B. The gap portion is formed only in the region where the side edge 214A and the side edge 214B face each other and in the region where the side edge 214A and the side edge 215B face each other. In the configuration described above, when a predetermined voltage or more is applied to the external electrodes 206A and 206B, between the discharge electrode 204A and the discharge electrode 204B, discharge occurs only in the gap portion between the side edge 214A and the side edge 214B and in the gap portion between the side edge 214A and the side edge 215B. The upper layer 208 is formed only in each of the gap portions.

With the configuration described above, it is possible to increase the length of the gap portion. Discharge is prevented from being concentrated in the tips 212A and 213A, and discharge can occur in the side edges 214A, 214B and 215B extending long. In this way, it is possible to increase the length of the gap portion between the discharge electrode 204A and the discharge electrode 204B and to enhance the durability of the electrostatic protection component 200. Since the electrostatic protection components 100 and 300 (though each of the main body portions and each of the side edges extend in the short direction D2) has the configuration of approximately the same intension as that of the electrostatic protection component 200, it is possible to obtain the same effects.

(Second Embodiment)

Figure 16:
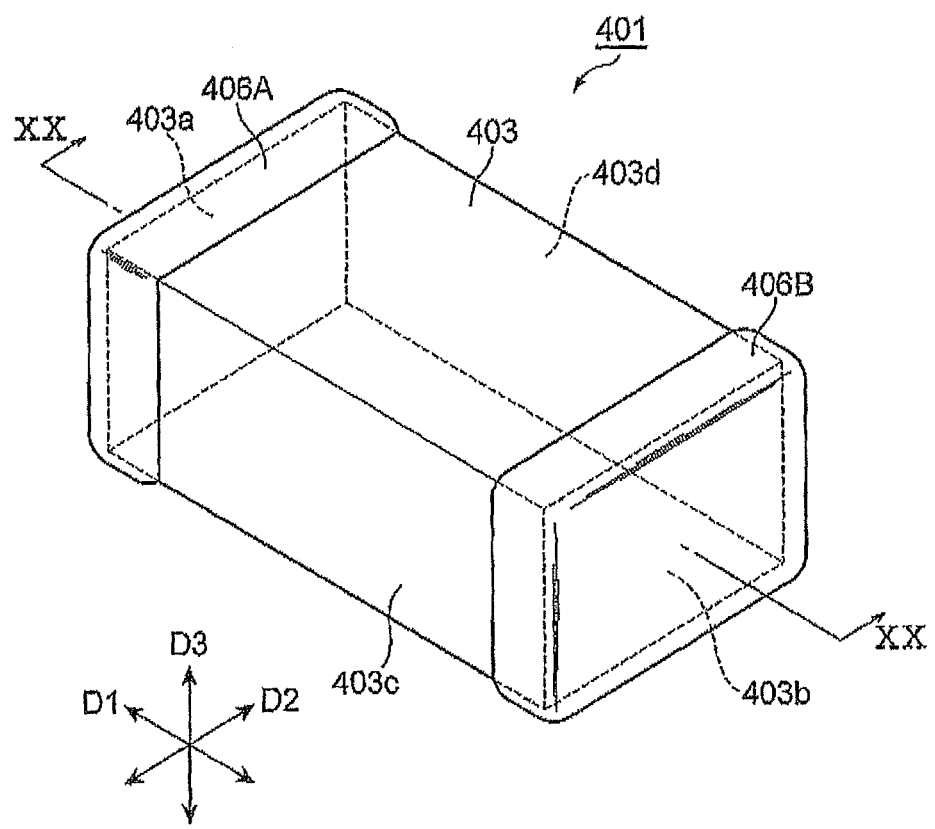
FIG. 16 is a perspective view of an electrostatic protection component according to a second embodiment.
Figure 17:
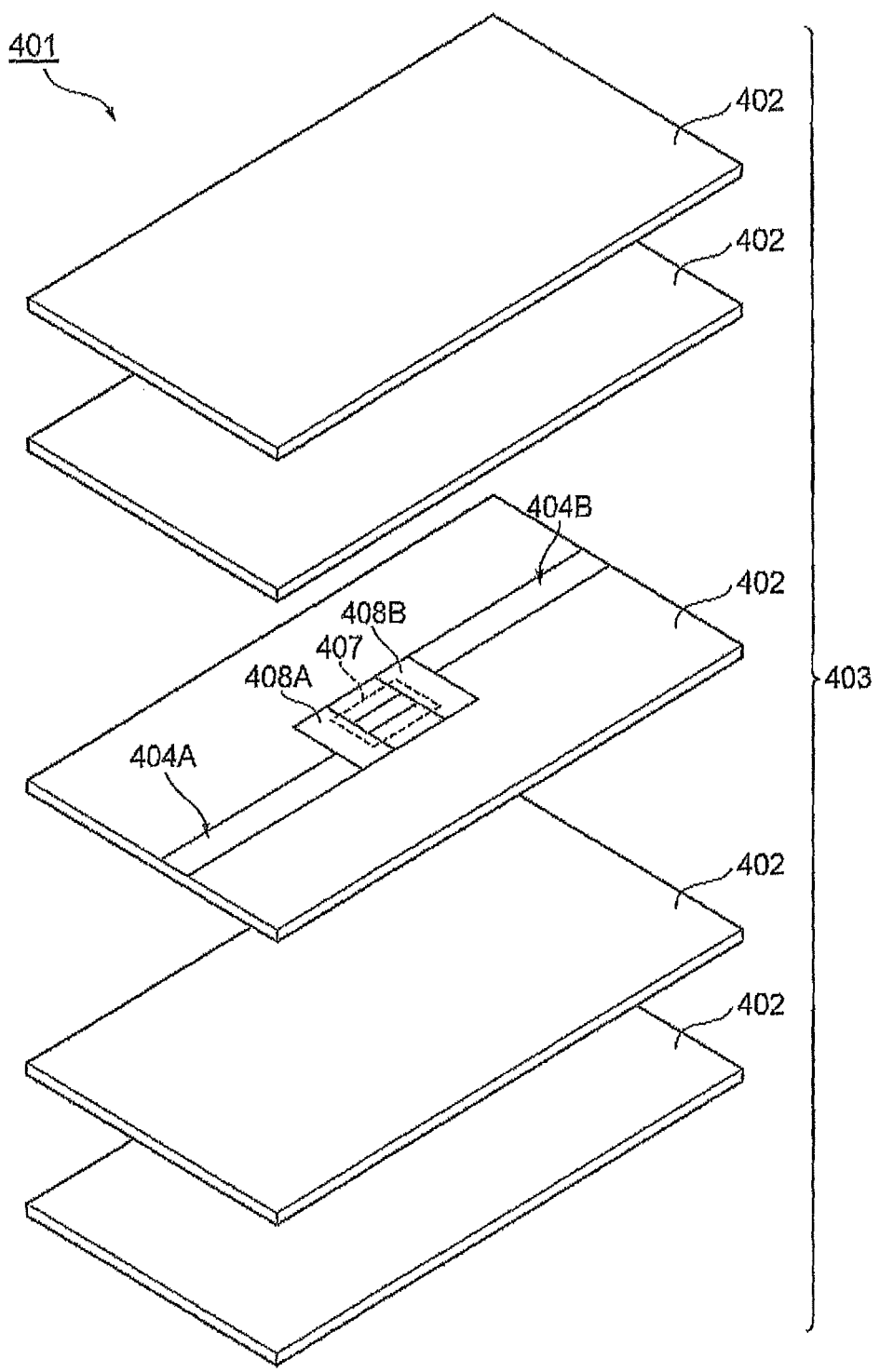
FIG. 17 is a developed perspective view of a body of the electrostatic protection component according to the second embodiment.
Figure 18:
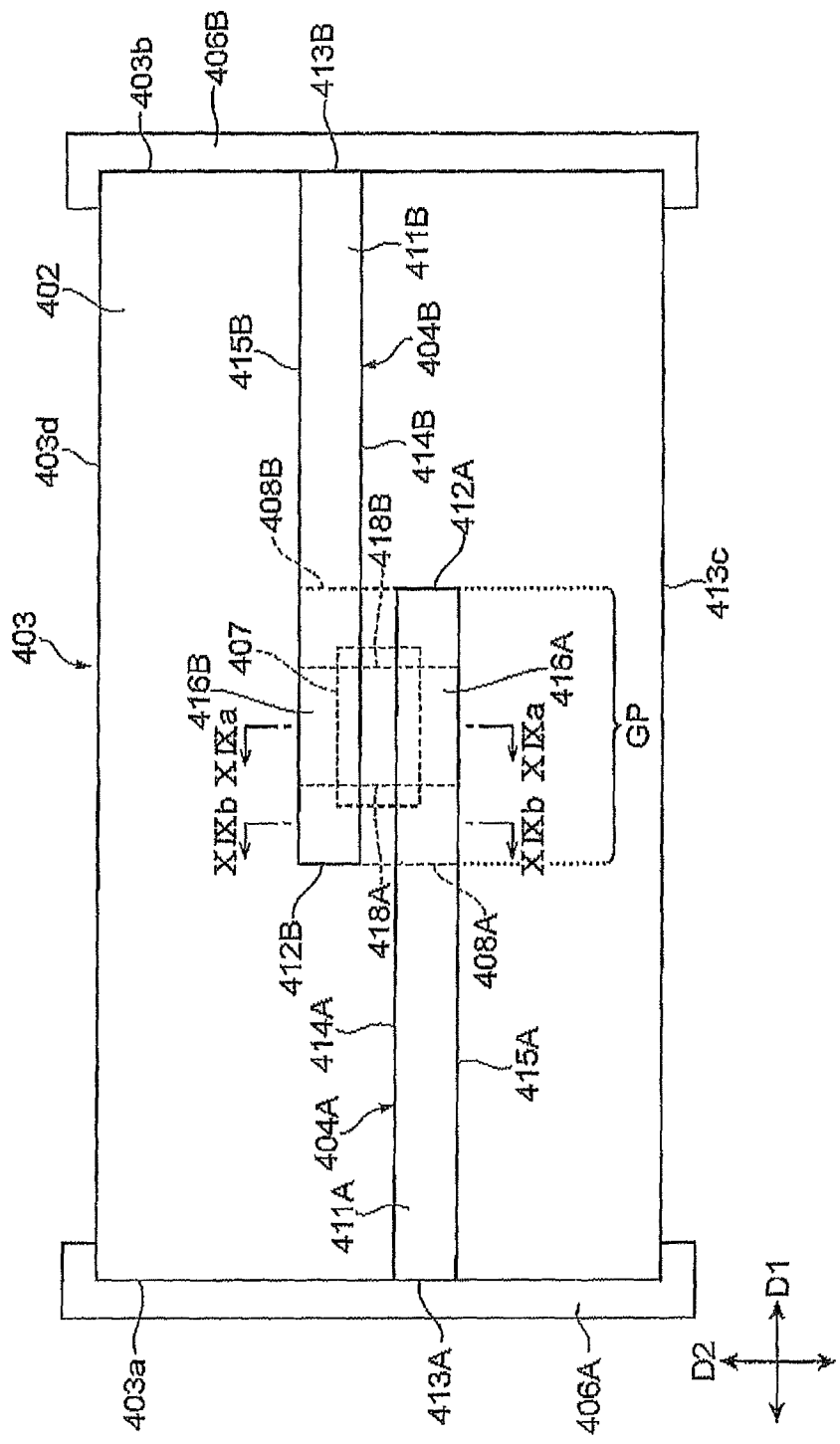
FIG. 18 is a plan view of a discharge portion of the electrostatic protection component shown in FIG. 16 when viewed in the direction of the lamination.

FIG. 16 is a perspective view of an electrostatic protection component according to a second embodiment. FIG. 17 is a developed perspective view of a body of the electrostatic protection component according to the second embodiment. FIG. 18 is a plan view of a discharge portion of the electrostatic protection component when viewed in a direction of lamination. In FIG. 18, ceramic layers 402 on first and second discharge electrodes 404A and 404B and the like are omitted. FIG. 19(a) is a diagram for illustrating a cross-sectional configuration taken along line XIXa-XIXa shown in FIG. 18; FIG. 19(b) is a diagram for illustrating a cross-sectional configuration taken along line XIXb-XIXb shown in FIG. 18. FIG. 20 is a diagram for illustrating a cross-sectional configuration taken along line XX-XX shown in FIG. 16. In the following description, a direction in which a body 403 extends is referred to as the longitudinal direction D1, a direction perpendicular to the longitudinal direction D1 in a direction of a flat surface of the ceramic layers 402 is referred to as the short direction D2 and a direction in which the ceramic layers 402 are laminated is referred to as the lamination direction D3.

The configuration of an electrostatic protection component 401 according to the present embodiment will first be described with reference to FIGS. 16 to 20. The electrostatic protection component 401 is mounted on a circuit substrate of an electronic device, and is an electronic component that protects the electronic device from ESD. The electrostatic protection component 401 includes the body 403 which is configured by laminating a plurality of ceramic layers 402 and which is formed approximately in the shape of a rectangular parallelepiped; first and second discharge electrodes 404A and 404B that are arranged within the body 403 separately from each other on the same ceramic layer 402; first and second external electrodes 406A and 406B that are arranged on both end surfaces 403a and 403b of the body 403 facing each other; and first and second discharge-inducing portions 408A and 408B that connect the first and second discharge electrodes 404A and 404B.

The first discharge electrode 404A is electrically connected to the first external electrode 406A; the second discharge electrode 404B is electrically connected to the second external electrode 406B. The body 403 includes a hollow portion 407 that is formed on the first and second discharge-inducing portions 408A and 408B so as to cover them (refer to FIG. 20). The hollow portion 407 has the function of absorbing the thermal expansion of the ceramic layer 402 and the discharge-inducing portions 408A and 408B. The arrangement of the hollow portion 407 and the discharge-inducing portions 408A and 408B will be described later. In the actual electrostatic protection component 401, the body 403 is integrally formed such that the body 403 cannot be visually recognized.

As shown in FIGS. 17 and 18, the first and second discharge electrodes 404A and 404B are arranged within the body 403 separately from each other on the same ceramic layer 402. The first discharge electrode 404A has a main body portion 411A which extends from the end surface 403a of the body 403 toward the end surface 403b on the opposite side along the longitudinal direction D1 (first direction). The main body portion 411A has a tip 412A and a base end 413A in the longitudinal direction D1 and a side edge 414A and a side edge 415A extending along the longitudinal direction D1. The main body portion 411A forms a long rectangle; the tip 412A and the base end 413A form short sides, and the side edges 414A and 415A form long sides. That is, the side edges 414A and 415A are longer than the tip 412A and the base end 413A.

The main body portion 411A is arranged slightly away from the center position in the short direction D2 toward the side surface 403c of the body 403. The base end 413A is exposed from the end surface 403a of the body 403 and is connected to the external electrode 406A. The tip 412A extends to a position separate from the end surface 403b, and is arranged in a position away from the center position in the longitudinal direction D1 toward the end surface 403b. The side edge 414A is an edge portion of the body 403 on the side of the side surface 403d, and is arranged slightly away from the central portion in the short direction D2 toward the side surface 403c. The side edge 415A is an edge portion of the body 403 on the side of the side surface 403c, and is arranged in a position away from the side surface 403c. The length of the main body portion 411A may be longer or shorter than that shown in FIG. 18.

The second discharge electrode 404B is symmetric with the first discharge electrode 404A with respect to a point around the center of the body 403 when viewed in the lamination direction D3. That is, the second discharge electrode 404B has a main body portion 411B which extends from the end surface 403b of the body 403 toward the end surface 403a on the opposite side along the longitudinal direction D1. The main body portion 411B has a tip 412B and a base end 413B in the longitudinal direction D1 and a side edge 414B and a side edge 415B extending along the longitudinal direction D1. The main body portion 411B forms a long rectangle; the tip 412B and the base end 413B form short sides, and the side edges 414B and 415B form long sides. That is, the side edges 414B and 415B are longer than the tip 412B and the base end 413B.

The main body portion 411B is arranged slightly away from the center position in the short direction D2 toward the side surface 403d of the body 403. The base end 413B is exposed from the end surface 403b of the body 403 and is connected to the second external electrode 406B. The tip 412B extends to a position separate from the end surface 403a, and is arranged in a position away from the center position in the longitudinal direction D1 toward the end surface 403a. The side edge 414B is an edge portion of the body 403 on the side of the side surface 403c, and is arranged slightly away from the central portion in the short direction D2 toward the side surface 403d. The side edge 415B is an edge portion of the body 403 on the side of the side surface 403d of the body 403, and is arranged in a position away from the side surface 403d. The length of the main body portion 411B may be longer or shorter than that shown in FIG. 18.

The first and second discharge electrodes 404A and 404B are arranged such that, as shown in FIG. 18, the side edge 414A of an opposing region 416A on the side of the tip 412A of the first discharge electrode 404A faces the side edge 414B of an opposing region 416B on the side of the tip 412B of the second discharge electrode 404B. The side edge 414A of the opposing region 416A of the first discharge electrode 404A and the side edge 414B of the opposing region 416B of the second discharge electrode 404B are spaced to face each other, and thus a gap portion GP (refer to FIG. 19 and the like) is formed between the first discharge electrode 404A and the second discharge electrode 404B. The gap width (the distance between the side edge 414A and the side edge 414B) of the gap portion GP is, for example, 10 to 100 µm. The gap portion GP is formed only in the opposing region where the side edge 414A faces the side edge 414B (refer to FIG. 18).

In the present embodiment, the first discharge electrode 404A is formed with only the main body portion 411A having the shape of a long rectangle, and does not have a portion facing the tip 412B of the second discharge electrode 404B in the longitudinal direction D1. The second discharge electrode 404B is formed with only the main body portion 411B having the shape of a long rectangle, and does not have a portion facing the tip 412A of the first discharge electrode 404A in the longitudinal direction D1. In this configuration, when a predetermined voltage or more is applied to the first and second external electrodes 406A and 406B, between the first and second discharge electrodes 404A and 404B, discharge occurs only between the side edge 414A and 414B in the gap portion GP.

Figure 19:
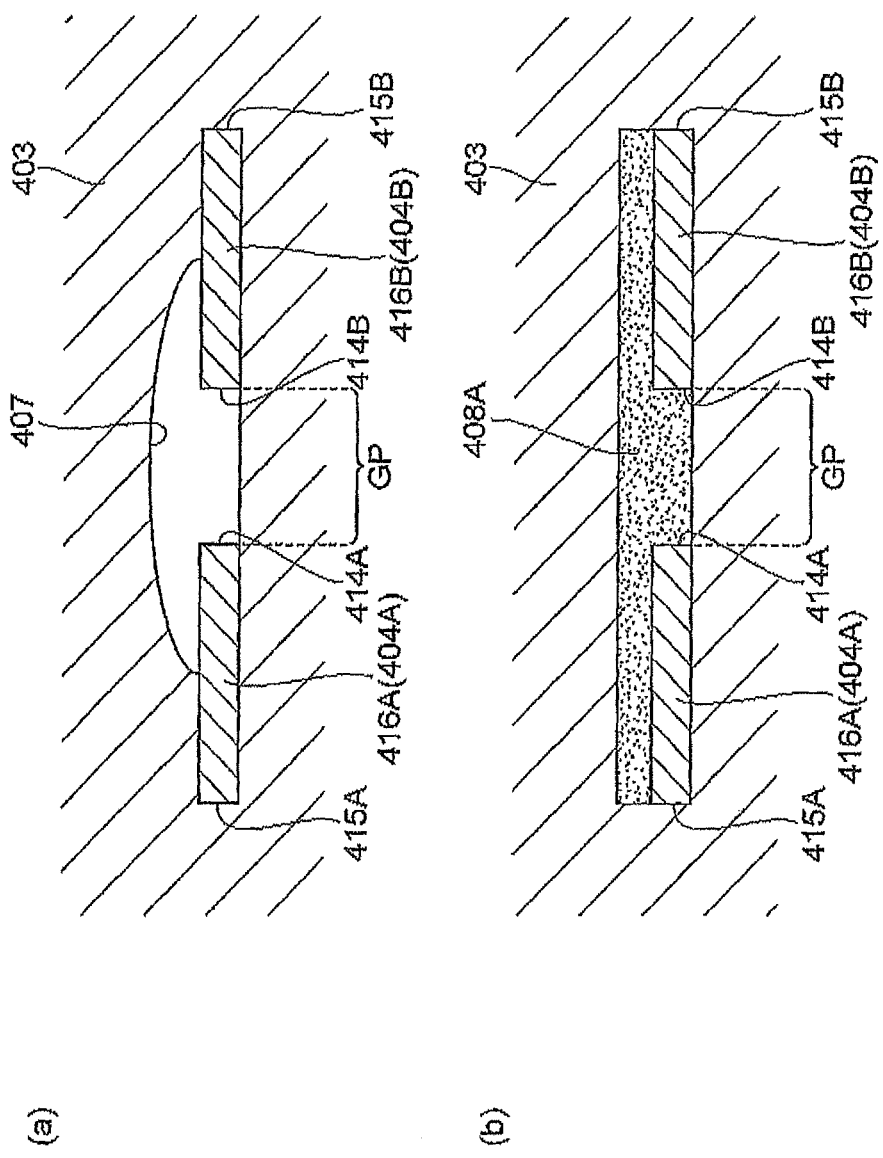
FIG. 19(a) is a transverse cross-sectional view showing a cross-sectional configuration taken along line XIXa-XIXa shown in FIG. 18.
FIG. 19(b) is a transverse cross-sectional view showing a cross-sectional configuration taken along line XIXb-XIXb shown in FIG. 18.
Figure 20:
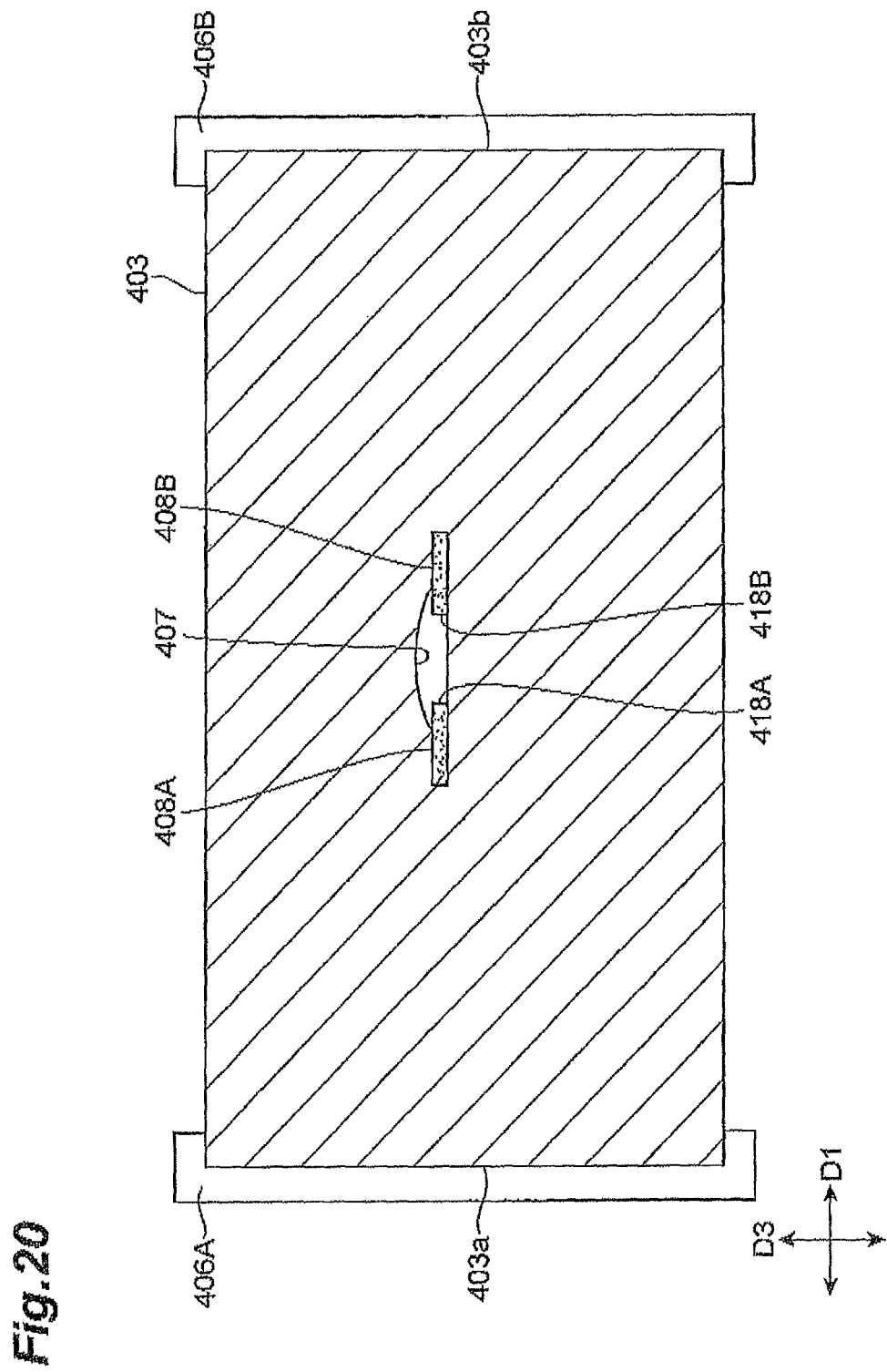
FIG. 20 is a vertical cross-sectional view showing a cross-sectional configuration of the electrostatic protection component shown in FIG. 16 taken along line XX-XX.

As shown in FIGS. 18 and 19, the first and second discharge-inducing portions 408A and 408B have the function of connecting the first and second discharge electrodes 404A and 404B together to facilitate the occurrence of discharge between the first and second discharge electrodes 404A and 404B. The first and second discharge electrodes are approximately rectangular as viewed in the lamination direction D3.

The first discharge-inducing portion 408A is formed so as to contact a portion of the opposing region 416A of the first discharge electrode 404A on the side of the base end 413A and a portion of the opposing region 416B of the second discharge electrode 404B on the side of the tip 412B. Specifically, as shown in FIG. 19(b), the first discharge-inducing portion 408A has a portion which is arranged so as to contact the surfaces of both the discharge electrodes 404A and 404B and which connects both the discharge electrodes 404A and 404B together, and a portion which is arranged in the gap portion GP being the opposing region of both the discharge electrodes 404A and 404B. The first discharge-inducing portion 408A having such portions sandwiches, together with the ceramic layer 402 where the first and second discharge electrodes 404A and 404B are arranged, the first and second discharge electrodes 404A and 404B in the lamination direction D3.

The second discharge-inducing portion 408B is formed so as to contact a portion of the opposing region 416A of the first discharge electrode 404A on the side of the tip 412A and a portion of the opposing region 416B of the second discharge electrode 404B on the side of the base end 413B. Specifically, as with the first discharge-inducing portion 408A, the second discharge-inducing portion 408B has a portion which is arranged so as to contact the surfaces of both the discharge electrodes 404A and 404B and which connects both the discharge electrodes 404A and 404B together, and a portion which is arranged in the gap GP being the opposing region of both the discharge electrodes 404A and 404B. As with the first discharge-inducing portion 408A, the second discharge-inducing portion 408B having such portions sandwiches, together with the ceramic layer 402 where the first and second discharge electrodes 404A and 404B are arranged, the first and second discharge electrodes 404A and 404B in the lamination direction D3.

That is, in the opposing regions 416A and 416B, the first and second discharge electrodes 404A and 404B are sandwiched between the ceramic layer 402 where both the discharge electrodes 404A and 404B are arranged and the first and second discharge-inducing portion 408A and 408B in the lamination direction D3.

In contrast, between the first and second discharge-inducing portions 408A and 408B, as shown in FIGS. 18 and 20, the hollow portion 407 of the body 403 is formed so as to be adjacent to and in contact with the discharge-inducing portions 408A and 408B in the gap GP. That is, the hollow portion 407 is arranged approximately in the center of the gap GP in the longitudinal direction D1, and approximately in the center of the gap GP, as shown in FIG. 19(a), an air gap is provided between the first and second discharge electrodes 404A and 404B. When viewed in the short direction D2, the hollow portion 407 is, as shown in FIG. 20, formed approximately in the shape of a dome, and is formed such that both edges in the longitudinal direction D1 are overlapped on the first and second discharge-inducing portions 408A and 408B.

The above-described arrangement of such discharge-inducing portions 408A and 408B and hollow portion 407 induces the occurrence of discharge along boundary portions 418A and 418B between the hollow portion 407 and each of the discharge-inducing portions 408A and 408B. The surfaces of the boundary portions 418A and 418B where the discharge occurs are formed in a direction approximately perpendicular to a surface direction (the longitudinal direction D1 and the short direction D2) in which the ceramic layer 402 spreads, and the surface direction of the ceramic layer 402 where the discharge electrodes 404A and 404B are arranged is different from the surface direction of the boundary portions 418A and 418B between the hollow portion 407 and the discharge-inducing portions 408A and 408B. The surface direction of the boundary portions 418A and 418B has only to intersect with the surface direction in which the ceramic layer 402 spreads, and it is not necessarily required to be perpendicular thereto.

As the materials of constituent elements such as the discharge electrodes 404A and 404B, the external electrodes 406A and 406B, the ceramic layer 402 and the discharge-inducing portions 408A and 408B, the same materials as in the first embodiment can be used.

Figure 21:
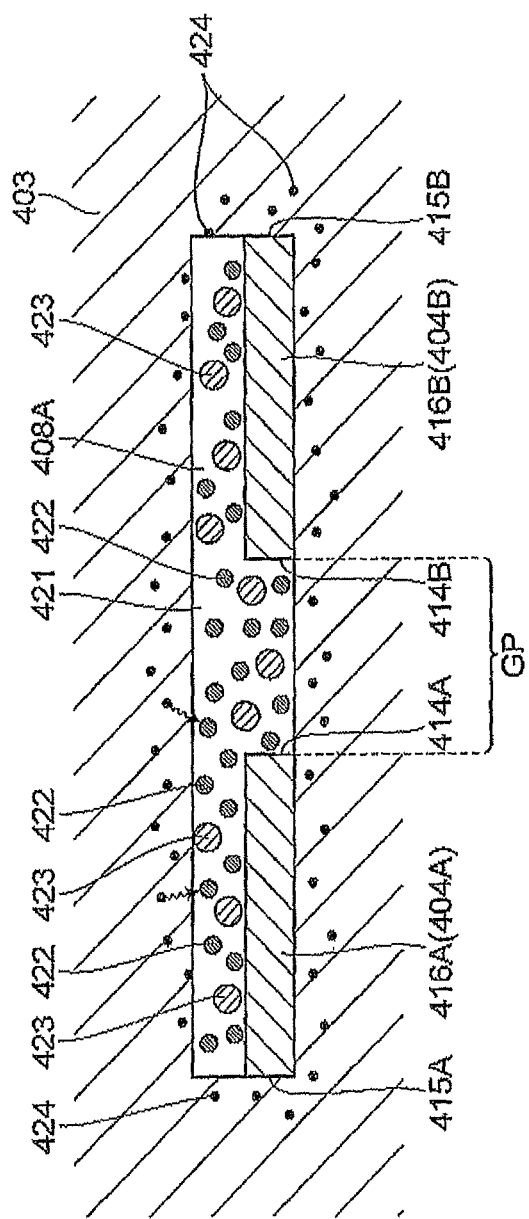
FIG. 21 is a schematic cross-sectional view illustrating the material structure of a discharge-inducing portion of the electrostatic protection component shown in FIG. 16.

FIG. 21 is a schematic diagram for illustrating the material configuration of the discharge-inducing portion 408A. The configuration when preferred materials are used will be described with reference to FIG. 21. FIG. 21 is a schematic diagram for illustrating the configuration; the sizes and the numbers of particles are deformed in the figure. In addition, the same applies to the discharge-inducing portion 408B.

The discharge-inducing portion 408A has an oxide of Mg, Cu, Zn, Si or Sr or the like as the main component, and in a ceramic insulator 421 containing glass, particles 422 of a tin oxide ($SnO_2$) and metallic particles 423 of an Ag/Pd alloy are present in a mixed state. The mixed state refers to a state where the metallic particles 423 of the Ag/Pd alloy are not solidified in one place and the particles 422 of the tin oxide are incorporated between the metallic particles 423. The particles 422 of the tin oxide are present in a particle state where they are not sintered (some of them are present as agglomerated powder). The tin oxide functions as a semiconductor material, and by the arrangement of the tin oxide between the metallic particles 423, it is possible to cause discharge even if the size of the gap in the gap portion GP is increased as compared with the case where the metallic particles 423 are only present. An alloy ratio of the Ag/Pd alloy in the metallic particles 423 is 95/5 to 30/70. The amount of particles 422 of the tin oxide contained is preferably 5/95 to 80/20 wt % in terms of a ratio of the tin oxide/the ceramic insulator. The amount of metallic particles 423 contained is preferably 10 to 35 vol % with respect to the discharge-inducing portion 408A.

The ceramic layer 402 has an oxide of Mg, Cu, Zn, Si or Sr or the like as the main component, and in a ceramic containing glass, particles 424 of a copper oxide (CuO) are contained. The amount of particles 424 of the copper oxide contained is preferably 0.01 to 5 wt %.

The first and second discharge electrodes 404A and 404B are constituted by a conductor material having an Ag/Pd alloy as the main component. An alloy ratio of the Ag/Pd alloy in the first and second discharge electrodes 404A and 404B is 95/5 to 30/70. The alloy ratio of the Ag/Pd alloy in the first and second discharge electrodes 404A and 404B is preferably the same as an alloy ratio of the Ag/Pd alloy in the metallic particles 423.

The tin oxide has features of having significantly high sintering temperature (specifically, about 1300° C.), and having low reactivity with other elements. Therefore, the tin oxide at the temperature at the time of firing of the body 403 is left in the form of particles, and even if the metallic particles 423 are present therearound, the tin oxide does not react with the metallic particles 423. In the discharge-inducing portion 408A, by putting the particles 422 of the tin oxide and the metallic particles 423 into a mixed state, the following effect is obtained. That is, at the time of firing of the body 403, the particles 422 of the tin oxide do not react with the metallic particles 423 therearound and are left in the form of particles. By the fact that the particles 422 of the tin oxide do not react and are left as described above, the movement of the metallic particles 423 in the discharge-inducing portion 408A is restricted. Since the metallic particles 423 with restricted movement do not react with each other, it is possible to prevent short-circuiting between the discharge electrodes 404A and 404B (or to prevent the decrease in the insulation resistance) as a result of the connection of the metallic particles 423.

Moreover, insulation between the first and second discharge electrodes 404A and 404B can be ensured by the fact that the discharge-inducing portion 408A contains an insulating material such as the ceramic insulator 421.

Furthermore, in the electrostatic protection component 401, the ceramic layer 402 contains the particles 424 of the copper oxide having high reactivity whereas the discharge-inducing portions 408A and 408B contain the particles 422 of the tin oxide having high sintering temperature and having low reactivity, with the result that the following effect is obtained. That is, even if the ceramic layer 402 contains the particles 424 of the copper oxide, the diffusion of the particles 424 of the copper oxide to the discharge-inducing portions 408A and 408B is suppressed by the particles 422 of the tin oxide. In this way, since the diffusion of the particles 424 of the copper oxide is suppressed as described above, in the discharge-inducing portion 408A, it is possible to freely select the constituent materials of the portions other than the tin oxide (that is, the discharge-inducing portion 408A is composed of the tin oxide and the other materials, and the other materials can be freely selected). In this way, it is possible to cause the body 403 to contain the copper oxide while securing flexibility in selecting the constituent materials of the discharge-inducing portion 408A.

Moreover, it is possible to reduce the discharge start voltage by the fact that the discharge-inducing portion 408A contains the metallic particles 423.

The Ag/Pd alloy has features of having high melting point (specifically, about 1000° C.) and having low reactivity with the copper oxide. The ceramic layer 402 contains the particles 424 of the copper oxide having high reactivity whereas the discharge-inducing portions 408A and 408B contain, as the metallic particles 423, the Ag/Pd alloy having low reactivity with the copper oxide, with the result that the following effect is obtained. That is, even if the ceramic layer 402 contains the particles 424 of the copper oxide, in the discharge-inducing portion 408A, the reaction of the metallic particles 423 with each other caused by influences of the diffusion of the particles 424 of the copper oxide is suppressed. That is, it is possible to prevent short-circuiting between the discharge electrodes 404A and 404B (or to prevent the decrease in the insulation resistance) as a result of the connection of the metallic particles 423. In this way, it is possible to cause the body 403 to contain the copper oxide while preventing short-circuiting between the first and second discharge electrodes 404A and 404B. Pb itself has a high melting point, and the reactivity with the copper oxide is high as compared with the Ag/Pb alloy. Therefore, through the use of a compound obtained by alloying Pd with Ag, the effects become further significant.

When a metal other than Ag/Pd is used as the first and second discharge electrodes 404A and 404B, with the copper oxide contained in the body 403, the metal reacts with the copper oxide, and the following problem may occur. For example, there is a possibility that Ag/Pb is vaporized from the portion (such as the connection portion to the external electrodes 406A and 406B) exposed from the body 403 of the first and second discharge electrodes 404A and 404B and is dissipated. When the opposing portion (around the side edges 414A and 414B) of the first and second discharge electrodes 404A and 404B are lost, there is a possibility that variations in the gap length occur and thus the characteristics become unstable. Therefore, it is possible to prevent the occurrence of such a problem by the fact that the first and second discharge electrodes 404A and 404B contain the Ag/Pd alloy. It should be noted that the first and second discharge electrodes 404A and 404B may contain a metal other than the Ag/Pd.

When the discharge-inducing portion 408A contains the Ag/Pd alloy, and the discharge electrodes 404A and 404B contain the Ag/Pd alloy, by the fact that the alloy ratios of the individual Ag/Pd alloys are made equal to each other, it is possible to prevent the reaction of the Ag/Pd alloys between the discharge-inducing portion 408A and the first and second discharge electrodes 404A and 404B.

Figure 22:
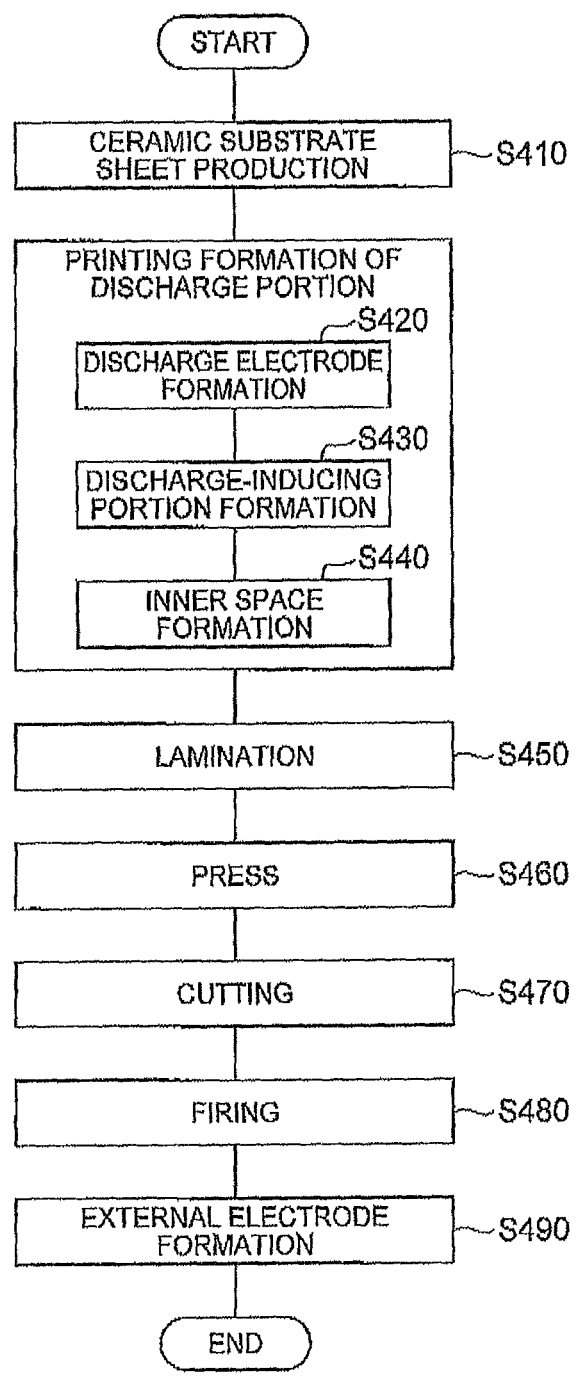
FIG. 22 is a flow diagram showing an example of the method of manufacturing the electrostatic protection shown in FIG. 16.

Next, an example of the method of manufacturing the electrostatic protection component 401 will be described with reference to FIGS. 22 and 23. However, the manufacturing method is not particularly limited, the order of individual steps may be changed, specific methods within the steps may be changed, and the electrostatic protection component 401 may be manufactured with other steps.

First, a slurry that is the material composed of the ceramic substrate 402 is prepared, and a ceramic layer sheet is produced (step S410). Specifically, a predetermined amount of dielectric powder, containing the copper oxide (CuO) and an organic vehicle containing an organic solvent and an organic binder are mixed, and thus a slurry for ceramic layer is prepared. As the dielectric powder, a dielectric material containing, as the main component, the oxide (which may be another dielectric material) of Mg, Cu, Zn, Si or Sr can be used. Thereafter, by a doctor blade method or the like, the slurry is applied onto a PET film, and thus a green sheet having a thickness of about 20 μm is formed.

Then, the discharge portion is formed by printing in a predetermined position of the ceramic layer sheet. First, as shown in FIG. 23(a), a conductive pattern of the discharge electrodes 404A and 404B before firing is formed by application of a conductive past onto the ceramic layer 402 sheet by screen printing or the like (step S420). Although, in the discharge electrodes 404A and 404B shown in FIG. 23, a variation is disclosed in which portions on the side of the base ends 413A and 413B are displaced to an approximate central portion in the short direction D2, approximately the same function as the discharge electrodes 404A and 404B shown in FIG. 18 is achieved. That is, between the first and second discharge electrodes 404A and 404B, in the gap portion GP, discharge occurs only between the side edges.

Then, a discharge-inducing material slurry is prepared, and the slurry is applied from above the discharge electrodes 404A and 404B such that, as shown in FIG. 23(b), the slurry connects the opposing regions 416A and 416B of the discharge electrodes 404A and 404B in two places, and thus portions corresponding to the discharge-inducing portions 408A and 408B before firing are formed (S430). Specifically, the discharge-inducing material slurry is prepared by mixing the powders of the tin oxide, the insulator and the conductor weighed to predetermined amounts and the organic vehicle containing the organic solvent and the organic binder. For example, as the tin oxide, $SnO_2$ which is an industrial material can be used. As the insulator, the dielectric powder can be used. As the dielectric powder, a dielectric material containing an oxide of Mg, Cu, Zn, Si or Sr (another dielectric material may be used) as the main component can be used. As the conductor powder, Ag/Pd powder can be used (Ag, Pd, Au, Pt, a mixture or a compound thereof or the like can also be used). The individual powders are fully mixed such that the particles of the tin oxide and the metallic particles of the Ag/Pd alloy go into a mixed state.

Subsequently, as shown in FIG. 23(c), an air gap material lacquer for forming the hollow portion 407 is applied such that both ends thereof are overlapped on the discharge-inducing portions 408A and 408B. As the air gap material lacquer, an organic lacquer containing an organic solvent and an organic binder can be used. In this way, a portion serving as the hollow portion 407 after firing is formed (step S440).

Then, the ceramic layer sheet on which the discharge portion is printed and the ceramic layer sheets of the other layers are sequentially laminated (step S450) and are pressed (step S460), and the laminated member is cut into pieces, each having the size of the electrostatic protection component (step S470). By the lamination, the pressing and the like described above, the discharge electrodes 404A and 404B are sandwiched between the ceramic layer 402 where the discharge electrodes 404A and 404B are arranged and the discharge-inducing portion 408A and 408B.

Then, each body is subjected to firing under predetermined conditions (for example, for two hours at a temperature of 850 to 950° C. in the atmosphere) (step S480). Here, the air gap material lacquer is dissipated within the body 403, and thus the hollow portion 407 is formed in the discharge portion. Thereafter, conductive paste for the external electrode is applied to the body 403 and is subjected to thermal processing under predetermined conditions (for example, for two hours at a temperature of 600 to 800° C. in the atmosphere), and thus the external electrode is baked (step S490). Thereafter, the surface of the external electrode is plated. As the plating, electrolytic plating is preferable. For example, Ni/Sn, Cu/Ni/

Sn, Ni/Pd/Au, Ni/Pd/Ag, Ni/Ag or the like can be used. In this way, the electrostatic protection component 401 is completed.

As described above, in the electrostatic protection component 401, the first and second discharge electrodes 404A and 404B are sandwiched in the lamination direction D3 between the ceramic layer 402 where the discharge electrodes 404A and 404B are arranged and the discharge-inducing portion 408A and 408B. In this way, by the fact that both the discharge electrodes 404A and 404B are fixed in the lamination direction D3 by the actual ceramic layer 402 and the discharge-inducing portions 408A and 408B, the possibility is suppressed that the discharge electrodes go into a free state when the air gap material lacquer for forming the hollow portion is dissipated and the hollow portion is formed. Consequently, with the electrostatic protection component 401, it is possible to suppress the possibility that the discharge electrodes 404A and 404B are separated from the body 403 (the ceramic layer 402).

Moreover, in the electrostatic protection component 401, the ceramic layer 402 where the discharge electrodes 404A and 404B are arranged and the discharge-inducing portions 408A and 408B sandwich the discharge electrodes 404A and 404B in the lamination direction D3 in the opposing regions 416A and 416B in which the first and second discharge electrodes 404A and 404B face each other. Therefore, most of the opposing portions of the discharge electrodes 404A and 404B on which a separating force is likely to be exerted when discharge occurs can be fixed in the lamination direction, and thus it is possible to suppress the separation of the discharge electrodes 404A and 404B resulting from discharge.

Furthermore, in the electrostatic protection component 401, the discharge-inducing portions 408A and 408B cover the tips of the first and second discharge electrodes 404A and 404B, respectively. Therefore, since the tips 412A and 412B of the discharge electrodes 404A and 404B that are likely to become a starting point in the separation from the body 403 can be held in the lamination direction, it is possible to reliably suppress the separation of the discharge electrodes 404A and 404B from the body 403.

In the electrostatic protection component 401, the hollow portion 407 is adjacent to and in contact with the discharge-inducing portions 408A and 408B in the gap GP. Therefore, breakdown by discharge can be induced in the longitudinal direction D1 (the horizontal direction), and thus it is possible to suppress breakdown by discharge in the thickness direction (the lamination direction D3 of the ceramic layer 402) of the discharge-inducing portions 408A and 408B. Since the breakdown in the thickness direction of the discharge-inducing portions 408A and 408B can be suppressed in this way, with the electrostatic protection component 401, the limitation of the number of times of discharge and variations in the discharge start voltage are also suppressed, with the result that it is possible to enhance the durability of the electrostatic protection component 401.

In the electrostatic protection component 401, the first discharge electrode 404A has the first side edge 414A which extends in the longitudinal direction D1 and which extends along the longitudinal direction D1, the second discharge electrode 404B has the second side edge 414B which extends in the longitudinal direction D1 and which extends along the longitudinal direction D1 and the first and second discharge electrodes 404A and 404B are arranged such that the first and second side edges 414A and 414B face each other in the short direction D2. Therefore, it is possible to increase the length over which breakdown by discharge in the horizontal direction extends, and thus it is possible to further enhance the durability of the electrostatic protection component 401.

Furthermore, in the electrostatic protection component 401, the hollow portion 407 is overlapped on the discharge-inducing portions 408A and 408B (refer to FIG. 20). In this case, there can be increased the size of a space region (the thickness in the lamination direction) in the vicinity of the discharge portions 418A and 418B in which discharge is more likely to occur in the discharge-inducing portions 408A and 408B, and thus it is possible to reduce the clamp voltage of the electrostatic protection component 401.

Moreover, in the electrostatic protection component 401, the hollow portion 407 is arranged approximately in the center of the gap GP such that the hollow portion 407 is overlapped on both the first and second discharge-inducing portions 408A and 408B. As described above, by the fact that the hollow portion 407 is formed more inside, it is possible to suppress the infiltration of a plating solution and water from the outside. Consequently, it is possible to enhance the durability and the reliability of the electrostatic protection component 401.

Figure 24:
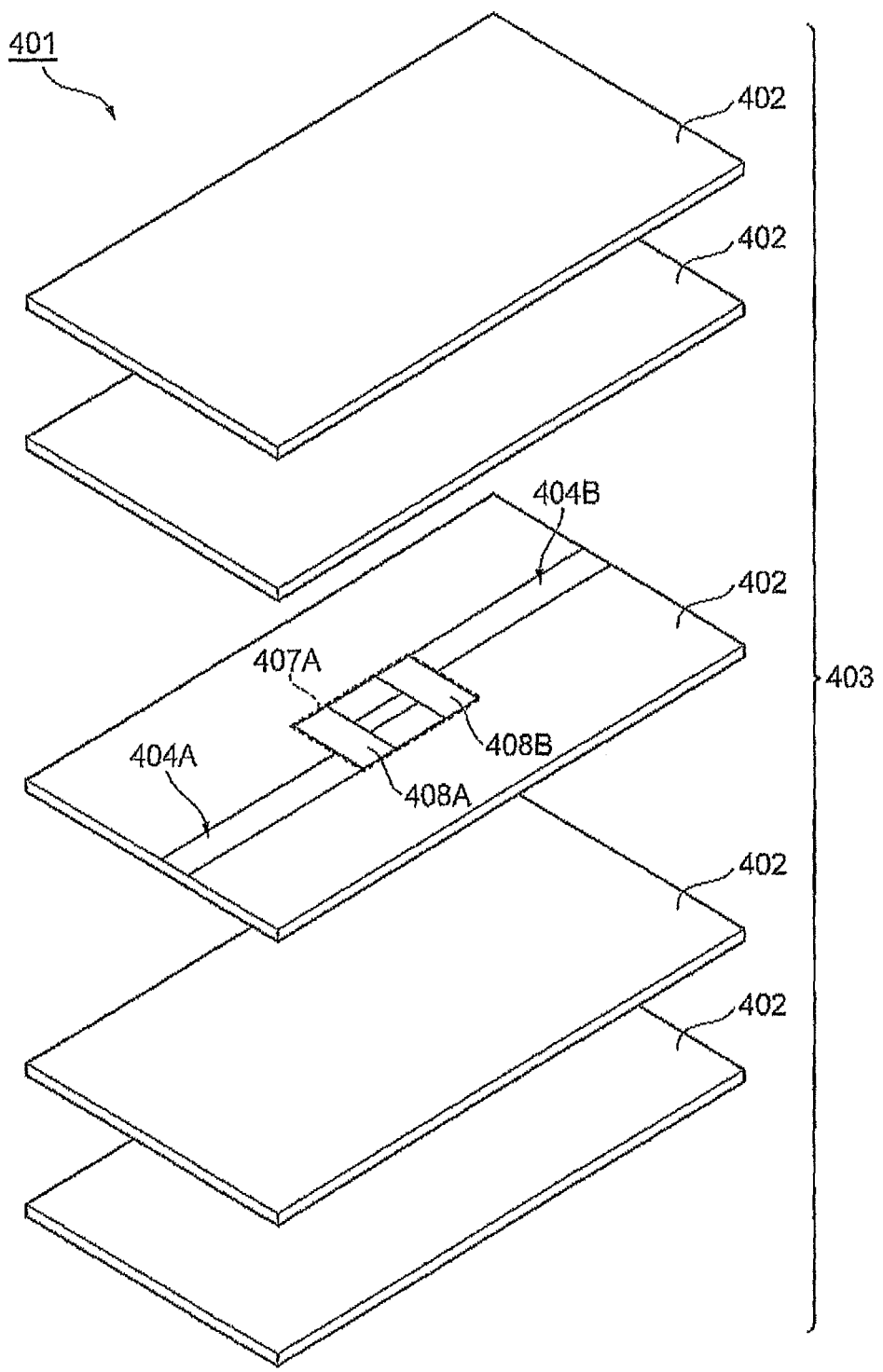
FIG. 24 is a developed perspective view of a body of a variation of the electrostatic protection component according to the second embodiment.

Meanwhile, although, in the embodiment described above, the lacquer for forming the hollow portion 407 is formed so as to cover a part of the discharge-inducing portions 408A and 408B, as shown in FIG. 24, the lacquer is applied such that the hollow portion 407 covers the entire discharge-inducing portions 408A and 408B, and thus the electrostatic protection component 401 may be formed. In this case, a larger air gap portion can be formed, and thus it is possible to further suppress the breakdown by discharge.

(Third Embodiment)

An electrostatic protection component 401a according to a third embodiment will now be described with reference to FIGS. 25 and 26. As in the second embodiment, the electrostatic protection component 401a according to the present embodiment includes the body 403, the discharge electrodes 404A and 404B and the external electrodes 406A and 406B; the electrostatic protection component 401a differs from that of the second embodiment in that the electrostatic protection component 401a includes one discharge-inducing portion 438 and a hollow portion 437 formed on the discharge-inducing portion 438.

The discharge-inducing portion 438 is approximately rectangular as viewed in the lamination direction D3, and has the function of connecting the first and second discharge electrodes 404A and 404B to facilitate the occurrence of discharge between the first and second discharge electrodes 404A and 404B. The discharge-inducing portion 438 is formed so as to contact an approximate central portion of the opposing region 416A of the first discharge electrode 404A and an approximate central portion of the opposing region 416B of the second discharge electrode 404B. Specifically, the discharge-inducing portion 438 has a portion which is arranged so as to contact the surfaces of both the discharge electrodes 404A and 404B and which connects both the discharge electrodes 404A and 404B together, and a portion which is arranged in the gap GP being the opposing region of both the discharge electrodes 404A and 404B As shown in FIG. 26, the discharge-inducing portion 438 having such portions sandwich, together with the ceramic layer 402 where the first and second discharge electrodes 404A and 404B are arranged, the first and second discharge electrodes 404A and 404B in the lamination direction D3. That is, in the opposing regions 416A and 416B, the first and second discharge electrodes 404A and 404B are sandwiched in the lamination direction D3 between the ceramic layer 402 where both the discharge electrodes 404A and 404B are arranged and the discharge-inducing portion 438.

Figure 25:
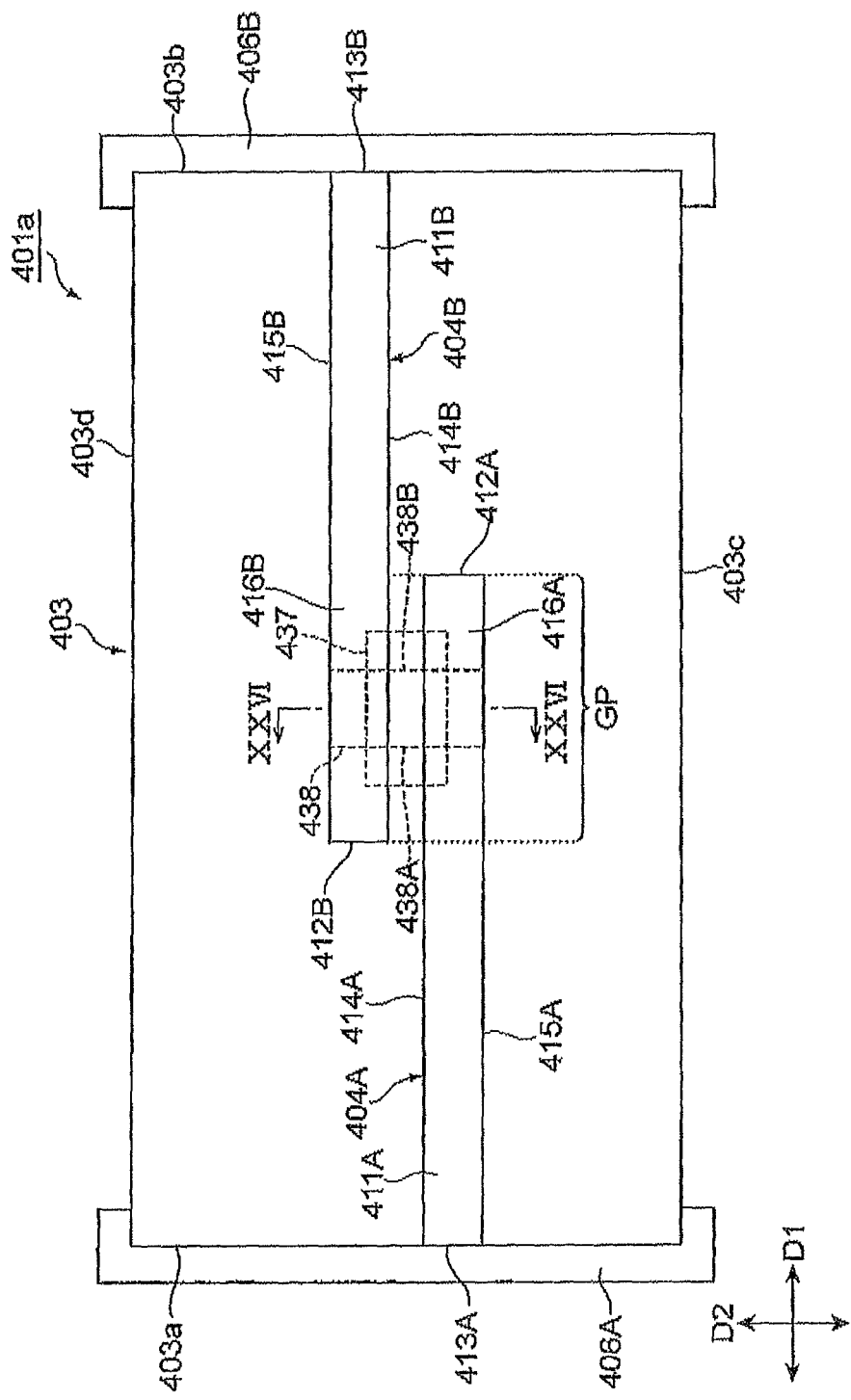
FIG. 25 is a plan view of a discharge portion of an electrostatic protection component according to a third embodiment.
Figure 26:
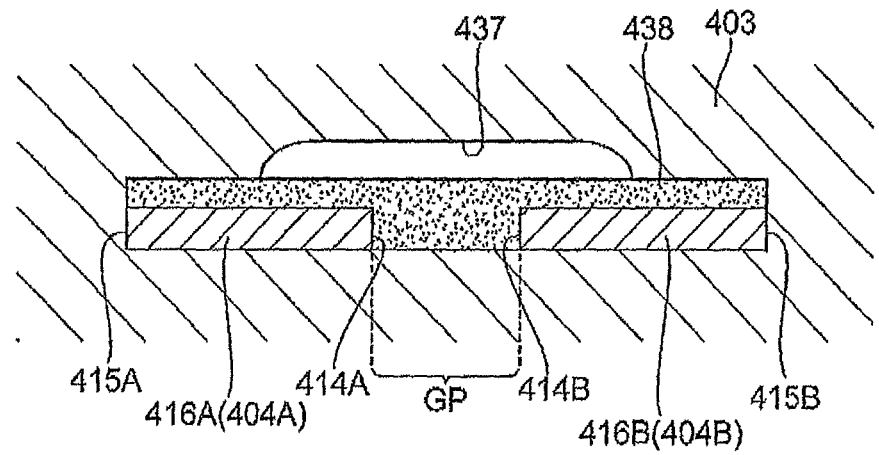
FIG. 26 is a transverse cross-sectional view showing a cross-sectional configuration taken along line XXVI-XXVI shown in FIG. 25.
Figure 27:
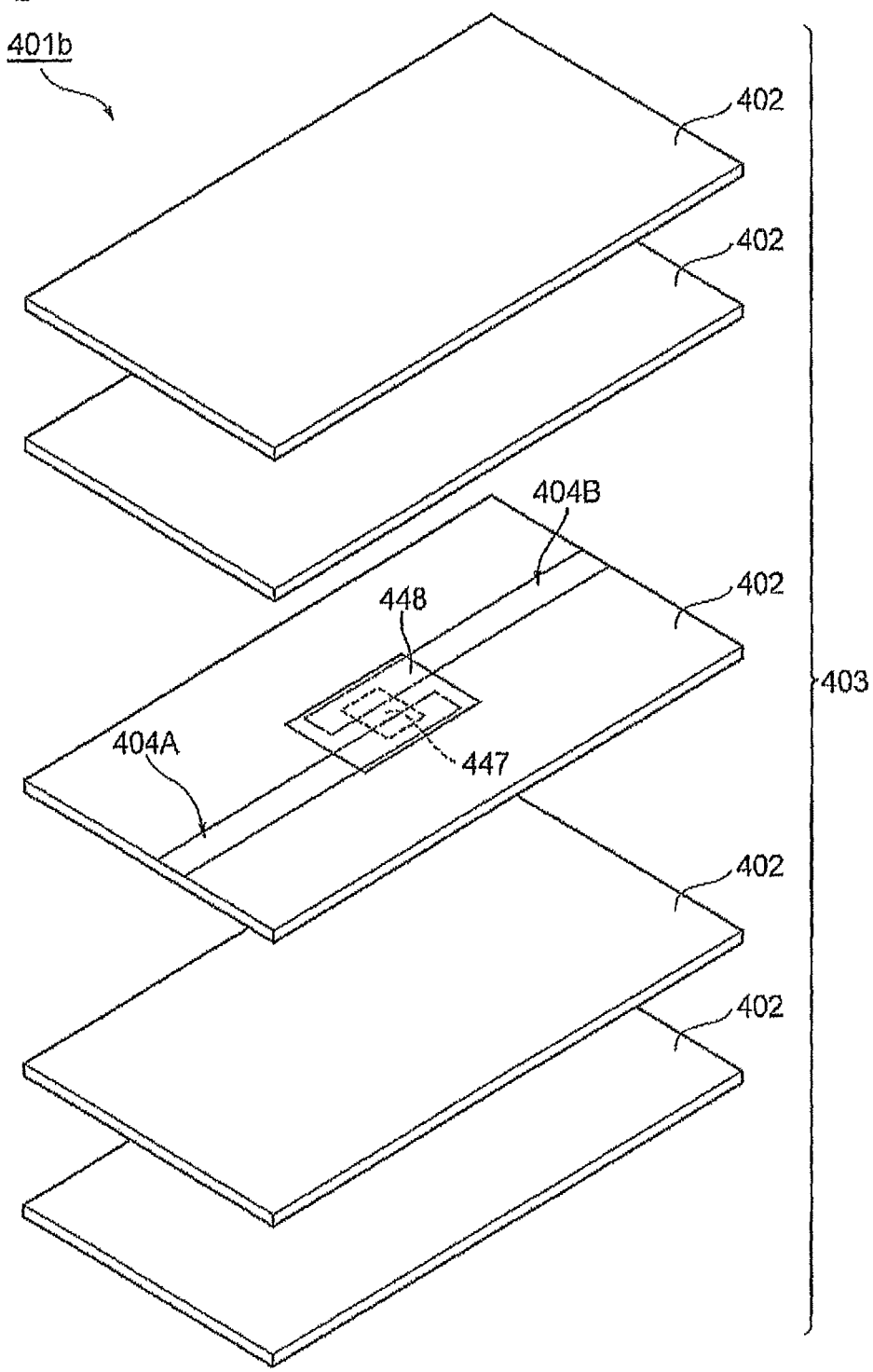
FIG. 27 is a developed perspective view of a body of an electrostatic protection component according to a fourth embodiment.
Figure 28:
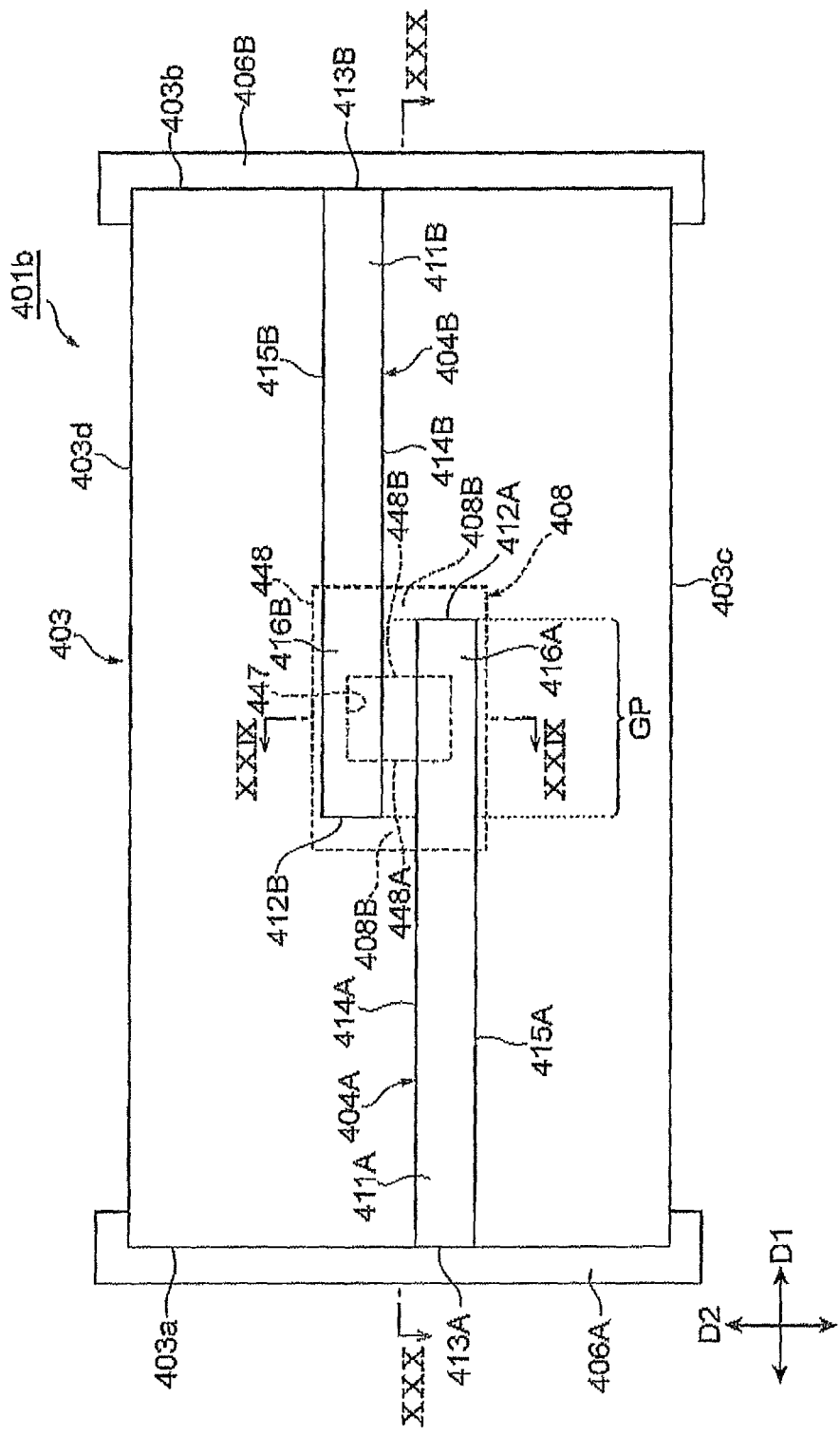
FIG. 28 is a plan view of a discharge portion of the electrostatic protection component shown in FIG. 27 when viewed in the direction of the lamination.

Approximately in the central portion of the discharge-inducing portion 438 in the short direction D2, as shown in FIG. 25, the hollow portion 437 of the body 403 is formed so as to be adjacent to and in contact with the discharge-inducing portion 438 in the gap GP. That is, the hollow portion 437 is arranged approximately in the center of the gap GP in the longitudinal direction D1. When viewed in the short direction D2, the hollow portion 407 is formed approximately in the shape of a dome, and the hollow portion 407 is formed so as to be overlapped on the entire discharge-inducing portion 438. The above-described arrangement of the discharge-inducing portion 438 and the hollow portion 437 induces the occurrence of discharge along boundary portions 438A and 438B between the hollow portion 437 and the discharge-inducing portion 438.

As described above, in the electrostatic protection component 401a according to the third embodiment, the ceramic layer 402 where the discharge electrodes 404A and 404B are arranged and the discharge-inducing portion 438 sandwich the discharge electrodes 404A and 404B in the lamination direction D3. In this way, by the fact that both the discharge electrodes 404A and 404B are fixed in the lamination direction D3 by the actual ceramic layer 402 and the discharge-inducing portion 438, the possibility is suppressed that the discharge electrodes go into a free state when the lacquer for forming the hollow portion is dissipated and the hollow portion is formed. Consequently, with the electrostatic protection component 401a, it is possible to suppress the possibility that the discharge electrodes 404A and 404B are separated from the body 403 (the ceramic layer 402).

In the electrostatic protection component 401a, the hollow portion 437 is adjacent to and in contact with the discharge-inducing portion 438 in the gap GP. Therefore, breakdown by discharge can be induced in the longitudinal direction D1 (the horizontal direction), and thus it is possible to suppress breakdown by discharge in the thickness direction (the lamination direction D3 of the ceramic layer 402) of the discharge-inducing portion 438. Since the breakdown in the thickness direction of the discharge-inducing portion 438 is suppressed in this way, with the electrostatic protection component 401a, the limitation of the number of times of discharge and variations in the discharge start voltage are also suppressed, with the result that it is possible to enhance the durability of the electrostatic protection component 401a.

In the electrostatic protection component 401a, the hollow portion 437 is arranged so as to cover both edges of the discharge-inducing portion 438 in the longitudinal direction D1 and so as to be overlapped on the approximate central portion of the discharge-inducing portion 438 in the short direction D2. In this case, there can be increased the size of a space region (the thickness in the lamination direction) in the vicinity of the discharge portions 438A and 438B in which discharge is more likely to occur in the discharge-inducing portion 438. Therefore, with the electrostatic protection component 401a according to the present embodiment, it is possible to reduce the clamp voltage of the electrostatic protection component 401a.

In the electrostatic protection component 401a, the hollow portion 437 is arranged in the gap GP so as to cover both the edges of the discharge-inducing portion 438 in the longitudinal direction D1. Therefore, since it is not necessary to provide, in the central portion of the gap GP, a hollow portion that is not overlapped on the discharge-inducing portion 438, it is possible to make the hollow portion 437 compact. In this configuration, it is possible to reduce the opposing length of the discharge electrodes 404A and 404B, and thus it is possible to reduce the capacitance generated between the discharge electrodes 404A and 404B.

(Fourth Embodiment)

Next, an electrostatic protection component 401b according to a fourth embodiment will be described with reference to FIGS. 27 to 30. As in the second embodiment, the electrostatic protection component 401b according to the present embodiment includes the body 403, the discharge electrodes 404A and 404B and the external electrodes 406A and 406B, but the electrostatic protection component 401b differs from that of the second embodiment in that the electrostatic protection component 401b includes a discharge-inducing portion 448 and a hollow portion 447 and that the hollow portion 447 is formed within the discharge-inducing portion 448 (refer to FIG. 30).

The discharge-inducing portion 448 is approximately rectangular as viewed in the lamination direction D3, and has the function of connecting the first and second discharge electrodes 404A and 404B to thereby facilitate the occurrence of discharge between the first and second discharge electrodes 404A and 404B. The discharge-inducing portion 448 is formed so as to contact the opposing region 416A of the first discharge electrode 404A and the opposing region 416B of the second discharge electrode 404B. Specifically, the discharge-inducing portion 448 has two portions, that is, a portion 448a which is arranged so as to contact the surfaces of both the discharge electrodes 404A and 404B and which connects both the discharge electrodes 404A and 404B together, and a portion arranged in the gap GP, which is the opposing region of both the discharge electrodes 404A and 404B.

Figure 29:
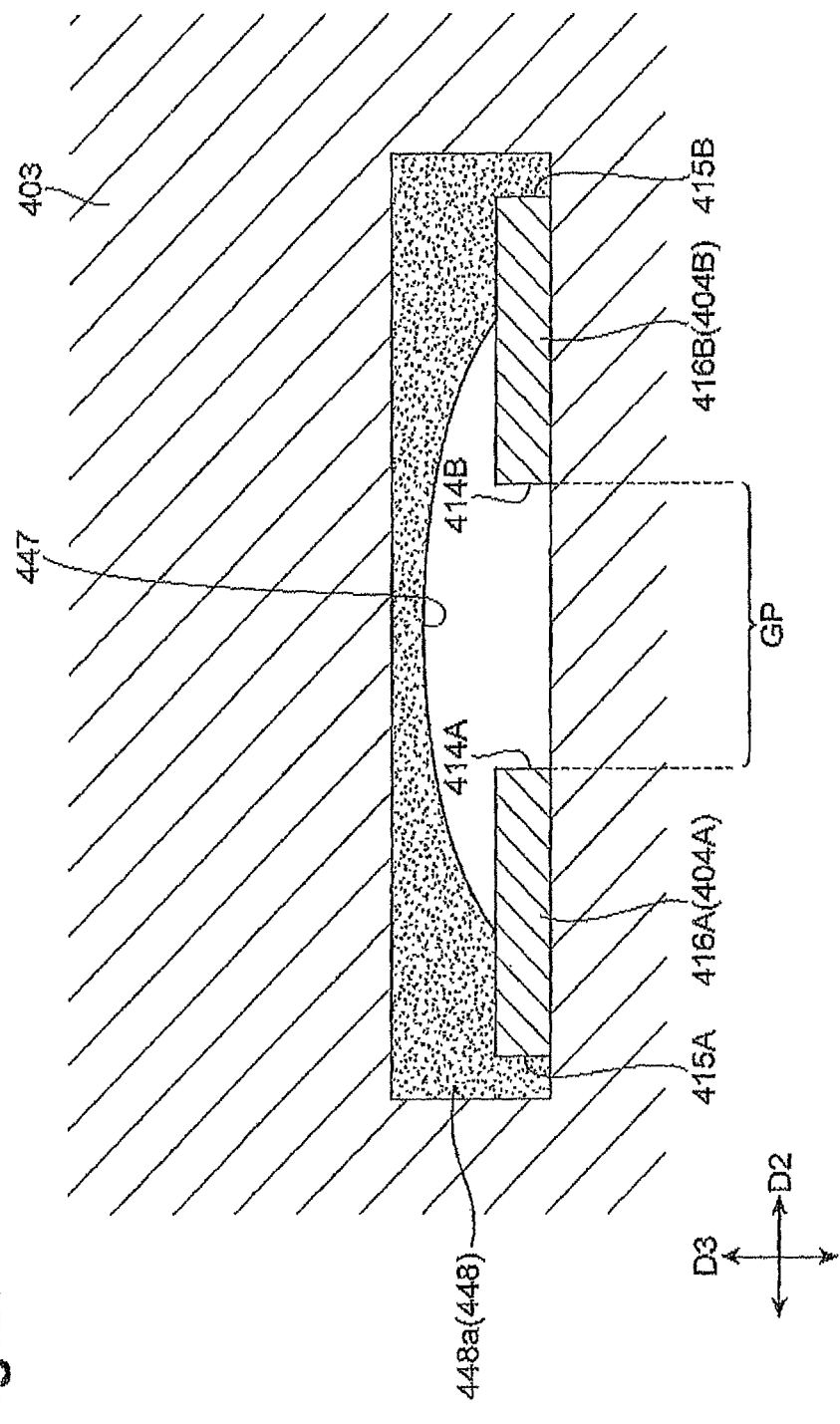
FIG. 29 is a transverse cross-sectional view showing a cross-sectional configuration taken along line XXIX-XXIX shown in FIG. 28.

As shown in FIG. 29, the discharge-inducing portion 448 having such portions is configured to sandwich, together with the ceramic layer 402 where the first and second discharge electrodes 404A and 404B are arranged, the first and second discharge electrodes 404A and 404B in the lamination direction D3. That is, in the opposing regions 416A and 416B, the first and second discharge electrodes 404A and 404B are sandwiched in the lamination direction D3 between the ceramic layer 402 where both the discharge electrodes 404A and 404B are arranged and the discharge-inducing portion 448.

Figure 30:
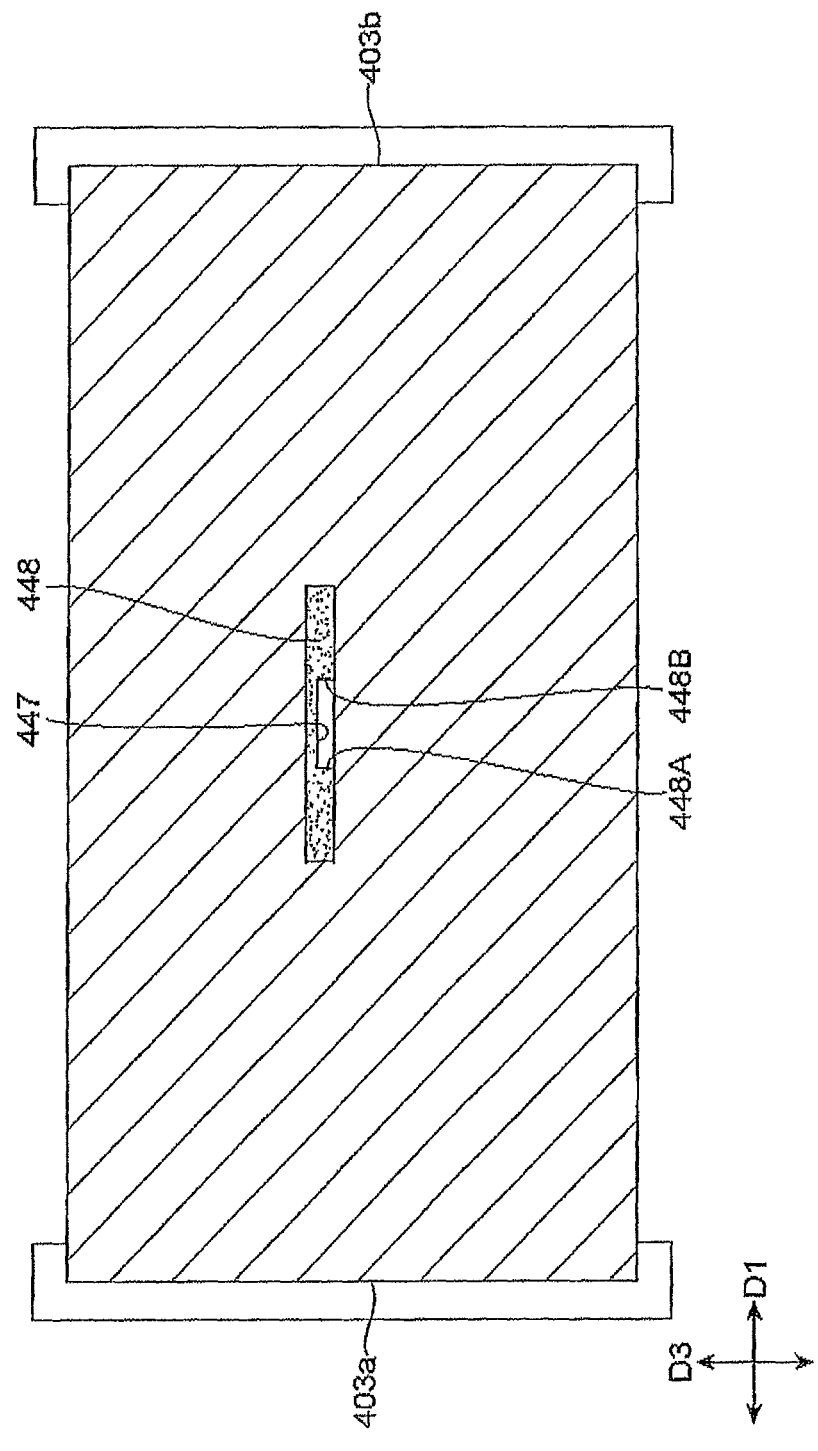
FIG. 30 is a vertical cross-sectional view showing a cross-sectional configuration taken along line XXX-XXX shown in FIG. 28.

On the inner side of the approximate central portion of the discharge-inducing portion 448, as shown in FIGS. 29 and 30, the hollow portion 447 of the body 403 is formed so as to be adjacent to and in contact with the discharge-inducing portion 448 in the gap GP. That is, the hollow portion 447 is arranged approximately in the center of the gap GP in the longitudinal direction D1. The above-described arrangement of the discharge-inducing portion 448 and the hollow portion 447 induces the occurrence of discharge along boundary portions 448A and 448B between the hollow portion 447 and the discharge-inducing portion 448. In manufacturing the electrostatic protection component 401b described above, for example, the electrostatic protection component 401b can be manufactured by reversing the order of the discharge-inducing portion formation step S430 and the inner space formation step S440 in the manufacturing method (refer to FIG. 22) according to the second embodiment.

As described above, in the electrostatic protection component 401b according to the fourth embodiment, the ceramic layer 402 where the discharge electrodes 404A and 404B are arranged and the discharge-inducing portion 448 sandwich the first and second discharge electrodes 404A and 404B in the lamination direction D3. In this way, by the fact that both the discharge electrodes 404A and 404B are fixed in the lamination direction D3 by the actual ceramic layer 402 and the discharge-inducing portion 448, the possibility is suppressed that the discharge electrodes go into a free state when the lacquer for forming the hollow portion is dissipated and the hollow portion is formed. Consequently, with the electrostatic protection component 401b, it is possible to suppress the possibility that the discharge electrodes 404A and 404B are separated from the body 403 (the ceramic layer 402).

In the electrostatic protection component 401b, the hollow portion 447 is adjacent to and in contact with the discharge-inducing portion 448 in the gap GP. Therefore, breakdown by discharge can be induced in the longitudinal direction D1 (the horizontal direction), and thus it is possible to suppress breakdown by discharge in the thickness direction (the lamination direction D3 of the ceramic layer 402) of the discharge-inducing portion 448. Since the breakdown in the thickness direction of the discharge-inducing portion 448 can be suppressed in this way, with the electrostatic protection component 401b, the limitation of the number of times of discharge and variations in the discharge start voltage are suppressed, with the result that it is possible to enhance the durability of the electrostatic protection component 401b.

Although the second to fourth embodiments of the present invention have been described above in detail, the embodiments described above explain embodiments of the electrostatic protection component according to the present invention, and the electrostatic protection component according to the present invention is not limited to that described in the present embodiment. The electrostatic protection component according to the present invention may be an electrostatic protection component that is obtained by varying the electrostatic protection component according to the embodiment or applying it to another one without departing from the spirit of each of the claims.

For example, the configuration of the first and second discharge electrodes 404A and 404B is not limited to the configuration shown in FIG. 18 and the like; the length, the width and the size of the gap may be modified as necessary. For example, the configuration shown in FIG. 31 may be adopted.

Figure 31:
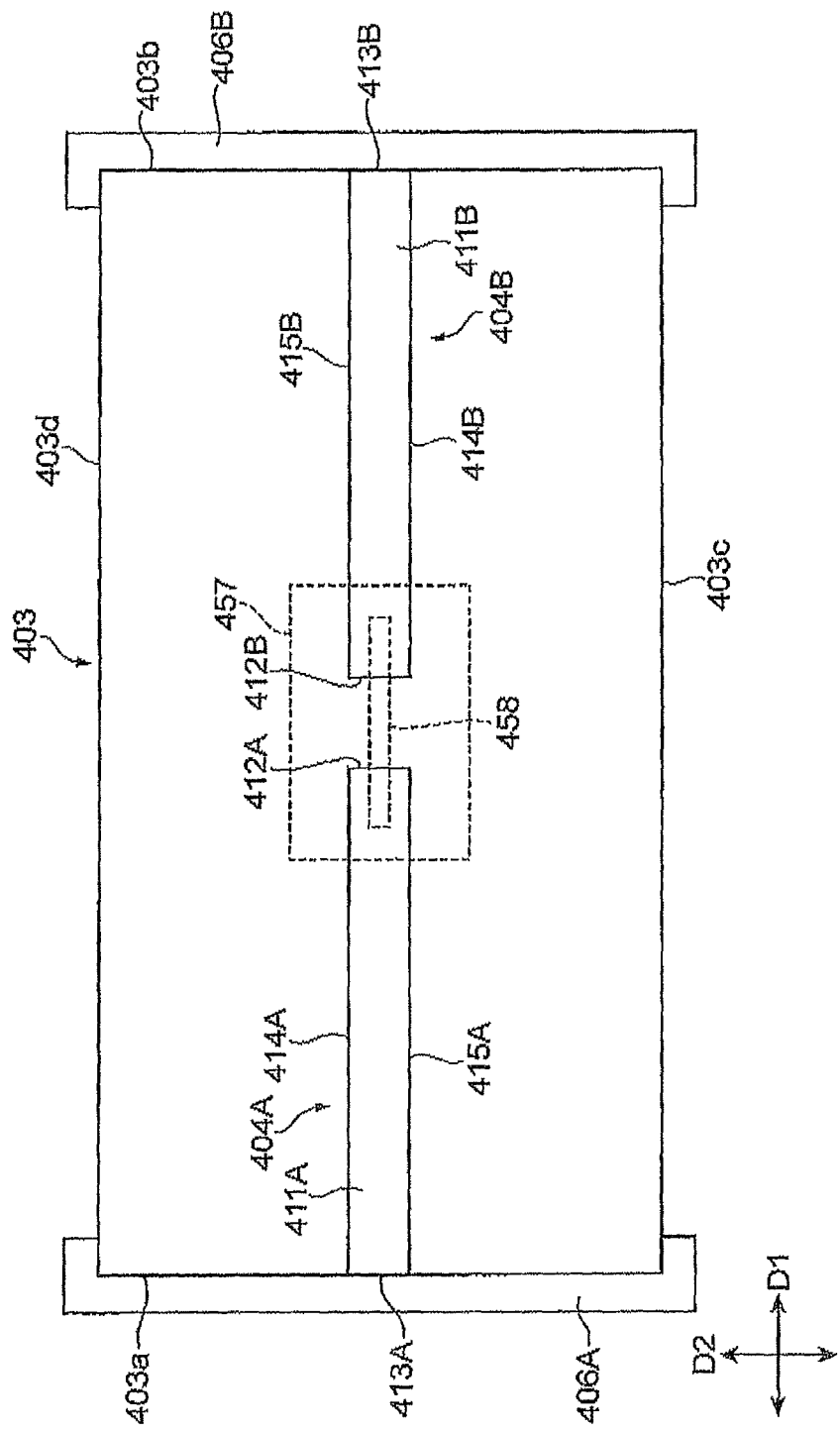
FIG. 31 is a plan view of a discharge portion of an electrostatic protection component according to a variation when viewed in the direction of the lamination.

In the configuration shown in FIG. 31, the first discharge electrode 404A extends from the end surface 403a of the body 403 in the longitudinal direction D1, the second discharge electrode 404B extends from the end surface 403b of the body 403 in the longitudinal direction D1 and the tip 412A of the discharge electrode 404A and the tip 412B of the discharge electrode 404B face each other to form the gap portion GP. An approximate central portion of the first and second discharge electrodes 404A and 404B in the short direction D2 is connected by a discharge-inducing portion 458, and a hollow portion 457 is formed so as to cover the discharge-inducing portion 458. Even in this case, the first and second discharge electrodes 404A and 404B are sandwiched in the lamination direction D3 between the ceramic layer 402 where both the discharge electrodes 404A and 404B are arranged and the discharge-inducing portion 458, and are fixed in the lamination direction.

Although, in the embodiment described above, the electrostatic protection component including only the discharge portion having the electrostatic protection function has been illustrated, as in the first embodiment, the present invention may be applied to an electrostatic protection component to which other functions such as a coil portion and a capacitor portion are integrally added. Here, the material of the ceramic layer 402 may be changed to the optimum material for each layer of the discharge portion, the coil portion and the capacitor portion.

(Fifth Embodiment)

Figure 32:
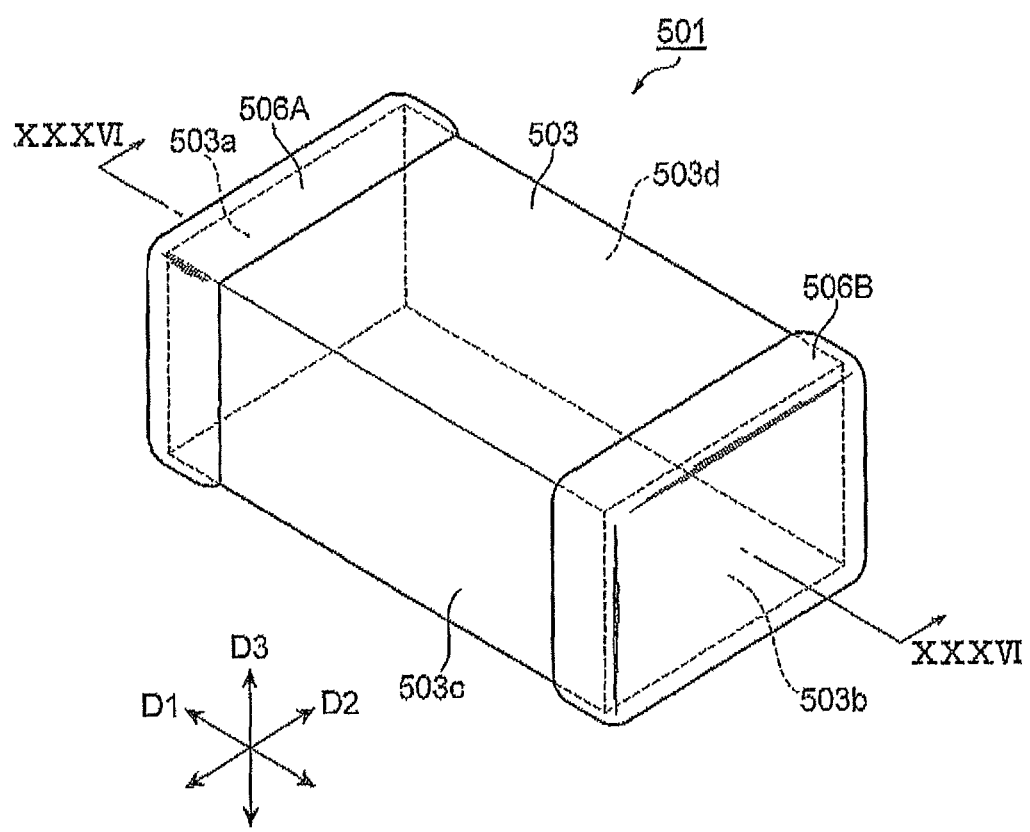
FIG. 32 is a perspective view of an electrostatic protection component according to a fifth embodiment.
Figure 33:
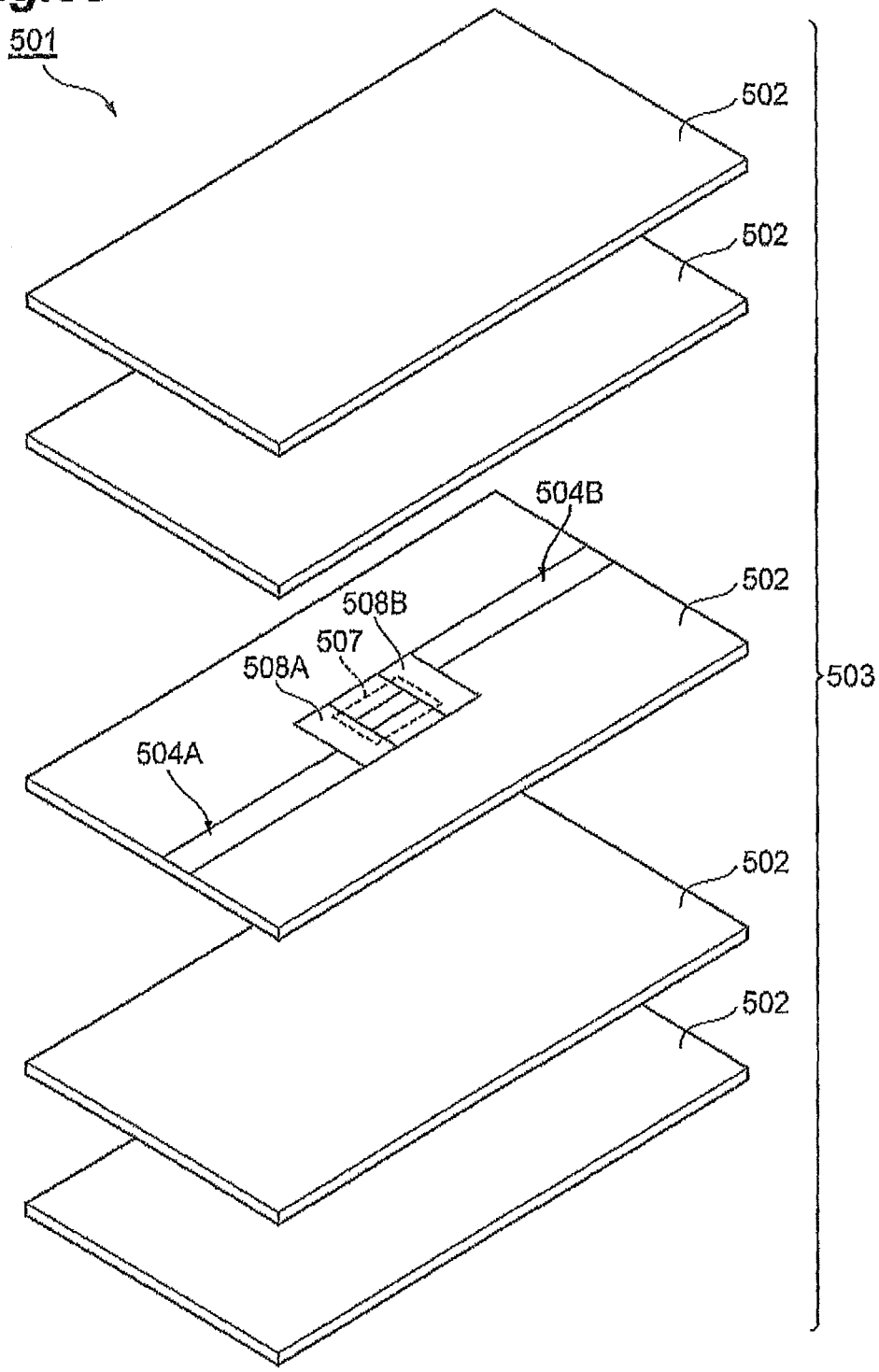
FIG. 33 is a developed perspective view of a body of the electrostatic protection component according to the fifth embodiment.
Figure 34:
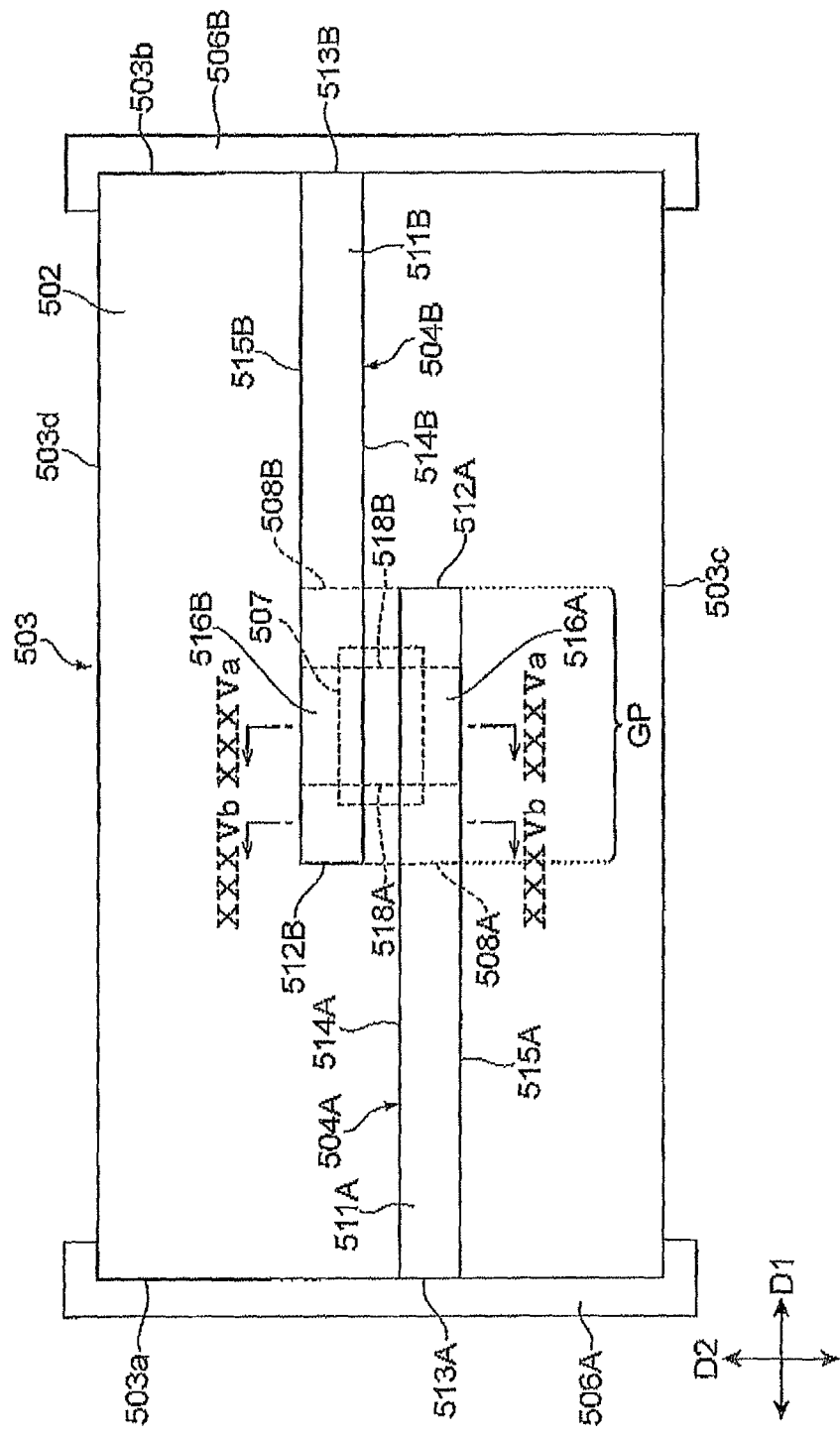
FIG. 34 is a plan view of a discharge portion of the electrostatic protection component shown in FIG. 32 when viewed in the direction of the lamination.

FIG. 32 is a perspective view of an electrostatic protection component according to a fifth embodiment. FIG. 33 is a developed perspective view of a body of the electrostatic protection component according to the fifth embodiment. FIG. 34 is a plan view of a discharge portion of the electrostatic protection component when viewed in a direction of lamination. In FIG. 34, ceramic layers 502 on first and second discharge electrodes 504A and 504B and the like are omitted. FIG. 35(a) is a diagram for illustrating a cross-sectional configuration taken along line XXXVa-XXXVa shown in FIG. 34; FIG. 35(b) is a diagram for illustrating a cross-sectional configuration taken along line XXXVb-XXXVb shown in FIG. 34. FIG. 36 is a diagram for illustrating a cross-sectional configuration taken along line XXXVI-XXXVI shown in FIG. 32. In the following description, a direction in which a body 503 extends is referred to as the longitudinal direction D1, a direction perpendicular to the longitudinal direction D1 in a direction of a flat surface of the ceramic layers 502 is referred to as the short direction D2 and a direction in which the ceramic layers 502 are laminated is referred to as the lamination direction D3.

The configuration of an electrostatic protection component 501 according to the present embodiment will first be described with reference to FIGS. 32 to 36. The electrostatic protection component 501 is mounted on a circuit substrate of an electronic device, and is an electronic component that protects the electronic device from ESD. The electrostatic protection component 501 includes the body 503 which is configured by laminating a plurality of ceramic layers 502 and which is formed approximately in the shape of a rectangular parallelepiped; first and second discharge electrodes 504A and 504B that are arranged within the body 503 separately from each other on the same ceramic layer 502; first and second external electrodes 506A and 506B that are arranged on both end surfaces 503a and 503b of the body 503 facing each other; and first and second discharge-inducing portions 508A and 508B that connect the first and second discharge electrodes 504A and 504B.

The first discharge electrode 504A is electrically connected to the first external electrode 506A; the second discharge electrode 504B is electrically connected to the second external electrode 506B. The body 503 includes a hollow portion 507 that is formed on the first and second discharge-inducing portions 508A and 508B so as to cover them (refer to FIG. 36). The hollow portion 507 has the function of absorbing the thermal expansion of the ceramic layer 502 and the discharge-inducing portions 508. The arrangement of the hollow portion 507 and the discharge-inducing portions 508A and 508B will be described later. In the actual electrostatic protection component 501, the body 503 is integrally formed to the extent of not capable of being visually recognized.

As shown in FIGS. 33 and 34, the first and second discharge electrodes 504A and 504B are arranged within the body 503 separately from each other on the same ceramic layer 502. The first discharge electrode 504A has a main body portion 511A which extends from the end surface 503a of the body 503 toward the end surface 503b on the opposite side along the longitudinal direction D1 (first direction). The main body portion 511A has a tip 512A and a base end 513A in the longitudinal direction D1 and a side edge 514A and a side edge 515A extending along the longitudinal direction D1. The main body portion 511A forms a long rectangle; the tip 512A and the base end 513A form short sides, and the side edges 514A and 515A form long sides. That is, the side edges 514A and 515A are longer than the tip 512A and the base end 513A.

The main body portion 511A is arranged slightly away from the center position in the short direction D2 toward the side surface 503c of the body 503. The base end 513A is exposed from the end surface 503a of the body 503 and is connected to the external electrode 506A. The tip 512A extends to a position separate from the end surface 503b, and is arranged in a position away from the center position in the longitudinal direction D1 toward the end surface 503b. The side edge 514A is an edge portion of the body 503 on the side of the side surface 503d, and is arranged slightly away from the central portion in the short direction D2 toward the side surface 503c. The side edge 515A is an edge portion of the body 503 on the side of the side surface 503c, and is arranged in a position away from the side surface 503c. The length of the main body portion 511A may be longer or shorter than that shown in FIG. 34.

The second discharge electrode 504B is symmetric with the first discharge electrode 504A with respect to a point around the center of the body 503 when viewed in the lamination direction D3. That is, the second discharge electrode 504B has a main body portion 511B which extends from the end surface 503b of the body 503 toward the end surface 503a on the opposite side along the longitudinal direction D1. The main body portion 511B has a tip 512B and a base end 513B in the longitudinal direction D1 and a side edge 514B and a side edge 515B extending along the longitudinal direction D1. The main body portion 511B forms a long rectangle; the tip 512B and the base end 513B form short sides, and the side edges 514B and 515B form long sides. That is, the side edges 514B and 515B are longer than the tip 512B and the base end 513B.

The main body portion 511B is arranged slightly away from the center position in the short direction D2 toward the side surface 503d of the body 503. The base end 513B is exposed from the end surface 503b of the body 503 and is connected to the second external electrode 506B. The tip 512B extends to a position separate from the end surface 503a, and is arranged in a position away from the center position in the longitudinal direction D1 toward the end surface 503a. The side edge 514B is an edge portion of the body 503 on the side of the side surface 503c, and is arranged slightly away from the central portion in the short direction D2 toward the side surface 503d. The side edge 515B is an edge portion of the body 503 on the side of the side surface 503d of the body 503, and is arranged in a position away from the side surface 503d. The length of the main body portion 511B may be longer or shorter than that shown in FIG. 34.

The first and second discharge electrodes 504A and 504B are arranged such that, as shown in FIG. 34, the side edge 514A of an opposing region 516A on the side of the tip 512A of the first discharge electrode 504A faces the side edge 514B of an opposing region 516B on the side of the tip 512B of the second discharge electrode 504B. The side edge 514A of the opposing region 516A of the first discharge electrode 504A and the side edge 514B of the opposing region 516B of the second discharge electrode 504B are separate from each other such that they face each other, and thus a gap portion GP (refer to FIG. 35 and the like) is formed between the first discharge electrode 504A and the second discharge electrode 504B. The gap width (the distance between the side edge 514A and the side edge 514B) of the gap portion GP is, for example, 10 to 100 μm. The gap portion GP is formed only in the opposing region where the side edge 514A faces the side edge 514B (refer to FIG. 34).

In the present embodiment, the first discharge electrode 504A is formed with only the main body portion 511A having the shape of a long rectangle, and does not have a portion facing the tip 512B of the second discharge electrode 504B in the longitudinal direction D1. The second discharge electrode 504B is formed with only the main body portion 511B having the shape of a long rectangle, and does not have a portion facing the tip 512A of the first discharge electrode 504A in the longitudinal direction D1. In this configuration, when a predetermined voltage or more is applied to the first and second external electrodes 506A and 506B, between the first and second discharge electrodes 504A and 504B, discharge occurs only between the side edge 514A and 514B in the gap portion GP.

Figure 35:
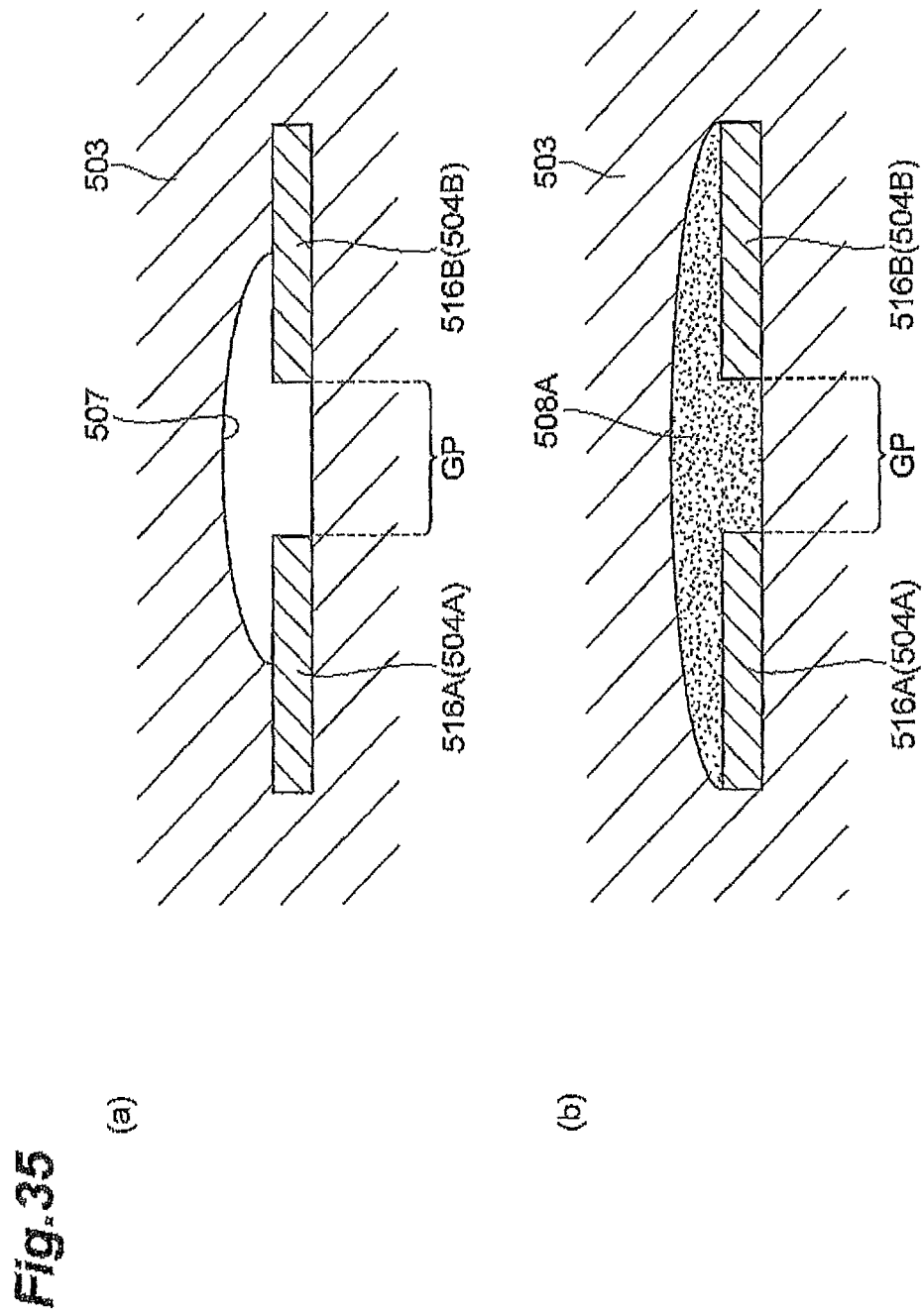
FIG. 35(a) is a transverse cross-sectional view showing a cross-sectional configuration taken along line XXXVa-XXXVa shown in FIG. 34.
FIG. 35(b) is a transverse cross-sectional view showing a cross-sectional configuration taken along line XXXVb-XXXVb shown in FIG. 34.
Figure 36:
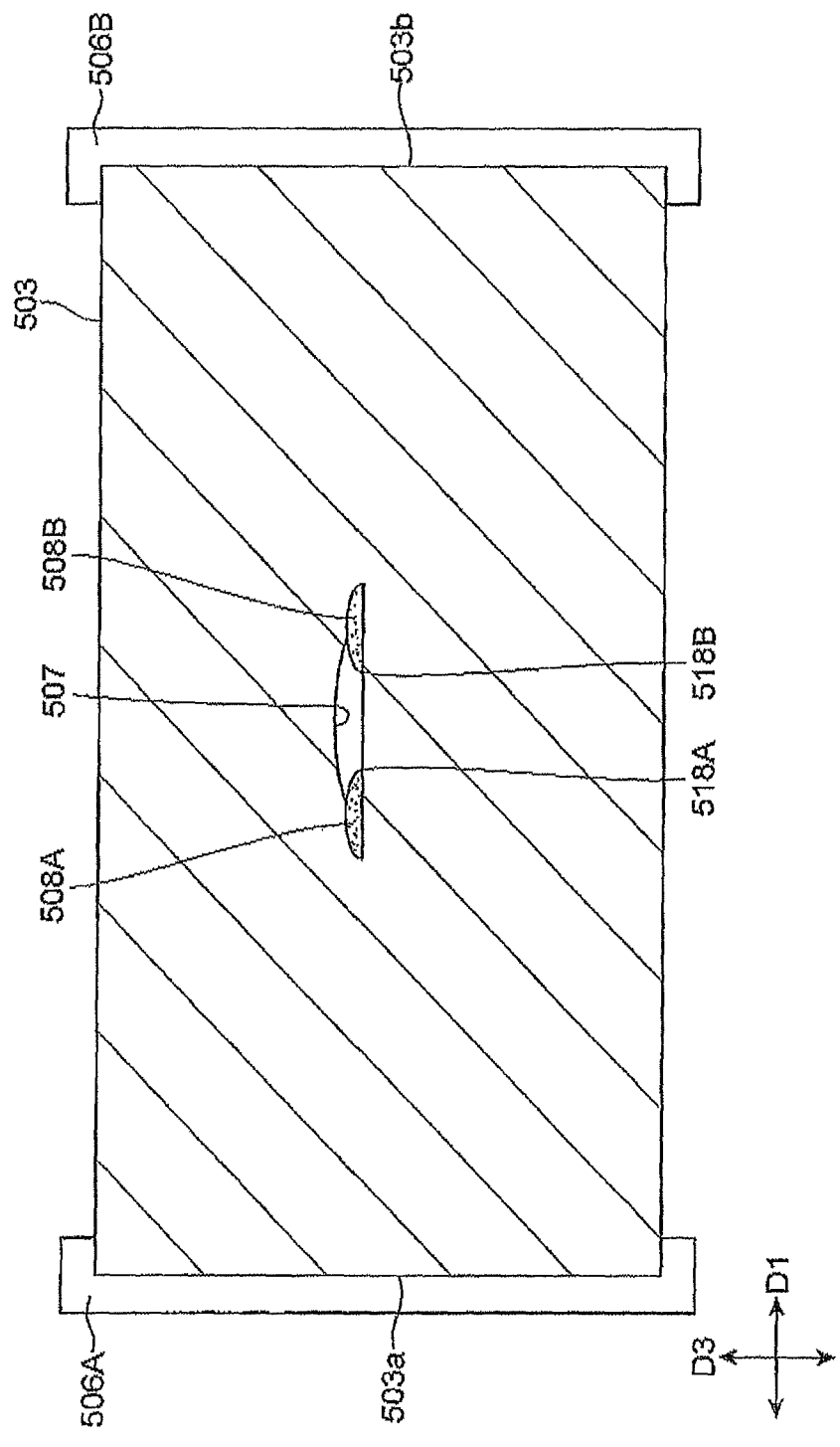
FIG. 36 is a vertical cross-sectional view showing a cross-sectional configuration taken along line XXXVI-XXXVI shown in FIG. 32.

As shown in FIGS. 34 and 35, the first and second discharge-inducing portions 508A and 508B have the function of connecting the first and second discharge electrodes 504A and 504B together to facilitate the occurrence of discharge between the first and second discharge electrodes 504A and 504B. The first and second discharge electrodes are approximately rectangular as viewed in the lamination direction D3.

The first discharge-inducing portion 508A is formed so as to contact a portion of the opposing region 516A of the first discharge electrode 504A on the side of the base end 513A and a portion of the opposing region 516B of the second discharge electrode 504B on the side of the tip 512B. Specifically, as shown in FIG. 35(b), the first discharge-inducing portion 508A has a portion which is arranged so as to contact the surfaces of both the discharge electrodes 504A and 504B, which connects both the discharge electrodes 504A and 504B together and which is formed approximately in the shape of a semiellipse when viewed in the longitudinal direction D1, and a portion which is arranged in the gap GP being the opposing region of both the discharge electrodes 504A and 504B.

The second discharge-inducing portion 508B is formed so as to contact a portion of the opposing region 516A of the first discharge electrode 504A on the side of the tip 512A and a portion of the opposing region 516B of the second discharge electrode 504B on the side of the base end 513B. Specifically, as with the first discharge-inducing portion 508A, the second discharge-inducing portion 508B has a portion which is arranged so as to contact the surfaces of both the discharge electrodes 504A and 504B, which connects both the discharge electrodes 504A and 504B together, and which is formed approximately in the shape of a semiellipse when viewed in the longitudinal direction D1, and a portion which is arranged in the gap GP being the opposing region of both the discharge electrodes 504A and 504B.

Between the first and second discharge-inducing portions 508A and 508B, as shown in FIGS. 34 and 36, the hollow portion 507 of the body 503 is formed so as to be adjacent to and in contact with the discharge-inducing portions 508A and 508B in the gap GP. That is, the hollow portion 507 is arranged approximately in the center of the gap GP in the longitudinal direction D1; approximately in the center of the gap GP, as shown in FIG. 35(a), an air gap is provided between the first and second discharge electrodes 504A and 504B. When viewed in the short direction D2, the hollow portion 507 is, as shown in FIG. 36, formed approximately in the shape of a dome; the hollow portion 507 is formed such that both edges in the longitudinal direction D1 are overlapped on the first and second discharge-inducing portions 508A and 508B that is formed approximately in the shape of a semiellipse. The above-described arrangement of the discharge-inducing portions 508A and 508B and the hollow portion 507 induces the occurrence of discharge along boundary portions 518A and 518B between the hollow portion 507 and each of the discharge-inducing portions 508A and 508B.

As the materials of constituent elements such as the discharge electrodes 504A and 504B, the external electrodes 506A and 506B, the ceramic layer 502 and the discharge-inducing portions 508A and 508B, the same materials as in the first embodiment can be used.

Figure 37:
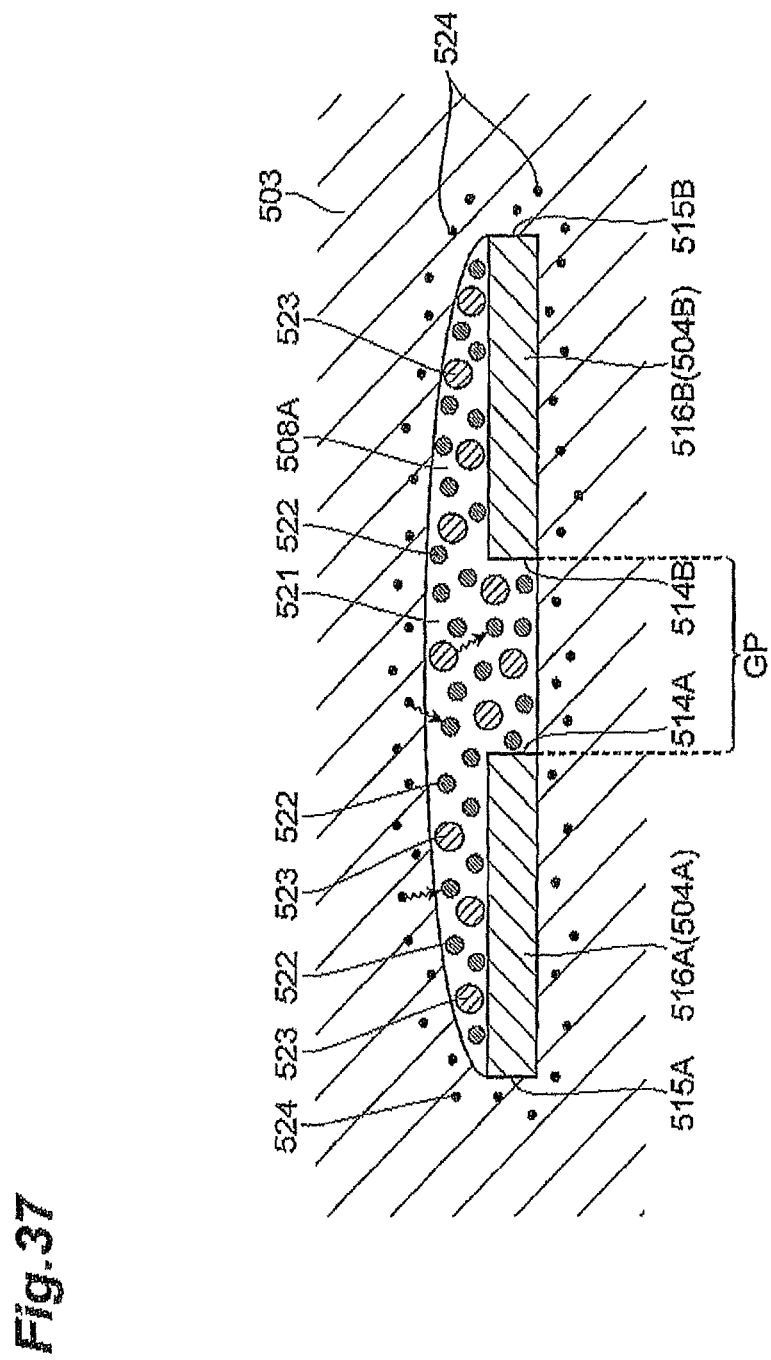
FIG. 37 is a schematic cross-sectional view illustrating the material structure of a discharge-inducing portion of the electrostatic protection component shown in FIG. 32.

FIG. 37 is a schematic diagram for illustrating the material configuration of the discharge-inducing portion 508A. The configuration when preferred materials are used will be described with reference to FIG. 37. It should be noted that FIG. 37 is a schematic diagram for illustrating the configuration; the sizes and the numbers of particles are deformed in the figure. In addition, the same applies to the discharge-inducing portion 508B.

The discharge-inducing portion 508A has an oxide of Mg, Cu, Zn, Si or Sr or the like as the main component, and in a ceramic insulator 521 containing glass, particles 522 of a tin oxide ($SnO_2$) and metallic particles 523 of an Ag/Pd alloy are present in a mixed state. The mixed state refers to a state where the metallic particles 523 of the Ag/Pd alloy are not solidified in one place and the particles 522 of the tin oxide are incorporated between the metallic particles 523. The particles 522 of the tin oxide are present in a state where they are not sintered (some of them are present as agglomerated powder). The tin oxide functions as a semiconductor material, and by the arrangement of the tin oxide between the metallic particles 523, it is possible to cause discharge even if the size of the gap in the gap portion GP is increased as compared with the case where the metallic particles 523 are only present. An alloy ratio of the Ag/Pd alloy in the metallic particles 523 is 95/5 to 30/70. The amount of particles 522 of the tin oxide contained is preferably 5/95 to 80/20 wt % in terms of a ratio of the tin oxide/the ceramic insulator. The amount of metallic particles 523 contained is preferably 10 to 35 vol % with respect to the discharge-inducing portion 508A.

The ceramic layer 502 has an oxide of Mg, Cu, Zn, Si or Sr or the like as the main component, and in a ceramic containing glass, particles 524 of a copper oxide (CuO) are contained. The amount of particles 524 of the copper oxide contained is preferably 0.01 to 5 wt %.

The first and second discharge electrodes 504A and 504B are constituted by a conductor material having an Ag/Pd alloy as the main component. An alloy ratio of the Ag/Pd alloy in the first and second discharge electrodes 504A and 504B is 95/5 to 30/70. The alloy ratio of the Ag/Pd alloy in the first and second discharge electrodes 504A and 504B is preferably the same as an alloy ratio of the Ag/Pd alloy in the metallic particles 523.

The tin oxide has features of having significantly high sintering temperature (specifically, about 1300° C.), and having low reactivity with other elements. Therefore, the tin oxide at the temperature at the time of firing of the body 503 is left in the form of particles, and even if the metallic particles 523 are present therearound, the tin oxide does not react with the metallic particles 523. In the discharge-inducing portion 508A, by the fact that the particles 522 of the tin oxide and the metallic particles 523 are in a mixed state, the following effect is obtained. That is, at the time of firing of the body 503, the particles 522 of the tin oxide do not react with the metallic particles 523 therearound and are left in the form of particles. By the fact that the particles 522 of the tin oxide do not react and are left as described above, the movement of the metallic particles 523 in the discharge-inducing portion 508A is restricted. Since the metallic particles 523 with restricted movement do not react with each other, it is possible to prevent short-circuiting between the discharge electrodes 504A and 504B (or to prevent the decrease in the insulation resistance) as a result of the connection of the metallic particles 523.

Moreover, by the fact that the discharge-inducing portion 508A contains an insulating material such as the ceramic insulator 521, it is possible to secure insulation between the first and second discharge electrodes 504A and 504B.

In the electrostatic protection component 501, the ceramic layer 502 contains the particles 524 of the copper oxide having high reactivity whereas the discharge-inducing portions 508 contain the particles 522 of the tin oxide having high sintering temperature and having low reactivity, with the result that the following effect is obtained. That is, even if the ceramic layer 502 contains the particles 524 of the copper oxide, the diffusion of the particles 524 of the copper oxide to the discharge-inducing portions 508 is suppressed by the particles 522 of the tin oxide. Since the diffusion of the particles 524 of the copper oxide is suppressed as described above, in the discharge-inducing portion 508A, it is possible to freely select the constituent materials of the portions other than the tin oxide (that is, the discharge-inducing portion 508A is composed of the tin oxide and the other materials, and the other materials can be freely selected). In this way, it is possible to cause the body 503 to contain the copper oxide while securing flexibility in selecting the constituent materials of the discharge-inducing portion 508A.

The discharge-inducing portion 408A contains the metallic particles 423, and thus it is possible to reduce the discharge start voltage.

The Ag/Pd alloy has features of having high melting point (specifically, about 1000° C.) and having low reactivity with the copper oxide. The ceramic layer 502 contains the particles 524 of the copper oxide having high reactivity whereas the discharge-inducing portions 508 contain, as the metallic particles 523, the Ag/Pd alloy having low reactivity with the copper oxide, with the result that the following effect is obtained. That is, even if the ceramic layer 502 contains the particles 524 of the copper oxide, the reaction of the metallic particles 523 by influences of the diffusion of the particles 524 of the copper oxide is suppressed in the discharge-inducing portion 508A. That is, it is possible to prevent short-circuiting between the discharge electrodes 504A and 504B (or to prevent the decrease in the insulation resistance) as a result of the connection of the metallic particles 523. In this way, it is possible to cause the body 503 to contain the copper oxide while preventing short-circuiting between the first and second discharge electrodes 504A and 504B. It should be noted that Pb itself has a high melting point, and the reactivity with the copper oxide is high as compared with the Ag/Pb alloy. Therefore, through the use of a compound obtained by alloying Pd with Ag, the effects become further significant.

When a metal other than Ag/Pd is used as the first and second discharge electrodes 504A and 504B with the copper oxide contained in the body 503, the metal reacts with the copper oxide, and the following problem may occur. For example, there is a possibility that Ag/Pb is vaporized from the portion (such as the connection portion to the external electrodes 506A and 506B) exposed from the body 503 of the first and second discharge electrodes 504A and 504B and is dissipated. When the opposing portion (around the side edges 514A and 514B) of the first and second discharge electrodes 504A and 504B are lost, there is a possibility that variations occur in the gap length and thus the characteristics become unstable. Therefore, the first and second discharge electrodes 504A and 504B contain the Ag/Pd alloy, and thus it is possible to prevent the occurrence of such a problem. The first and second discharge electrodes 504A and 504B may contain a metal other than the Ag/Pd.

When the discharge-inducing portion 508A contains the Ag/Pd alloy, and the discharge electrodes 504A and 504B contain the Ag/Pd alloy, the alloy ratios of the individual Ag/Pd alloys are made equal to each other, and thus it is possible to prevent the reaction of the Ag/Pd alloys between the discharge-inducing portion 508A and the first and second discharge electrodes 504A and 504B.

Figure 38:
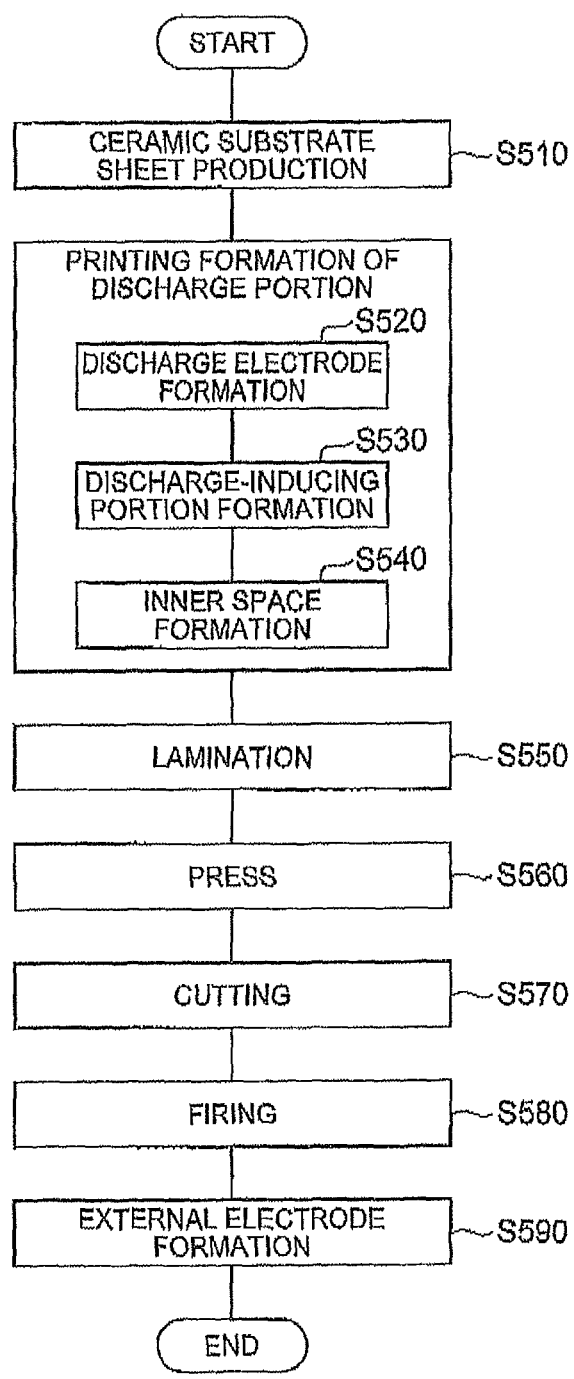
FIG. 38 is a flow diagram showing an example of the method of manufacturing the electrostatic protection shown in FIG. 32.

An example of the method of manufacturing the electrostatic protection component 501 will now be described with reference to FIGS. 38 and 39. The manufacturing method is not particularly limited; the order of individual steps may be changed, specific methods within the steps may be changed and the electrostatic protection component 501 may be manufactured with other steps.

First, a slurry that is the material composed of the ceramic substrate 502 is prepared, and a ceramic layer sheet is produced (step S510). Specifically, a predetermined amount of dielectric powder, containing the copper oxide (CuO) and an organic vehicle containing an organic solvent and an organic binder are mixed, and thus a slurry for ceramic layer is prepared. As the dielectric powder, a dielectric material containing, as the main component, the oxide (which may be another dielectric material) of Mg, Cu, Zn, Si or Sr can be used. Thereafter, by a doctor blade method or the like, the slurry is applied onto a PET film, and thus a green sheet having a thickness of about 20 μm is formed.

Then, the discharge portion is formed by printing in a predetermined position of the ceramic layer sheet. As shown in FIG. 39(*a*), a conductive pattern of the discharge electrodes 504A and 504B before firing is first formed by application of a conductive past onto the ceramic layer 502 sheet by screen printing or the like (step S520). Although, in the discharge electrodes 504A and 504B shown in FIG. 39, a variation is disclosed in which portions on the side of the base ends 513A and 513B are displaced to an approximate central portion in the short direction D2, it is possible to achieve approximately the same function as the discharge electrodes 504A and 504B shown in FIG. 34.

Then, a discharge-inducing material slurry is prepared, and the slurry is applied from above the discharge electrodes 504A and 504B such that, as shown in FIG. 39(*b*), the slurry connects the opposing regions 516A and 516B of the discharge electrodes 504A and 504E in two places, and thus portions corresponding to the discharge-inducing portions 508A and 508B before firing are formed (S530). Specifically, the discharge-inducing material slurry is prepared by mixing the powders of the tin oxide, the insulator and the conductor weighed to predetermined amounts and the organic vehicle containing the organic solvent and the organic binder. For example, as the tin oxide, $SnO_2$ which is an industrial material can be used. As the insulator, the dielectric powder can be used. As the dielectric powder, a dielectric material containing an oxide of Mg, Cu, Zn, Si or Sr (another dielectric material may be used) as the main component can be used. As the conductor powder, Ag/Pd powder can be used (Ag, Pd, Au, Pt, a mixture or a compound thereof or the like can also be used). The individual powders are fully mixed such that the particles of the tin oxide and the metallic particles of the Ag/Pd alloy go into a mixed state.

Then, an air gap material lacquer for forming the hollow portion 507 is applied such that both ends thereof are overlapped on the discharge-inducing portions 508A and 508B as shown in FIG. 39(*c*). As the air gap material lacquer, an organic lacquer containing an organic solvent and an organic binder can be used. In this way, a portion serving as the hollow portion 507 after firing is formed (step S540).

Then, the ceramic layer sheet on which the discharge portion is printed and the ceramic layer sheets of the other layers are sequentially laminated (step S550) and are pressed (step S560), and the laminated member is cut into pieces, each having the size of the electrostatic protection component (step S570). Then, each body is subjected to firing under predetermined conditions (for example, for two hours at a temperature of 850 to 950° C. in the atmosphere) (step S580). Here, the air gap material lacquer is dissipated within the body 503, and thus the hollow portion 507 is formed in the discharge portion. Thereafter, conductive paste for the external electrode is applied to the body 503 and is subjected to thermal processing under predetermined conditions (for example, for two hours at a temperature of 600 to 800° C. in the atmosphere), and thus the external electrode is baked (step S590). Thereafter, the surface of the external electrode is plated. As the plating, electrolytic plating is preferable. For example, Ni/Sn, Cu/Ni/Sn, Ni/Pd/Au, Ni/Pd/Ag, Ni/Ag or the like can be used. In this way, the electrostatic protection component 501 is completed.

As described above, in the electrostatic protection component 501, the hollow portion 507 is adjacent to and in contact with the discharge-inducing portions 508A and 508B in the gap GP. Therefore, breakdown by discharge can be induced in the longitudinal direction D1 (the horizontal direction), and thus it is possible to suppress breakdown by discharge in the thickness direction (the lamination direction D3 of the ceramic layer 502) of the discharge-inducing portions 508A and 508B. Since the breakdown in the thickness direction of the discharge-inducing portions 508A and 508B can be suppressed in this way, with the electrostatic protection component 501, the limitation of the number of times of discharge and variations in the discharge start voltage are suppressed, with the result that it is possible to enhance the durability of the electrostatic protection component 501.

In the electrostatic protection component 501, the hollow portion 507 is overlapped on the discharge-inducing portions 508A and 508B (refer to FIG. 36). In this case, as shown in FIG. 40(*c*), there can be increased the size of a space region (the thickness in the lamination direction) in the vicinity of the discharge portions 518A and 518B in which discharge is more likely to occur in the discharge-inducing portions 508A and 508B. For example, when, as shown in FIGS. 40(*a*) and 40(*b*), the lacquer for the hollow portion 527 is first applied onto the discharge electrodes 504A and 504B, and the discharge-inducing portion 528 is formed so as to cover the lacquer, the thickness of the discharge portions 528A and 528B in which discharge is more likely to occur is reduced, and thus the clamp voltage becomes, for example, about 81 volts (see "structure 1" in FIG. 41). However, in the electrostatic protection component 501 according to the present embodiment, as described above, the size of the space region in the vicinity of the discharge portions 518A and 518B can be increased, and thus it is possible to reduce the clamp voltage of the electrostatic protection component 501 to, for example, about 35 volts (see "structure 2" in FIG. 41).

In the electrostatic protection component 501, the first discharge electrode 504A has the first side edge 514A which extends in the longitudinal direction D1 and which extends along the longitudinal direction D1, the second discharge electrode 504B has the second side edge 514B which extends in the longitudinal direction D1 and which extends along the longitudinal direction D1 and the first and second discharge electrodes 504A and 504B are arranged such that the first and second side edges 514A and 514B face each other in the short direction D2. Therefore, it is possible to increase the length over which breakdown by discharge in the horizontal direction extends, and thus it is possible to further enhance the durability of the electrostatic protection component 501.

In the electrostatic protection component 501, the hollow portion 507 is arranged approximately in the center of the gap GP so as to be overlapped on both the first and second discharge-inducing portions 508A and 508B. As described above, the hollow portion 507 is formed more inside, and thus it is possible to suppress the infiltration of a plating solution and water from the outside. Thus, it is possible to enhance the durability and the reliability of the electrostatic protection component 501.

Figure 42:
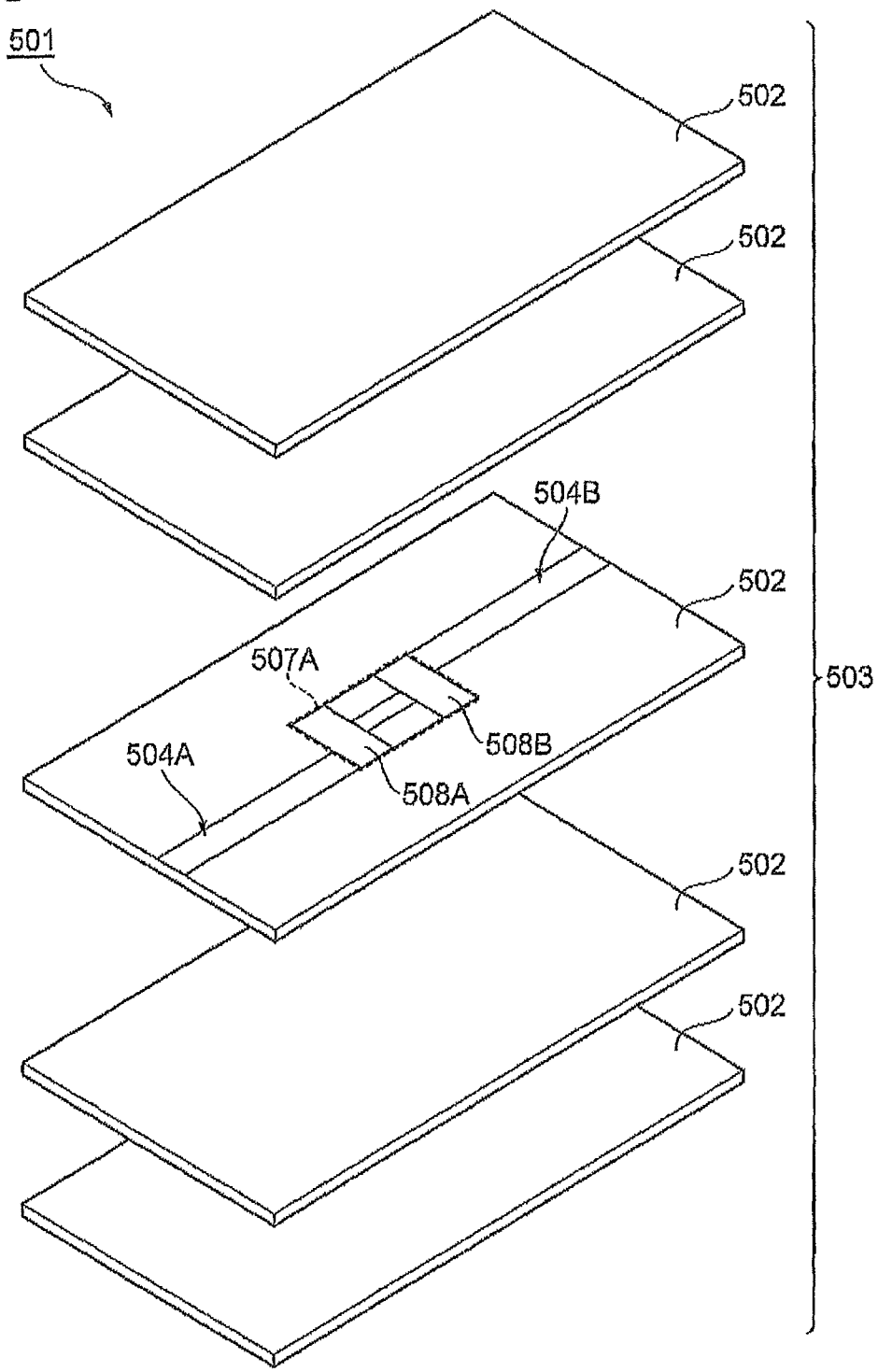
FIG. 42 is a developed perspective view of a body of a variation of the electrostatic protection component according to the fifth embodiment.

Although, in the embodiment described above, the lacquer for forming the hollow portion 507 is formed so as to cover a part of the discharge-inducing portions 508A and 508B, the electrostatic protection component 501 may be formed by the fact that the lacquer is applied such that the hollow portion 507A covers the entire discharge-inducing portions 508A and 508B as shown in FIG. 42. In this case, since a larger air gap portion can be formed, it is possible to further suppress the breakdown by discharge.

(Sixth Embodiment)

An electrostatic protection component 501 according to a sixth embodiment will now be described with reference to FIGS. 43 and 44. As in the fifth embodiment, the electrostatic protection component 501 according to the present embodiment includes the body 503, the discharge electrodes 504A and 504B and the external electrodes 506A and 506B; the electrostatic protection component 501 differs from that of the fifth embodiment in that the electrostatic protection component 501 includes one discharge-inducing portion 538 and a hollow portion 537 formed on the discharge-inducing portion 538.

The discharge-inducing portion 538 is approximately rectangular as viewed in the lamination direction D3, and has the function of connecting the first and second discharge electrodes 504A and 504B to facilitate the occurrence of discharge between the first and second discharge electrodes 504A and 504B. The discharge-inducing portion 538 is formed so as to contact an approximate central portion of the opposing region 516A of the first discharge electrode 504A and an approximate central portion of the opposing region 516B of the second discharge electrode 504B. Specifically, the discharge-inducing portion 538 has a portion which is arranged so as to contact the surfaces of both the discharge electrodes 504A and 504B, which connects both the discharge electrodes 504A and 504B together, and which is formed approximately in the shape of a semiellipse when viewed in the longitudinal direction D1, and a portion which is arranged in the gap GP being the opposing region of both the discharge electrodes 504A and 504B.

Figure 43:
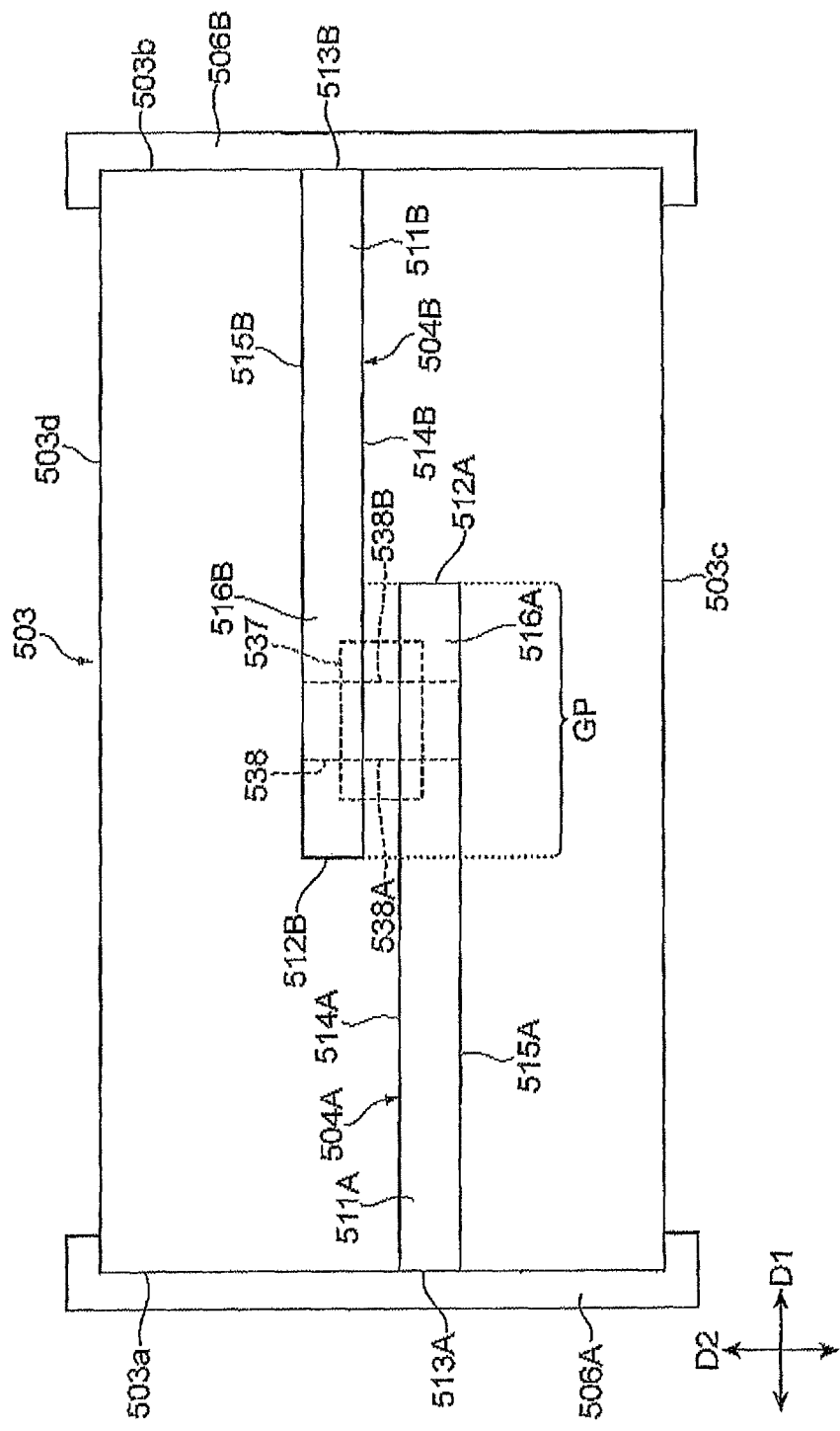
FIG. 43 is a plan view of a discharge portion of an electrostatic protection component according to a sixth embodiment when viewed in the direction of the lamination.
Figure 44:
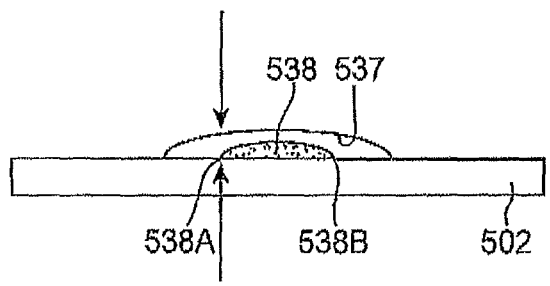
FIG. 44 is a transverse cross-sectional view schematically showing the cross-sectional configuration of the discharge portion of the electrostatic protection component shown in FIG. 43.

Approximately in the central portion of the discharge-inducing portion 538 in the short direction D2, the hollow portion 537 of the body 503 is formed so as to be adjacent to and in contact with the discharge-inducing portion 538 in the gap GP, as shown in FIGS. 43 and 44. That is, the hollow portion 537 is arranged approximately in the center of the gap GP in the longitudinal direction D1. When viewed in the short direction D2 as shown in FIG. 44, the hollow portion 507 is formed approximately in the shape of a dome, and the hollow portion 507 is formed so as to be overlapped on the entire discharge-inducing portion 538. The above-described arrangement of the discharge-inducing portion 538 and the hollow portion 537 induces the occurrence of discharge along boundary portions 538A and 538B between the hollow portion 537 and the discharge-inducing portion 538.

The discharge portion of the electrostatic protection component 501 configured as described above is formed by printing as in the fifth embodiment. As shown in FIG. 45(a), a conductive pattern of the discharge electrodes 504A and 504B before firing is first formed by application of a conductive past onto the ceramic layer 502 sheet by screen printing or the like (step S520 of FIG. 38). Then, the slurry is applied from above the discharge electrodes 504A and 504B such that, as shown in FIG. 45(b), the slurry connects the opposing regions 516A and 516B of the discharge electrodes 504A and 504B in one place, and thus the discharge-inducing portions 538 before firing are formed (S530 of FIG. 38). Then, an air gap material lacquer for forming the hollow portion 537 is applied such that, as shown in FIG. 45(c), the lacquer is overlapped on the entire approximate central portion of the discharge-inducing portion 538 in the short direction D2. In this way, a portion serving as the hollow portion 537 after firing is formed (step S540 of FIG. 38).

As described above, even in the electrostatic protection component 501 according to the sixth embodiment, the hollow portion 537 is adjacent to and in contact with the discharge-inducing portions 538 in the gap GP. Therefore, breakdown by discharge can be induced in the longitudinal direction D1 (the horizontal direction), and thus it is possible to suppress breakdown by discharge in the thickness direction (the lamination direction D3 of the ceramic layer 502) of the discharge-inducing portions 538. Since the breakdown in the thickness direction of the discharge-inducing portions 538 is suppressed in this way, with the electrostatic protection component 501, the limitation of the number of times of discharge and variations in the discharge start voltage are also suppressed, with the result that it is possible to enhance the durability of the electrostatic protection component 501.

In the electrostatic protection component 501, the hollow portion 537 is arranged so as to cover both edges of the discharge-inducing portion 538 in the longitudinal direction D1 and so as to be overlapped on the approximate central portion of the discharge-inducing portion 538 in the short direction D2 (refer to FIG. 43). In this case, there can be increased the size of a space region (the thickness in the lamination direction) in the vicinity of the discharge portions 538A and 538B in which discharge is more likely to occur in the discharge-inducing portion 538, as shown in FIG. 44. Therefore, with the electrostatic protection component 501 according to the present embodiment, it is possible to reduce the clamp voltage of the electrostatic protection component 501.

In the electrostatic protection component 501, the hollow portion 537 is arranged in the gap GP so as to cover both the edges of the discharge-inducing portion 538 in the longitudinal direction D1. Therefore, since it is not necessary to provide, in the central portion of the gap GP, a hollow portion that is not overlapped on the discharge-inducing portion 538, it is possible to make the hollow portion 537 compact. In this configuration, it is possible to reduce the opposing length of the discharge electrodes 504A and 504B, and thus it is possible to reduce the capacitance generated between the discharge electrodes 504A and 504B.

Although the fifth and sixth embodiments of the present invention have been described above in detail, the embodiments described above are used to describe embodiments of the electrostatic protection component according to the present invention; the electrostatic protection component according to the present invention is not limited to that described in the present embodiment. The electrostatic protection component according to the present invention may be an electrostatic protection component that is obtained by varying the electrostatic protection component according to the embodiment or applying it to another one without departing from the spirit of each of the claims.

For example, the configuration of the first and second discharge electrodes 504A and 504B is not limited to the configuration shown in FIG. 34 and the like; the length, the width and the size of the gap may be modified as necessary. For example, the configuration shown in FIG. 46 may be adopted.

Figure 46:
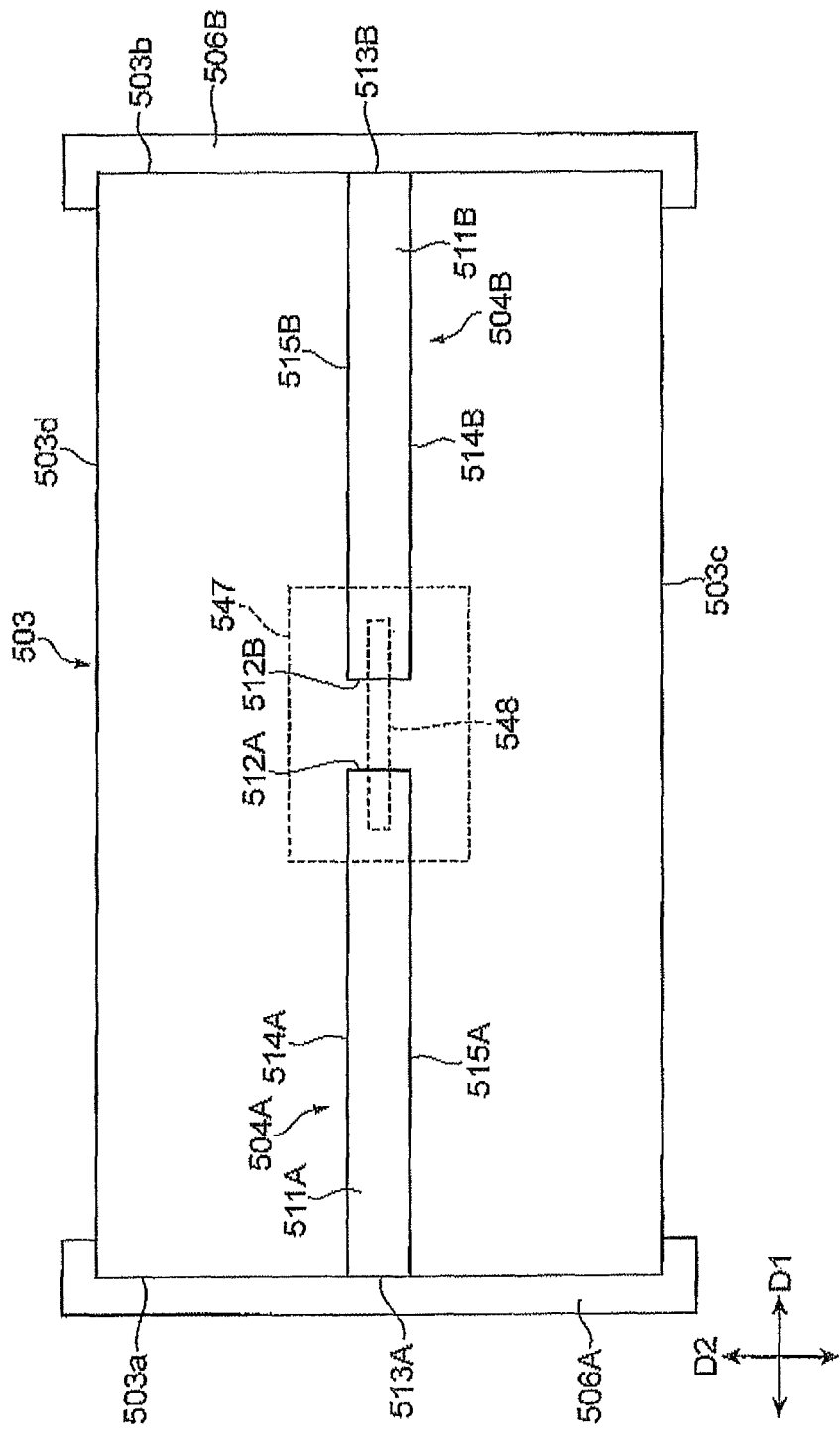
FIG. 46 is a plan view of a discharge portion of an electrostatic protection component according to another variation when viewed in the direction of the lamination.

In the configuration shown in FIG. 46, the first discharge electrode 504A extends from the end surface 503*a* of the body 503 in the longitudinal direction D1, the second discharge electrode 504B extends from the end surface 503*b* of the body 503 in the longitudinal direction D1 and the tip 512A of the discharge electrode 504A and the tip 512B of the discharge electrode 504B face each other to form the gap portion GP. An approximate central portion of the first and second discharge electrodes 504A and 504B in the short direction D2 is connected by a discharge-inducing portion 548, and a hollow portion 547 is formed so as to cover the discharge-inducing portion 548. The arrangement of the discharge-inducing portion 548 and the hollow portion 547 in the configuration shown in FIG. 46 is approximately the same as in the sixth embodiment.

Although, in the embodiment described above, the electrostatic protection component including only the discharge portion having the electrostatic protection function has been illustrated, the present invention may be applied to an electrostatic protection component to which other functions such as a coil portion and a capacitor portion are added. Here, the material of the ceramic layer 502 may be changed to the optimum material for each layer of the discharge portion, the coil portion and the capacitor portion.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:
1. An electrostatic protection component comprising:
a body in which a plurality of ceramic substrates is laminated along a thickness direction which is perpendicular to a surface of one of the plurality of ceramic substrates; and
a first discharge electrode and a second discharge electrode which are formed within the body and which are spaced to face each other,
wherein the first discharge electrode includes a first main body portion extending along a first direction which is perpendicular to the thickness direction, the first main body portion includes a first tip in the first direction and a first side edge extending along the first direction,
the second discharge electrode includes a second main body portion extending along the first direction, the second main body portion includes a second tip in the first direction and a second side edge extending along the first direction,
the first discharge electrode and the second discharge electrode are arranged such that the first main body portion and the second main body portion are adjacent to each other in a second direction perpendicular to the thickness direction and the first direction,
the first discharge electrode and the second discharge electrode face each other in the second direction between the first side edge and the second side edge and
discharge occurs only between the first side edge and the second side edge, between the first discharge electrode and the second discharge electrode.

2. The electrostatic protection component according to claim 1,
wherein the body includes discharge-inducing portion which is in contact with the first discharge electrode and the second discharge electrode and which connects the discharge electrodes and
the discharge-inducing portion is formed in only a portion where the first side edge and the second side edge face each other.

3. The electrostatic protection component according to claim 1,
wherein at least one of the first discharge electrode and the second discharge electrode does not have a portion facing the tip of the other discharge electrode in the first direction.

4. The electrostatic protection component according to claim 1,
wherein at least one of the first discharge electrode and the second discharge electrode has a portion facing the tip of the other discharge electrode in the first direction and a distance between the first side edge and the second side edge is shorter than a distance between the opposing portion and the tip.

5. The electrostatic protection component according to claim 1,
wherein a discharge-inducing portion is formed such that at least a gap is included and that a region of the first main body portion on the side of the first tip and a region of the second main body portion on the side of the second tip are surrounded.

6. The electrostatic protection component according to claim 1,
wherein base ends of the first and second discharge electrodes are displaced to an approximate central portion of a ceramic substrate of the plurality of ceramic substrates along the second direction.

* * * * *